(12) United States Patent
Linstadt et al.

(10) Patent No.: US 9,111,612 B2
(45) Date of Patent: Aug. 18, 2015

(54) DIRECT RELATIVE MEASUREMENT OF MEMORY DURABILITY

(71) Applicant: RAMBUS INC., Sunnyvale, CA (US)

(72) Inventors: Eric Linstadt, Palo Alto, CA (US); Brent Steven Haukness, Monte Sereno, CA (US); J. James Tringali, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 112 days.

(21) Appl. No.: 13/788,233

(22) Filed: Mar. 7, 2013

(65) Prior Publication Data

US 2013/0235649 A1 Sep. 12, 2013

Related U.S. Application Data

(60) Provisional application No. 61/705,475, filed on Sep. 25, 2012, provisional application No. 61/608,064, filed on Mar. 7, 2012.

(51) Int. Cl.
G06F 7/02 (2006.01)
G01R 31/28 (2006.01)
G11C 13/00 (2006.01)
G11C 29/38 (2006.01)
G11C 29/50 (2006.01)

(52) U.S. Cl.
CPC ........ *G11C 13/0035* (2013.01); *G11C 13/0004* (2013.01); *G11C 13/004* (2013.01); *G11C 13/0007* (2013.01); *G11C 13/0011* (2013.01); *G11C 29/38* (2013.01); *G11C 29/50008* (2013.01); *G11C 13/0069* (2013.01); *G11C 2013/0054* (2013.01); *G11C 2029/5002* (2013.01); *G11C 2213/79* (2013.01)

(58) Field of Classification Search
CPC .......... G11C 13/0035; G11C 13/0004; G11C 13/004; G11C 13/02; H04L 45/08; H04L 45/16
USPC .......... 714/742, 746, 824, 819; 365/148, 153, 365/163
See application file for complete search history.

(56) References Cited

U.S. PATENT DOCUMENTS

| | | | |
|---|---|---|---|
| 8,456,940 B2 * | 6/2013 | Hanzawa et al. | 365/226 |
| 8,520,425 B2 * | 8/2013 | Xiao et al. | 365/148 |
| 2008/0198674 A1 | 8/2008 | Keller | |
| 2009/0094409 A1 | 4/2009 | Yeh et al. | |
| 2009/0172253 A1 | 7/2009 | Rothman et al. | |
| 2009/0193221 A1 | 7/2009 | Reid | |
| 2009/0204852 A1 | 8/2009 | Diggs et al. | |
| 2009/0248962 A1 | 10/2009 | Kim et al. | |
| 2014/0293678 A1 * | 10/2014 | Orlowski et al. | 365/148 |

OTHER PUBLICATIONS

Park et al., New set/reset scheme for excellent uniformity in bipolar resistive memory, Mar. 2011, IEE Electron device letters, vol. 32, No. 3, pp. 228 to 230.*

* cited by examiner

*Primary Examiner* — Shelly A Chase
(74) *Attorney, Agent, or Firm* — Stolowitz Ford Cowger LLP

(57) ABSTRACT

Disclosed is a memory including a plurality of resistive change memory cells, including at least a first group and a second group of the memory cells and a comparison circuit configured to conduct a direct relative comparison of a remaining endurance of the first group of memory cells to a remaining endurance of the second group of memory cells.

20 Claims, 38 Drawing Sheets

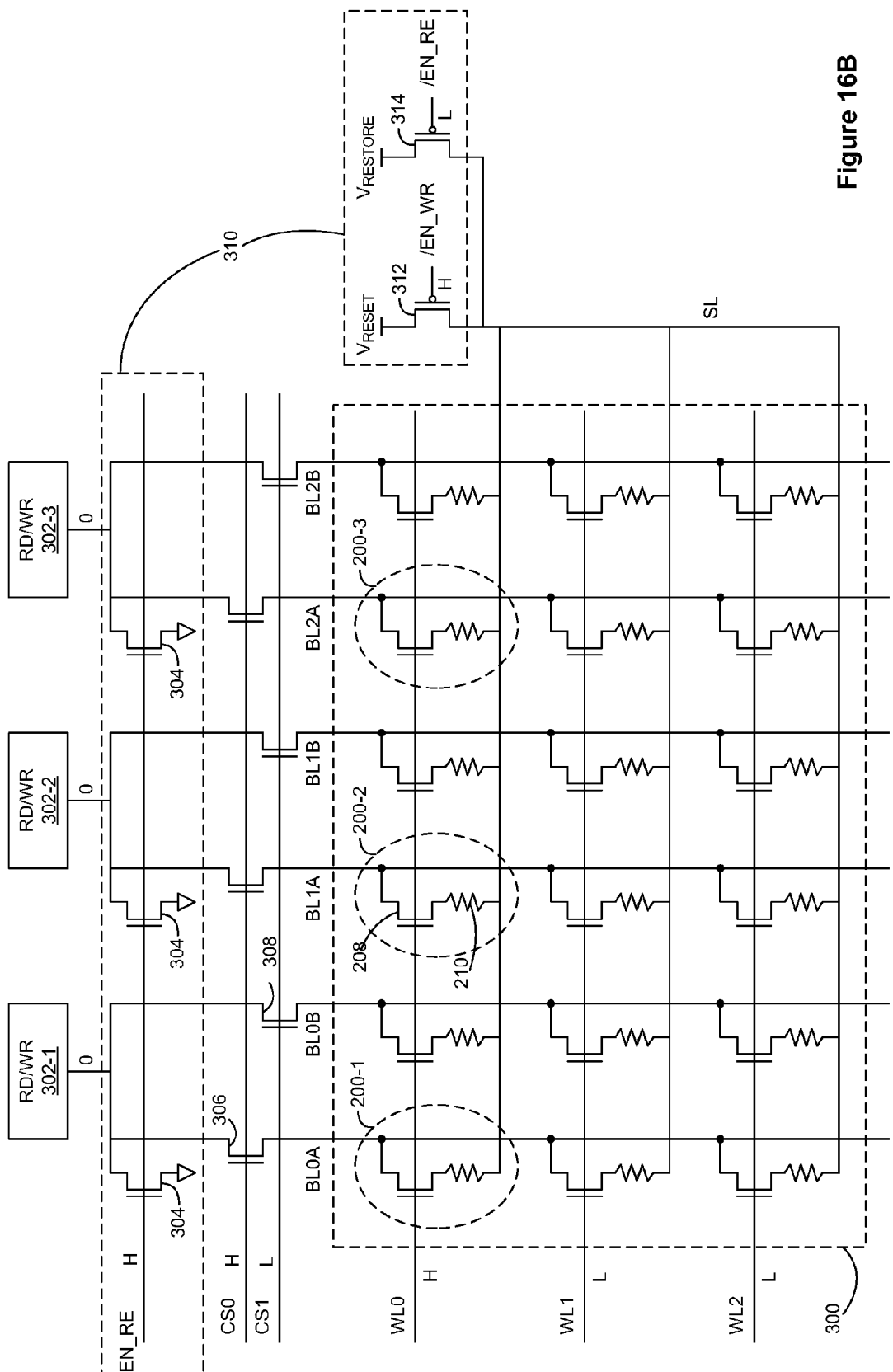

DIRECT RELATIVE MEASUREMENT OF MEMORY DURABILITY

RELATED CASES

This application is a non-provisional of, and claims priority to, U.S. Provisional Application No. 61/705,475 filed Sep. 25, 2012 and U.S. Provisional Application No. 61/608,064 filed Mar. 7, 2012, both of which are incorporated herein by this reference.

BACKGROUND OF THE INVENTION

New and emerging memory technologies, for example resistive change, or resistivity change, memory cells are gaining in popularity. Some examples include phase change (PCRAM) and conductive bridge (CB-RRAM) memories, all of which have limited endurance. For resistive change memories generally, the cumulative number of set or reset cycles the component memory cells may undergo before failure is finite and may be difficult to predict. Consequently, in typical applications, the host or memory/storage controller must either estimate or acquire a present endurance state of the constituent cells and actively manage and track their usage, striving to minimize the variance in usage of physical locations.

While erase count based estimates of durability or endurance may be adequate for NAND Flash wear leveling, this technique does not scale well for technologies like CB-RRAM or PCRAM, as the total amount of persistent storage required to maintain these counts increases with the smaller granularity of program/erase operations.

Improvements are needed to maximize the useful lives of memories.

BRIEF DESCRIPTION OF THE DRAWINGS

FIGS. 16A-16E are schematic diagrams of arrays of resistive change memory cells along with circuitry to bias the resistive change memory cells for set, reset, and restore operations in accordance with some embodiments.

DETAILED DESCRIPTION OF PREFERRED EMBODIMENTS

Figure 1:
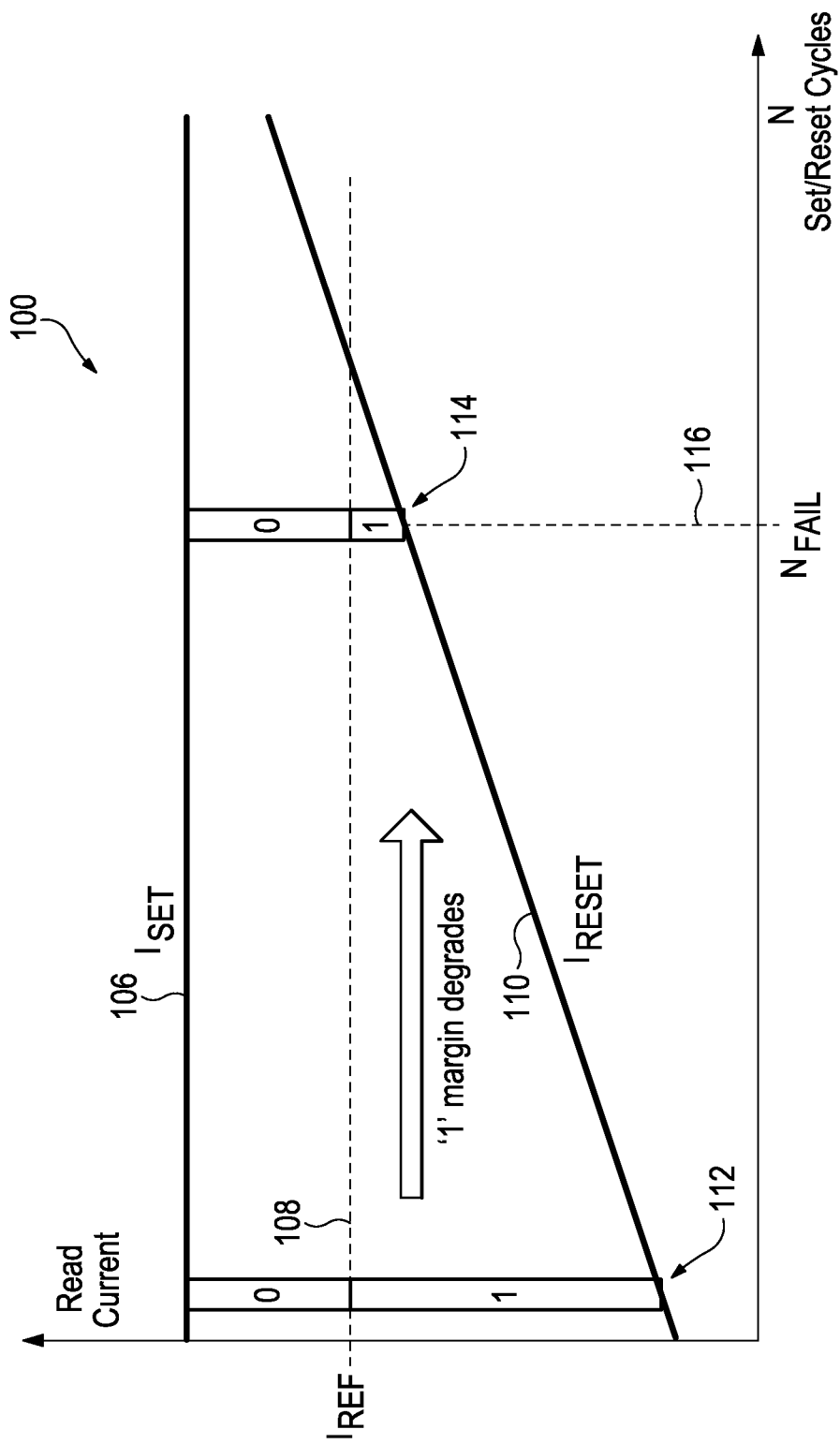
FIG. 1 is a prophetic example of a graph of read current versus the number of set/reset cycles that have been performed on a resistive change memory cell.

Reference will now be made in detail to various embodiments, examples of which are illustrated in the accompanying drawings. In the following detailed description, numerous specific details are set forth in order to provide a thorough understanding of the disclosed embodiments. However, embodiments may be practiced without these specific details. In other instances, well-known methods, procedures, components, and circuits have not been described in detail so as not to unnecessarily obscure aspects of the embodiments.

A resistive change memory device generally includes an array of resistive change memory cells, each of which includes a resistive memory element. The resistive memory element includes a resistance-switching material situated between two electrodes. The resistance-switching material has at least two states, a high-resistance state and a low-resistance state, and can be cycled between these two states by application of appropriate voltages to the electrodes, thus allowing the resistive memory element to be programmed. For example, a resistive change memory cell for which the resistance-switching material has been programmed to the high-resistance state (referred to herein as a "reset" state) is considered to store a "1" and a resistive change memory cell for which the resistance-switching material has been programmed to the low-resistance state (referred to herein as a "set" state) is considered to store a "0," or vice-versa.

Four general classes of resistance-switching materials are solid electrolyte materials, insulating materials, phase-change materials, and organic materials. The term "resistive change memory device" as used herein includes, without limitation, memories that use any of these classes of resistance-switching materials (e.g., resistance-switching random access memories (RRAMs), conductive-bridging random access memories (CB-RAMS), and phase-change memories (PRAMs)). Examples of resistance-switching electrolyte materials include $Ge_xSe_{1-x}$, $Ge_xS_{1-x}$, $Cu_2S$, CuO, $Ag_2S$, $WO_3$, CeO, $HfO_2$, and $SiO_2$. Examples of resistance-switching insulating materials include $TiO_2$, NiO, $SrZrO_3$, $SrTiO_3$, $ZrO_2$, and MgO.

A resistive change memory cell using a solid electrolyte material as the resistance-switching material is typically fabricated using a metal that exhibits ionic conductivity in the solid electrolyte (i.e., a metal ion source for the solid electrolyte) as the first electrode and an inert metal as the second electrode. Application of a biasing condition (e.g., a first bias voltage applied for a specified duration) that corresponds to a set operation causes the first electrode to inject ions into the solid electrolyte; the ions precipitate into filaments that produce low-resistance paths between the electrodes, resulting in formation of a low-resistance state (or set state) in the solid electrolyte.

Application of a biasing condition (e.g., a second bias voltage distinct from the first bias voltage, applied for a specified duration) that corresponds to a reset operation causes the dissolution of the filaments, resulting in formation of a high-resistance state (or reset state) in the solid electrolyte. (While other types of resistance-switching materials may operate in accordance with other physical mechanisms, the materials also may be programmed to low-resistance (set) and high-resistance (reset) states). The reset operation, however, does not entirely reverse the set operation: some ions injected into the solid electrolyte during the set operation remain in the solid electrolyte after the reset operation. Over time, these ions accumulate in the solid electrolyte as the resistive change memory cell is repeatedly cycled between set and reset states, resulting in a decrease in the resistive change memory cell's reset resistance (i.e., the resistance in the reset state). Similarly, ions may also accumulate in the form of reduced metal at the inert electrode leading to a reduction in the effective thickness of the electrolyte and reducing the resistive change memory cell's resistance in the high resistance state. Eventually the reset resistance and the set resistance of the resistive change memory cell change to a point at which the reset resistance and the set resistance cannot be distinguished rapidly and reliably. When this occurs, the resistive change memory cell can be regarded as no longer being functional.

A newly-fabricated resistive change memory cell has an initial write endurance. The write endurance is the maximum number of set/reset cycles the memory cell will undergo before the above-described degradation mechanisms make the reset resistance and the set resistance of the resistive change memory cell difficult to distinguish rapidly and reliably. Each set/reset cycle that the memory cell undergoes degrades the difference between the reset resistance and the set resistance. Thus, at any point in its lifetime, a resistive change memory cell can be regarded as having what may be called a future endurance or remaining endurance. The remaining endurance of a resistive memory cell corresponds to the number of set/reset cycles the memory cell will be able to undergo before the memory cell ceases to be functional.

FIG. 1 shows a prophetic example of a graph 100 of read current versus the number N of set/reset cycles that have been performed on a resistive change memory cell in a resistive change memory device in accordance with some embodiments. $I_{SET}$ 106 shows the read current for the resistive change memory cell in a set state and $I_{RESET}$ 110 shows the read current for the resistive change memory cell in a reset state. $I_{SET}$ 106 is greater than $I_{RESET}$ 110 because the resistive change memory cell's resistance in the set state is less than the resistive change memory cell's resistance in the reset state. In some embodiments, a read operation for the resistive change memory cell is performed by comparing the resistive change memory cell's read current to a reference current $I_{REF}$ 108. In the example of FIG. 1, the resistive change memory cell is assumed to store a "1" in the reset state and a "0" in the set state. Thus, if the resistive change memory cell's read current is found to be less than $I_{REF}$ 108, a determination is made that the resistive change memory cell stores a "1," and if the resistive change memory cell's read current is found to be greater than $I_{REF}$ 108, a determination is made that the resistive change memory cell stores a "0." $I_{RESET}$ 110 increases as the number of set/reset cycles increases, indicating that the resistive change memory cell's reset resistance is decreasing with increasing numbers of set/recycles.

At a first point 112, $I_{RESET}$ has sufficient margin with respect to $I_{REF}$ 108 to allow a "1" stored in the resistive change memory cell to be read rapidly and reliably. At a second point 114, however, the reset resistance has decreased by an amount such that $I_{RESET}$ no longer has sufficient margin with respect to $I_{REF}$ 108 to allow a "1" stored in the resistive change memory cell to be read rapidly and reliably. The number of cycles ($N_{FAIL}$) 116 corresponding to the second point 114 represents the write endurance of the resistive change memory cell: the resistive change memory cell is deemed to have failed when the number of set/reset cycles 104 exceeds $N_{FAIL}$ 116. Note that although $I_{RESET}$ 110 is illustrated as being a linear function of the number N of set/reset cycles, in general $I_{RESET}$ 110 (and hence, the resistive change memory cell's resistance) is a monotonic function (and in some implementations a non-linear monotonic function) of the number N of set/reset cycles.

Figure 2A:
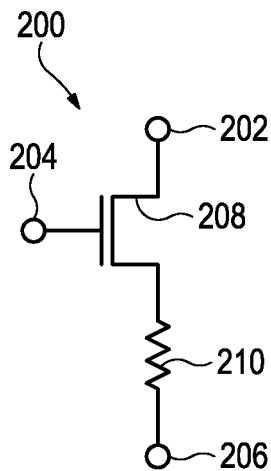
FIGS. 2A-2D are schematic diagrams of resistive change memory cells in accordance with some embodiments.
Figure 2B:
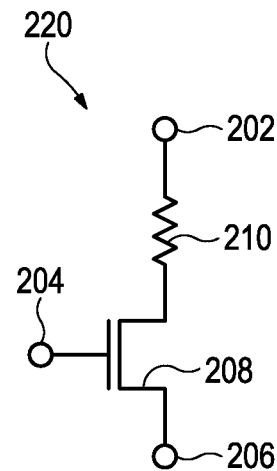

Resistive change memory cells with endurance such as that illustrated in FIG. 1 include at least three-terminal resistive change memory cells and two-terminal resistive change memory cells. FIGS. 2A and 2B are schematic diagrams of respective three-terminal resistive change memory cells 200 (FIG. 2A) and 220 (FIG. 2B). In resistive change memory cells 200 and 220, a pass gate 208 (e.g., a transistor 208) and a resistive memory element 210 are arranged in series between a node (or terminal) 202 and a node (or terminal) 206. Node 202 may connect to a bit line and node 206 may connect to a source line. The gate of pass gate 208 connects to a node (or terminal) 204 that connects to a word line. The order of pass gate 208 and resistive memory element 210 is reversed in resistive change memory cell 220 as compared to resistive change memory cell 200.

To program resistive change memory cells 200 and 220, a logic-high ("H") signal is applied to the gate of pass gate 208 via node 204 to turn on pass gate 208, and a programming voltage is applied between nodes 202 and 206 for a specified duration. In some embodiments, a positive set voltage $V_{SET}$ is applied between nodes 202 and 206 (e.g., $V_{SET}$ is a positive voltage relative to node 206) for a first duration to perform a set operation and a negative reset voltage $-V_{RESET}$ is applied between nodes 202 and 206 (e.g., $-V_{RESET}$ is a negative voltage relative to node 206) for a second duration to perform a reset operation. Note that the first duration and the second duration are typically equal. Also note that this specification refers to a logic-high ("H") signal being applied to a gate to turn on pass gate 208. However, a voltage other than the logic-high ("H") signal and that is sufficient to turn on the pass gate may be applied to the pass gate. Similarly, this specification refers to a logic-low ("L") signal being applied to pass gate 208 to turn off the pass gate. However, a voltage other than the logic-low ("L") signal and that is sufficient to turn off the pass gate may be applied to the pass gate.

In some embodiments, to perform a restore operation for the resistive change memory cells 200 and 220, the logic-high signal is applied to the gate of pass gate 208 via node 204 to turn on the pass gate 208, and a negative restore voltage $-V_{RESTORE}$ is applied between the nodes 202 and 206 (e.g., $-V_{RESTORE}$ is a negative voltage relative to node 206) for a third duration. In some implementations, voltage $V_{RESTORE}$ is greater in magnitude than voltage $V_{RESET}$. In some implementations, voltage $-V_{RESTORE}$ is applied between nodes 202 and 206 for a longer duration in the restore operation than the voltage $-V_{RESET}$ is applied between nodes 202 and 206 in the reset operation. In other words, the third duration is greater than the second duration. Alternatively, the restore operation is performed by applying $-V_{RESET}$ (as opposed to $-V_{RESTORE}$) between nodes 202 and 206 for a longer duration than for the reset operation.

Figure 2C:
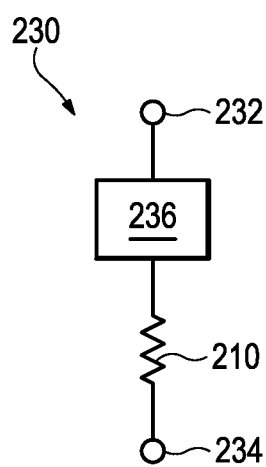
Figure 2D:
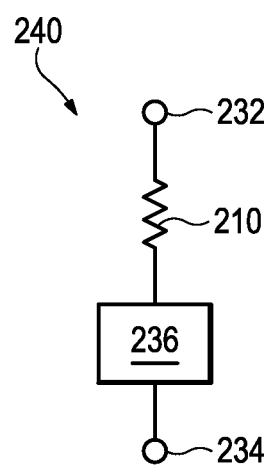

FIGS. 2C and 2D are schematic diagrams of respective two-terminal resistive change memory cells 230 (FIG. 2C) and 240 (FIG. 2D). In resistive change memory cells 230 and 240, the resistive memory element 210 is arranged in series with a nonlinear conductive element 236 between a node 232 and a node 234. Node 232 connects to a bit line (e.g., bit line BL0A, BL0B, BL1A, BL1B, BL2A, or BL2B, FIG. 16E) and node 234 connects to a conductive line distinct from the bit line (e.g., line L0, L1 or L2, FIG. 16E). Nonlinear conductive element 236 has a non-linear current-voltage characteristic that reduces parasitic leakage currents in arrays of resistive change memory cells 230 or 240 (e.g., in array 350, FIG. 16E). In some embodiments, nonlinear conductive element 236 conducts (either unidirectionally or bidirectionally) only when a voltage across the nonlinear conductive element 236 exceeds a threshold voltage $V_{TH}$ (e.g., a diode drop). In some embodiments, the nonlinear conductive element 236 is implemented as a diode. In some other embodiments, the nonlinear conductive element 236 is implemented as two diodes arranged in parallel but with opposite orientations, to provide bidirectional conductivity. The order of the resistive memory element 210 and nonlinear conductive element 236 is reversed in resistive change memory cell 240 as compared to resistive change memory cell 230: in resistive change memory cell 230 the nonlinear conductive element 236 connects directly to node 232 and resistive memory element 210 connects directly to node 234, while in resistive change memory cell 240 the resistive memory element 210 connects directly to node 232 and nonlinear conductive element 236 connects directly to node 234.

The two-terminal resistive change memory cells 230 and 240 are programmed and restored in similar manners to the three-terminal resistive change memory cells 200 and 220, except that there is no pass gate to turn on and the programming and restore voltages are adjusted to account for threshold voltage $V_{TH}$. For example, instead of applying $V_{SET}$, $-V_{RESET}$, or $-V_{RESTORE}$, respectively, $(V_{SET}+V_{TH})$, $-(V_{RESET}+V_{TH})$, or $-(V_{RESTORE}+V_{TH})$ are applied between nodes 232 and 234.

Figure 16A:
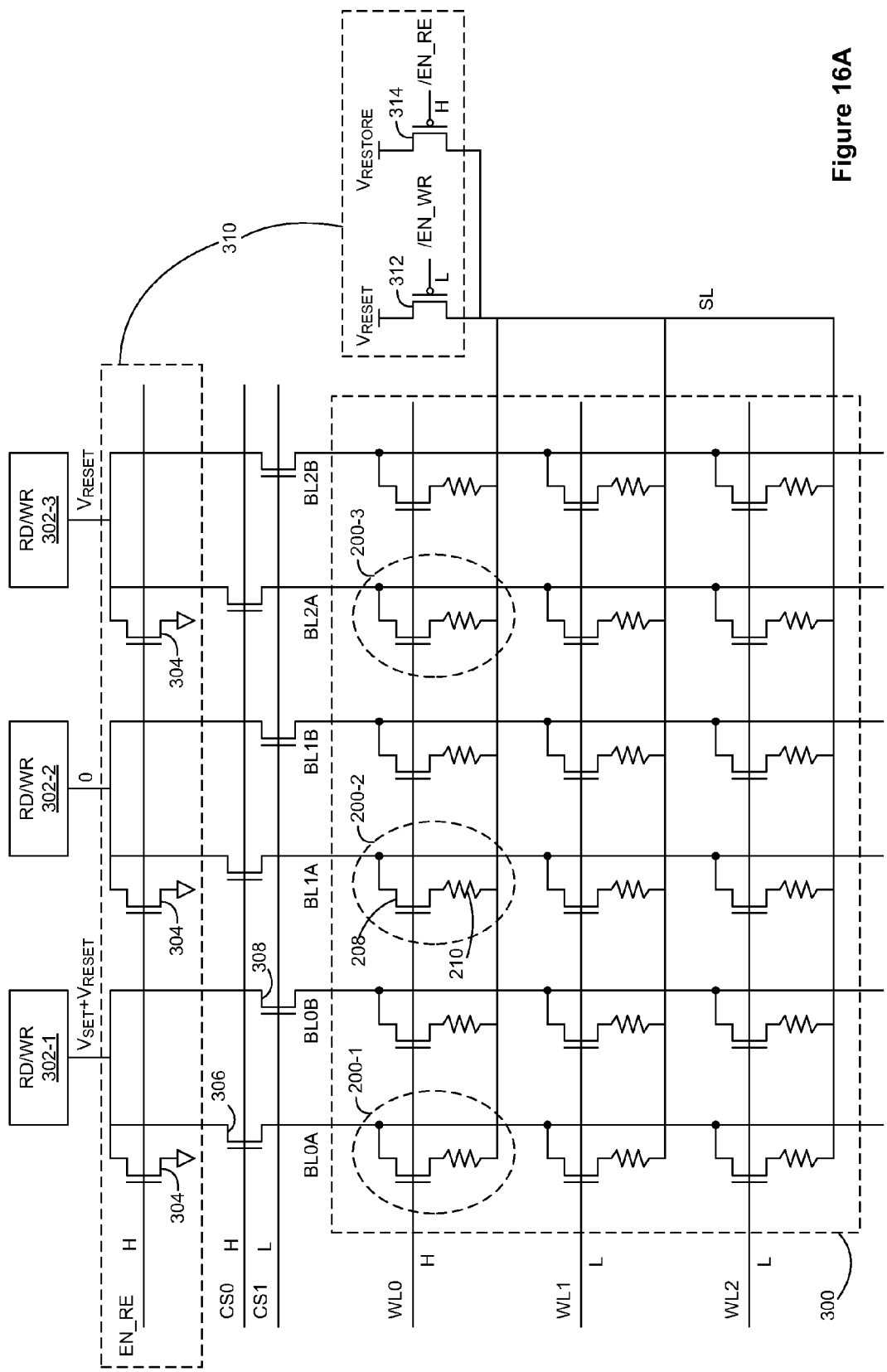

Resistive change memory cells such as resistive change memory cells 200, 220, 230, or 240 are situated in an array in a resistive change memory device. FIG. 16A illustrates an array 300 of resistive change memory cells 200 (FIG. 2A), including resistive change memory cells 200-1, 200-2, and 200-3, in accordance with some embodiments. While the array 300 is made up of resistive change memory cells 200, it alternatively could be made up of resistive change memory cells 220 (FIG. 2B). Word lines WL0, WL1, and WL2 extend across respective rows of resistive change memory cells 200 in the array 300; each of the word lines WL0, WL1 and WL2 is coupled to the gates of the pass gates 208 of the resistive change memory cells 200 in a respective row. Bit lines BL0A, BL0B, BL1A, BL1B, BL2A, and BL2B extend across respective columns of resistive change memory cells 200 in the array 300; each of the bit lines BL0A, BL0B, BL1A, BL1B, BL2A, and BL2B couples to the sources of the pass gates 208 of the resistive change memory cells 200 in a respective column. (The number of rows and columns shown for array 300 is limited for visual clarity; the array may include additional rows and columns.) The source of each respective pass gate 208 corresponds to a node 202 (FIG. 2A). In some implementations, each bit line is coupled to a respective read/write (RD/WR) circuit 302 and to a pull-down transistor 304 (e.g., an n-type MOSFET).

Figure 3A:
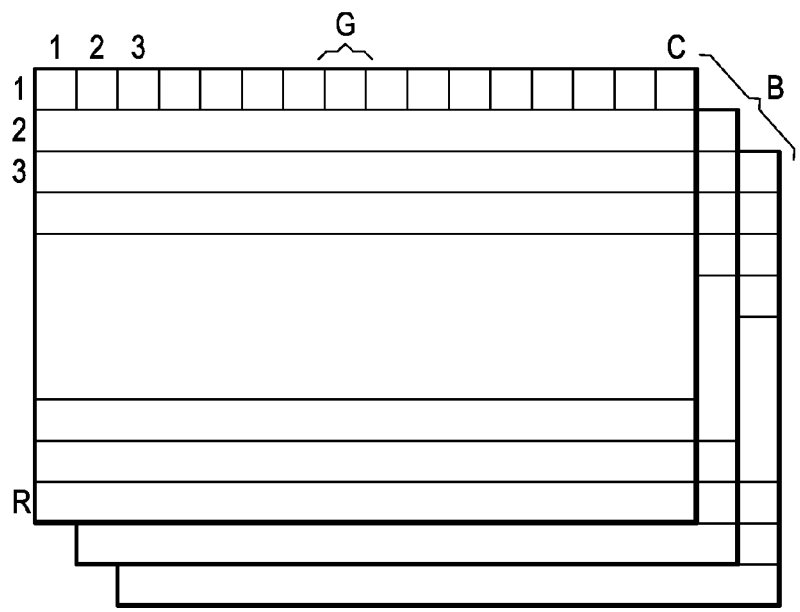
FIG. 3A is a simplified conceptual diagram illustrating one example of a memory array organization in a memory device.

Referring now to FIG. 3A, it shows a simplified conceptual diagram illustrating a conventional memory array organization in a memory device. Each bank consists of R number of rows, each of which is composed of C number of columns. The width of a column access is G bytes. The banks are replicated B number of times within a device. The total memory size in bytes is the product of B×R×C×G.

Figure 3B:
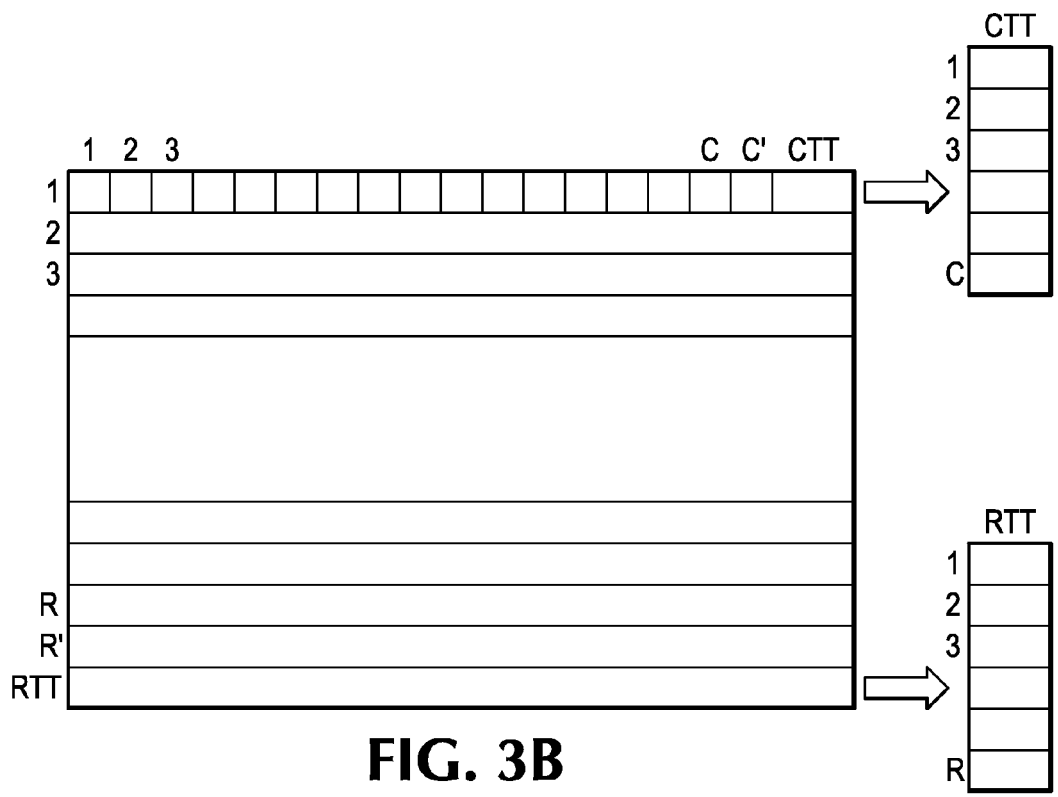
FIG. 3B is a simplified conceptual diagram illustrating an example of a memory array in which extra memory cells are provisioned and row and column translation tables are stored in the memory array in accordance with some embodiments.

In some embodiments, the data array organization may be modified to support arbitrary block remapping. FIG. 3B shows the changes for one bank for simplicity as these changes apply to the other banks in the same way. One significant change in an RRAM device is the support for more physical blocks than the number of logical blocks. This over provisioning applies in the number of extra columns, denoted as C', and in the number of extra rows, denoted as R'. The size of the over provision can be as small as one.

The new organization would have C' number of columns in each row and a column translation table, denoted as CTT, that maps the logical columns to their physical columns. Similarly, each bank has R' number of rows and a row translation table, denoted as RTT, that maps the logical rows to their physical rows. It is possible to have a global translation table that maps any logical column on any logical row to any physical column to any physical row. However, this mapping flexibility has a cost in terms of the translation table size. A preferred embodiment may implement two-level translation tables, where one table is used to remap all the rows and a series of smaller tables are used to remap all the columns within each row. The prior case describes, among other things, wear leveling procedures to extend the lifetime of the entire memory device despite having "pathological access patterns in short duration . . . " We believe that a direct relative measurement of two pages or other regions of memory also would be useful for wear leveling and other purposes.

Figure 4:
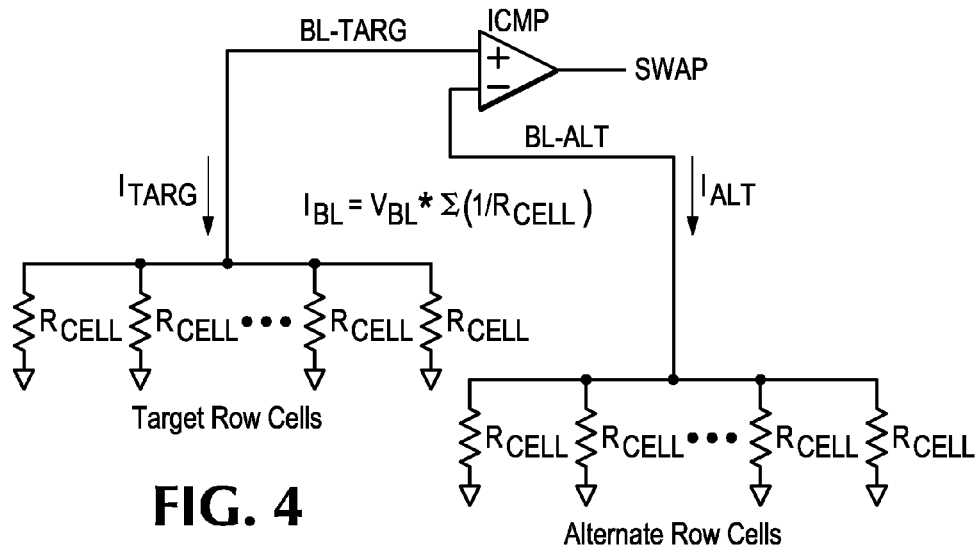
FIG. 4 is a simplified schematic diagram illustrating circuitry for current mode direct relative comparison of endurance states of two rows of memory cells in accordance with some embodiments.

FIG. 4 is a simplified schematic diagram illustrating an example of circuitry for current mode, direct relative comparison of endurance states of two rows of memory cells in accordance with some embodiments. We refer to one row as the "target row" and the second row as the "alternate row." To conduct the direct relative comparison, the two rows (or other groups of memory cells) are first placed in a test state, which is preferably the high resistance state. Referring to the target row of cells (each $R_{CELL}$), the current $I_{TARG}$ flowing in the bit lines BL-TARG in the high resistance (reset) state gives an indication of the remaining endurance of the cells in the row for the reasons explained above. As noted above, the reset state resistance decreases, and therefore the cell current increases, with increasing numbers of set/reset cycles over time.

Similarly, the current $I_{ALT}$ flowing in the bit lines BL-ALT in the same state gives an indication of the remaining endurance of the cells in the alternate row. These two currents are input to a comparison circuit ICMP, with $I_{TARG}$ coupled to the non-inverting input (+) and $I_{ALT}$ presented at the inverting (−) input (using analogy to voltage inputs to an op-amp).

The comparison circuit generates a binary output signal SWAP, indicating a result of the direct comparison of the input currents. This result indicates which of the two rows of cells has a comparatively greater remaining endurance. The result may be used for identifying one of the groups of memory cells as a target for a write operation; namely the group or row having the comparatively greater remaining endurance. The result may also be used for selecting one of the groups of memory cells for a subsequent wear leveling action. In addition or in the alternative, the result may be used to relocate data during a refresh operation.

In some embodiments, measurement of the target row current $I_{TARG}$ and measurement of the alternate row current $I_{ALT}$ may be done concurrently. In other embodiments, the row currents may be measured sequentially. At least one cell current of each row of interest should be measured, although not all cells of the row need be measured. Current measurements are not limited to bit line currents; they may include any or all of bit line currents, word line currents, global bit line currents or source line currents in each of the first and second groups of memory cells, as further described below.

Figure 5:
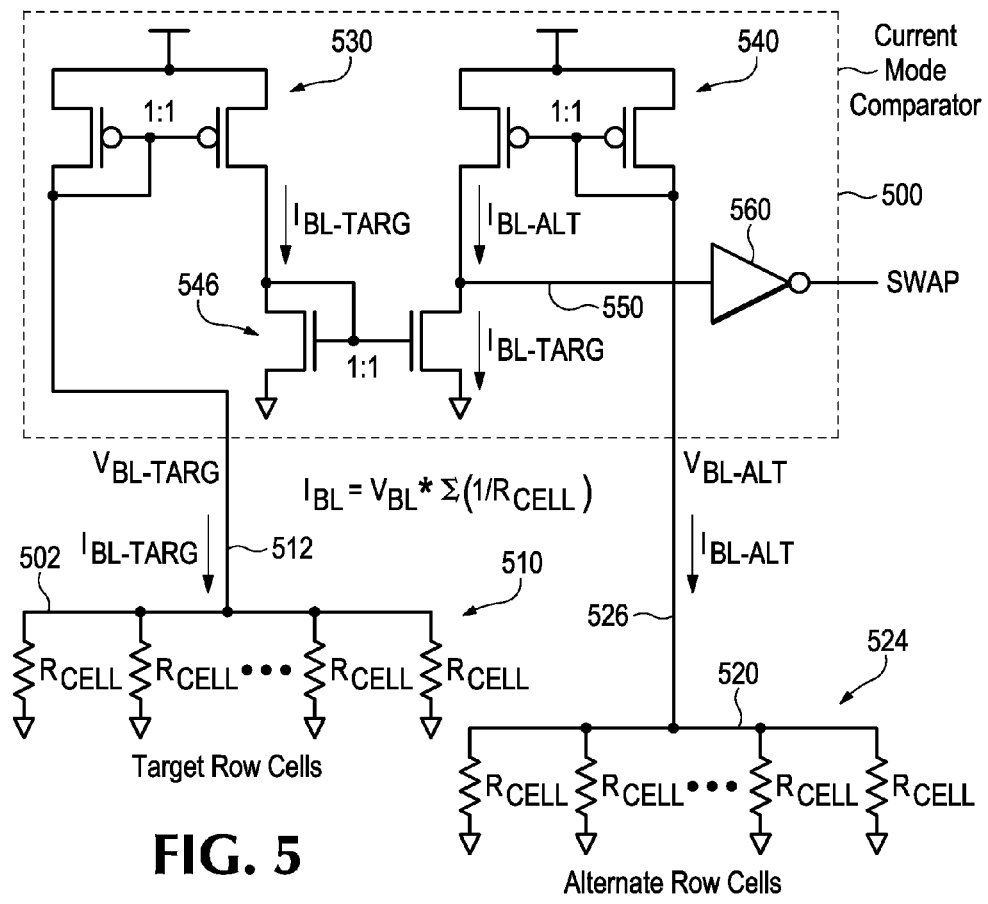
FIG. 5 is a simplified schematic diagram illustrating circuitry for current mode direct relative comparison of endurance states of two rows of memory cells, designated as a target row and an alternate row, showing more detail of a current mode comparator circuit in accordance with some embodiments.

FIG. 5 is another simplified schematic diagram illustrating circuitry for current mode direct relative comparison of endurance states of two rows of memory cells, showing more detail of a current mode comparator circuit 500 in accordance with some embodiments. Here, a target row of cells and an alternate row of cells are illustrated as before. The number of cells per row is not critical, although the number of cells compared generally should be the same. A common bit line node 502 of the target row 510 is coupled to a first input node 512 of the circuit 500. That input node has a voltage $V_{BL-TARG}$ and sinks a current $I_{BL-TARG}$ as shown in the drawing. Similarly, a common bit line node 520 of the alternate row 524 is coupled to a second input node 526 of the circuit 500. The second input node has a voltage $V_{BL-ALT}$ and sinks a current $I_{BL-ALT}$. In both cases, the comparison current $I_{BL}=V_{BL}*\Sigma(1/R_{CELL})$.

In the comparator 500, a first current mirror 530 and a second current mirror 540 present the target and alternate bit line currents, respectively, to a node 550 (via a third mirror 546), where a difference between the two currents is input to an amplifier (inverter) 560. In this example, if the alternate current is less than the target current, indicating greater remaining endurance of the alternate row, node 550 is pulled down and the SWAP signal is asserted (active high).

Figure 6A:
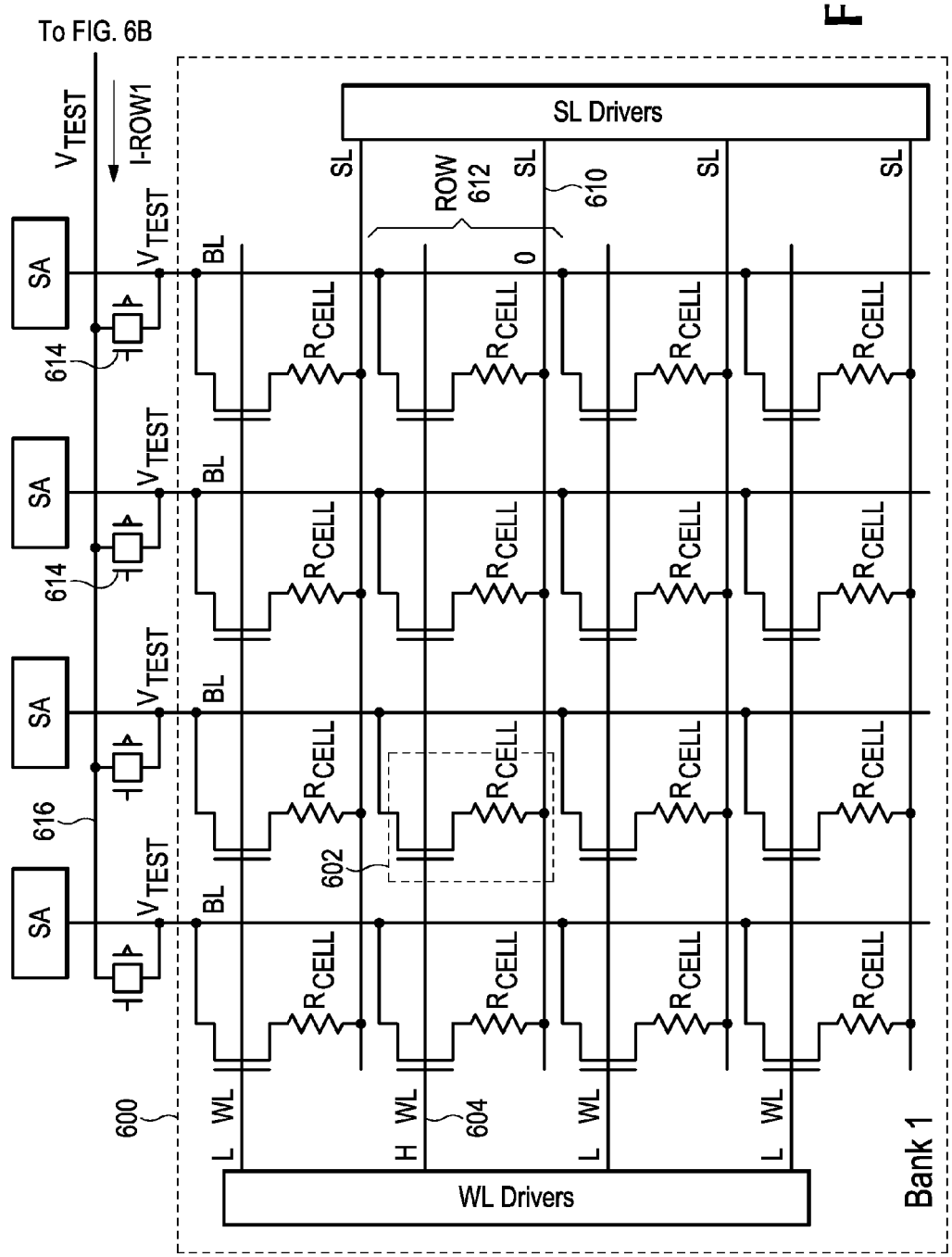
FIGS. 6A-6B together form a simplified schematic diagram illustrating test circuitry implemented in a memory to realize current mode direct relative comparison of endurance states of rows of 1T-1R memory cells in different banks of memory cells in accordance with some embodiments.
Figure 6B:
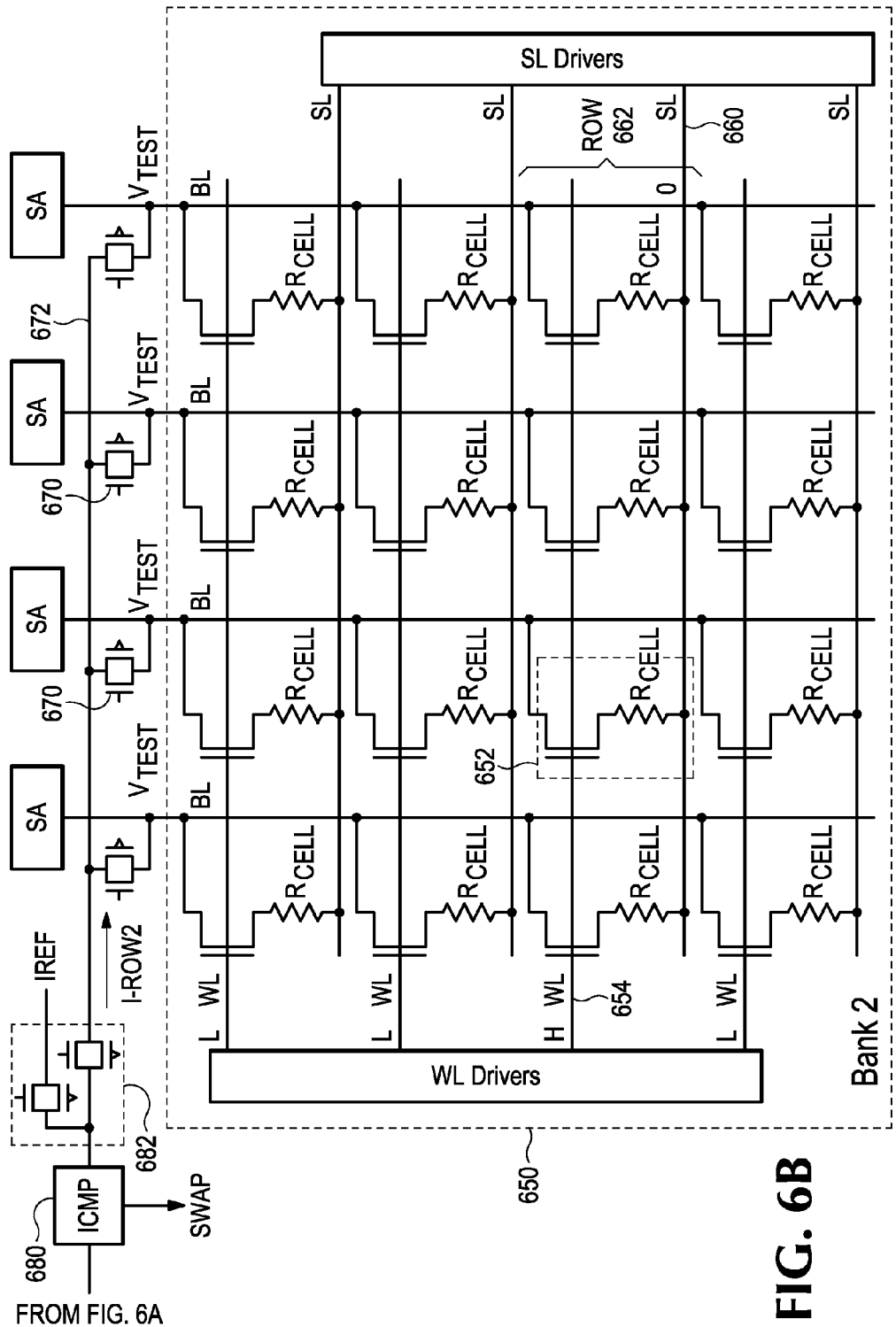

FIGS. 6A-6B together form a simplified schematic diagram illustrating circuitry implemented in a memory to realize current mode direct comparison of endurance states of rows of 1T-1R memory cells in different banks of memory cells in accordance with some embodiments. As before, to conduct the direct relative comparison, we assume the memory cells of interest are first placed in a test state, preferably a high resistance state. FIG. 6A shows a first array 600 of memory cells, for example cell 602, arranged to form Bank 1. Similarly, FIG. 6B shows a second array 650 of memory cells, for example cell 652, arranged to form Bank 2. In Bank 1, a word line 604 is asserted high, and the corresponding source line 610 is asserted low, to select the corresponding row 612, hereinafter Row1. In Bank 2 (FIG. 6B), a word line 654 and the corresponding source line 660 are asserted, to select row 662, hereinafter Row2. In a test mode of operation, transmission gates 614 couple each of the Bank 1 bit lines to a common test node 616. Accordingly, a total current I-Row1 will sink through the selected row via node 616. Similarly, in a Bank 2 test mode (which may be concurrent or sequential relative to the test mode in Bank 1), transmission gates 670 couple each of the Bank 2 bit lines to a common test node 672. Therefore a total current I-Row2 will sink through the selected row 662 via node 672.

The test node 616 of Bank 1 and the test node 672 of Bank 2 are input to a current comparison circuit 680, which may be similar to that described above with regard to FIG. 5. The comparison circuit 680 outputs the SWAP signal as shown. During test operations, the sense amps SA of both banks are off or tri-stated. In an embodiment, an optional mux 682 may be provided to couple node 672 to a fixed reference current source IREF. In this way, the selected Bank 1 row test current I-Row1 can be compared to the reference current IREF to provide an indication of remaining endurance of the row. The SWAP result signal can be used in various ways as noted above.

Figure 7:
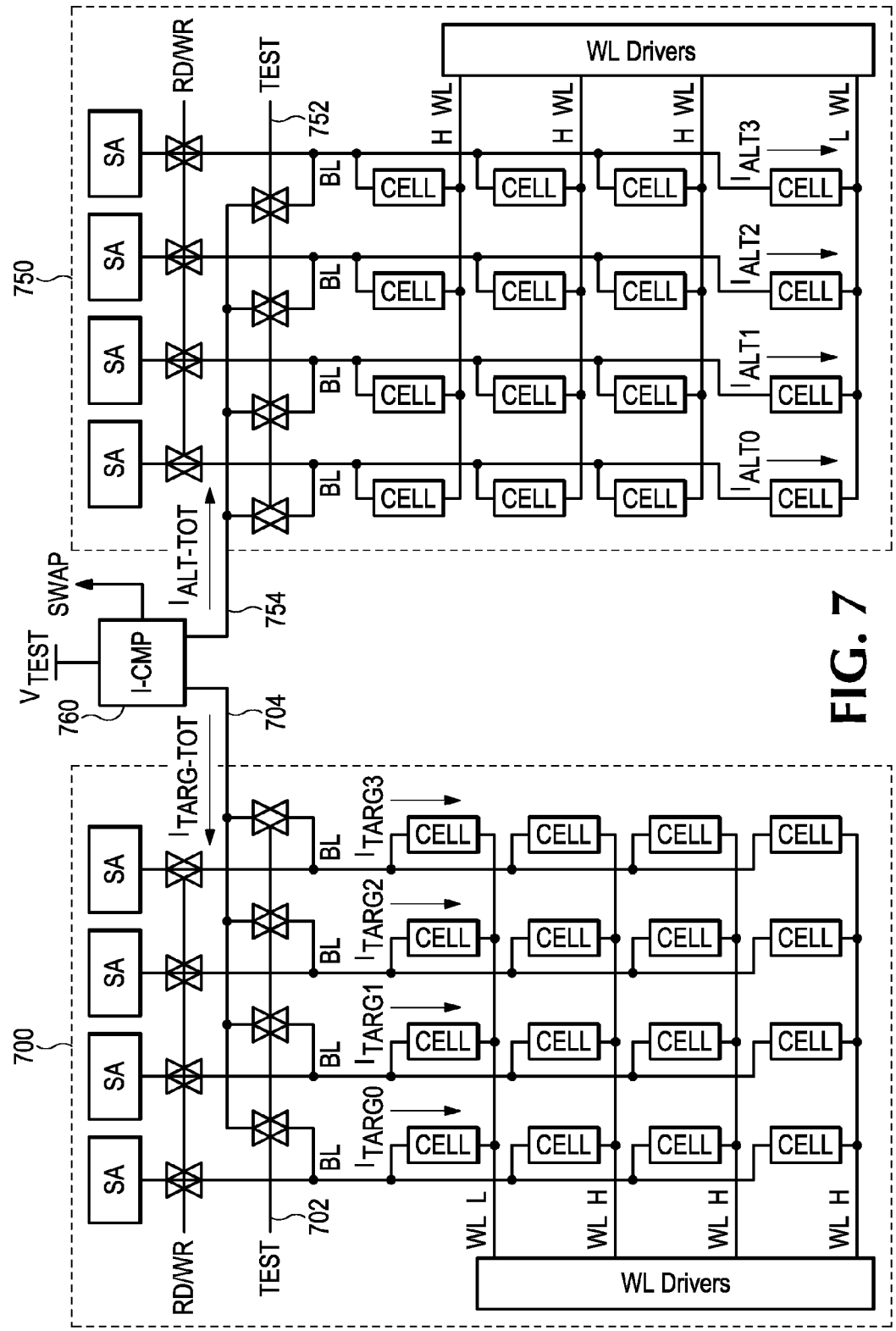
FIG. 7 is a simplified schematic diagram illustrating circuitry for bitline current direct relative comparison of endurance states in 2-terminal memory cell arrays.

FIG. 7 is a simplified schematic diagram illustrating circuitry for bit line current direct relative comparison of endurance states in 2-terminal memory cell arrays. A first array 700 and a second array 750 are shown. In each array, transmissions gates or similar logic are shown for coupling the bit lines to sense amps (SA) for read and write operations (RD/WR) operations. These are off during test (measurement) operations. The cells are assumed to be in a test state, which is preferably a high resistance state as mentioned. In the first, or target array 700, a test input signal 702 asserts transmission gates per bit to couple the bit lines (BL) to a common test node 704. All of the bit lines are coupled to node 704, however, only the row of cells in the asserted row (WL low) will sink current contributing to the total test current $I_{TARG-TOT}$. In the second or alternate array 750, a second test input signal 752 controls transmission gates per bit to couple the bit lines (BL) to a common test node 754. The test nodes 704 and 754 are input to a current comparator circuit 760, which in turn generates a SWAP signal generally as described above.

Figure 8A:
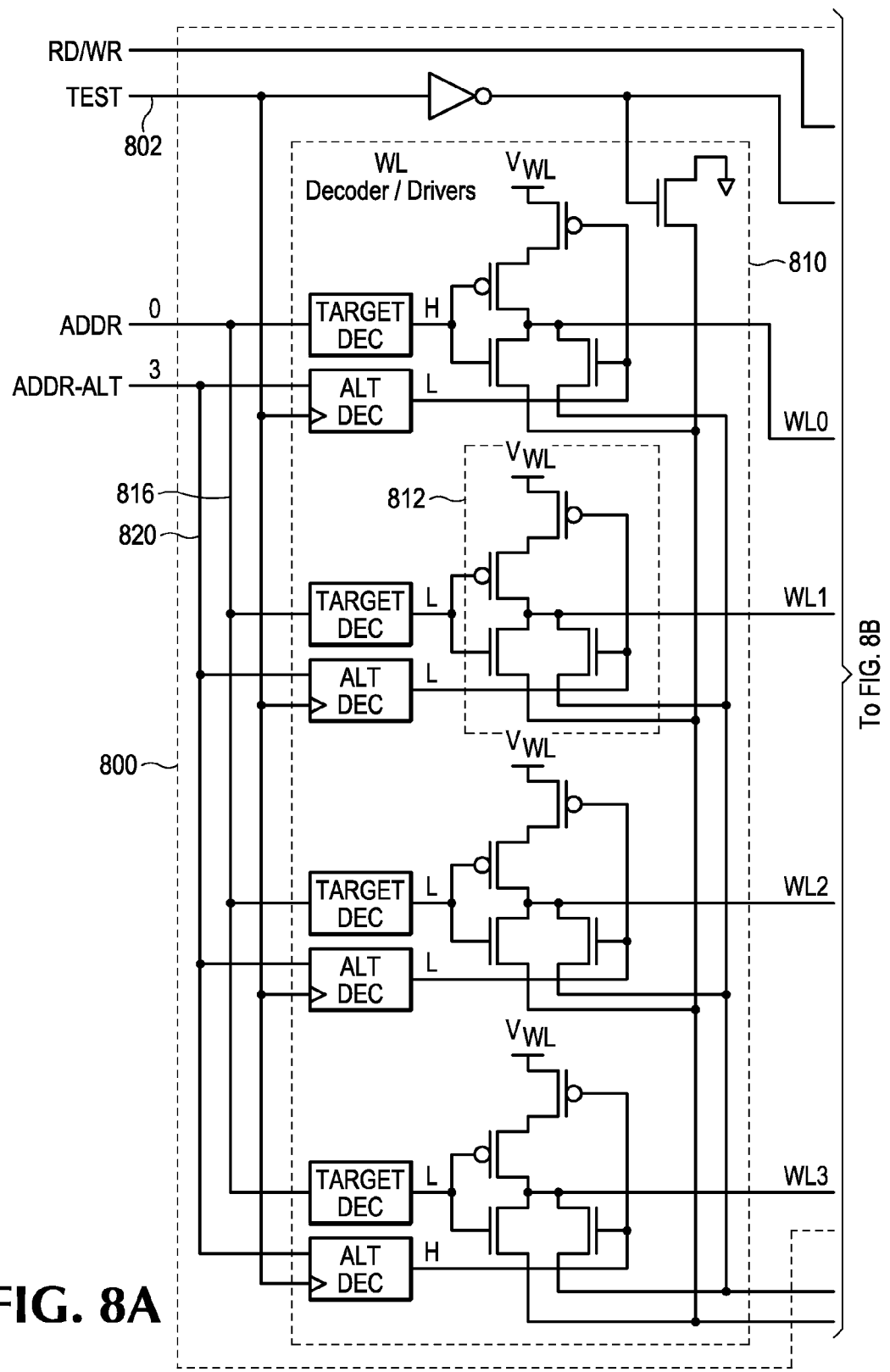
FIGS. 8A-8B together form a simplified schematic diagram illustrating circuitry for wordline current comparison of endurance states in 2-terminal memory cell arrays.
Figure 8B:
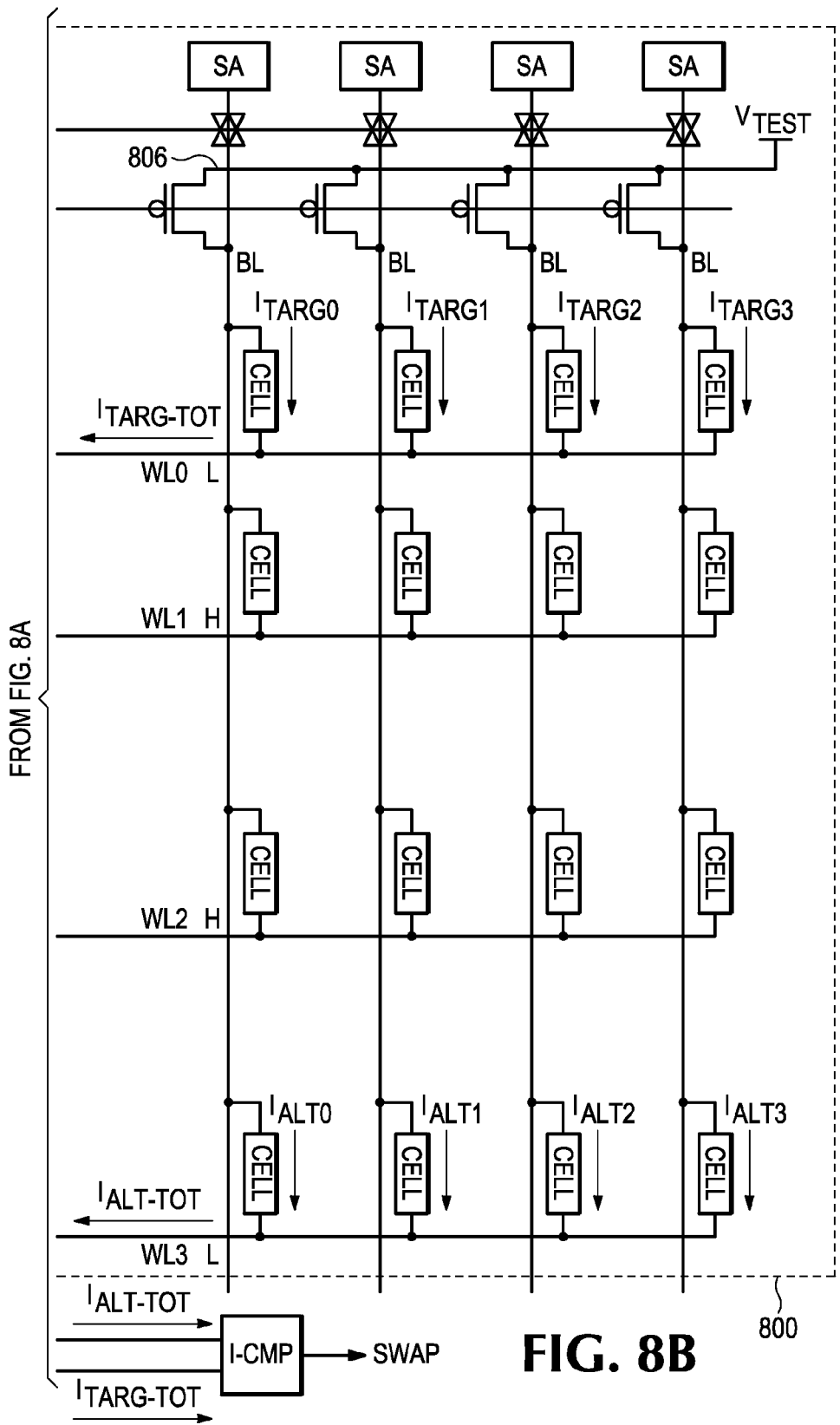

FIGS. 8A-8B together form a simplified schematic diagram illustrating circuitry for wordline current comparison of endurance states in a 2-terminal memory cell array 800. As before, the bit lines (BL) are isolated from the sense amps (SA) during test mode of operation. During test mode, a test logic signal TEST is applied at node 802 to clock alternative (ALT) word line decoders as explained below, and to couple all of the array bit lines (BL) to a reference voltage VTEST at node 806. The memory includes a series of word line (WL) decoders and drivers, in dashed box 810. For each word line or row of the array 800, labeled WL0-WL3, there is provided both a corresponding target decoder (TARGET DEC) and a corresponding alternate decoder (ALT DEC). A target row address (ADDR) is input to all of the target decoders, via node 816. An alternative row address (ADDR-ALT) is input to all of the alternate decoders, via node 820. In this illustration, the target address selects WL0 and the alternate address selects WL3. In this way, rows 0 and 3 are selected for wordline current comparison of endurance states of the rows of cells.

The currents through the selected (WL0) cells, labeled $I_{TARG0}$-$I_{TARG3}$, together form the total target word line current $I_{TARG-TOT}$ (FIG. 8B). Likewise, the alternate (WL3) cell currents, labeled $I_{IALT0}$-$I_{ALT3}$, sum to form the total alternate word line current $I_{ALT-TOT}$. The target and alternate word line currents are steered via switch logic (for example 812) to a current comparison circuit I-CMP. The circuit I-CMP compares the two currents, and generates a SWAP signal. Thus the SWAP signal provides an indication, based on direct word line current comparison, of which row, the target row or the alternate, has a relatively greater remaining endurance.

Figure 9A:
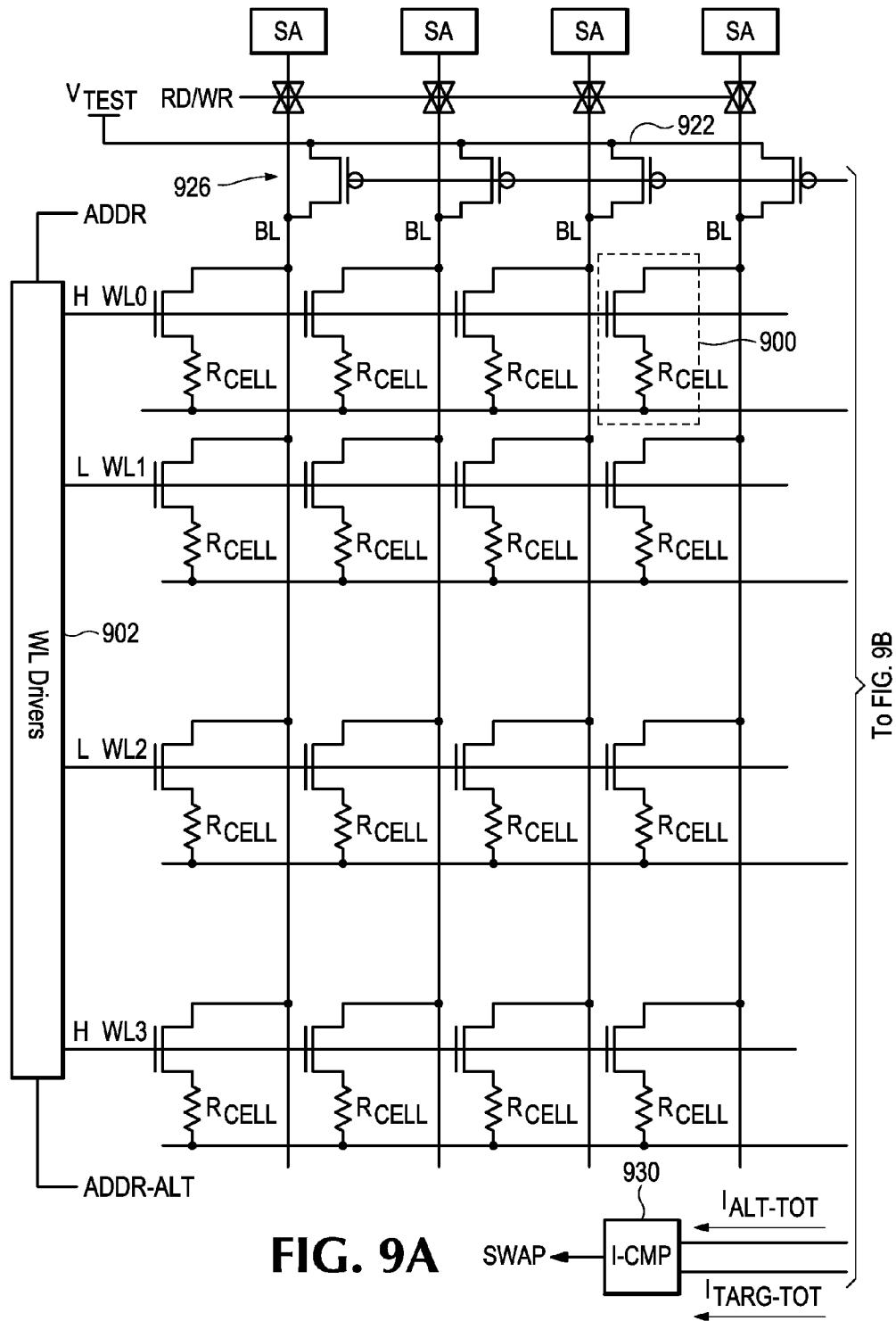
FIGS. 9A-9B together form a simplified schematic diagram illustrating circuitry for direct SL current comparison within a bank of a 1T-1R array of memory cells.
Figure 9B:
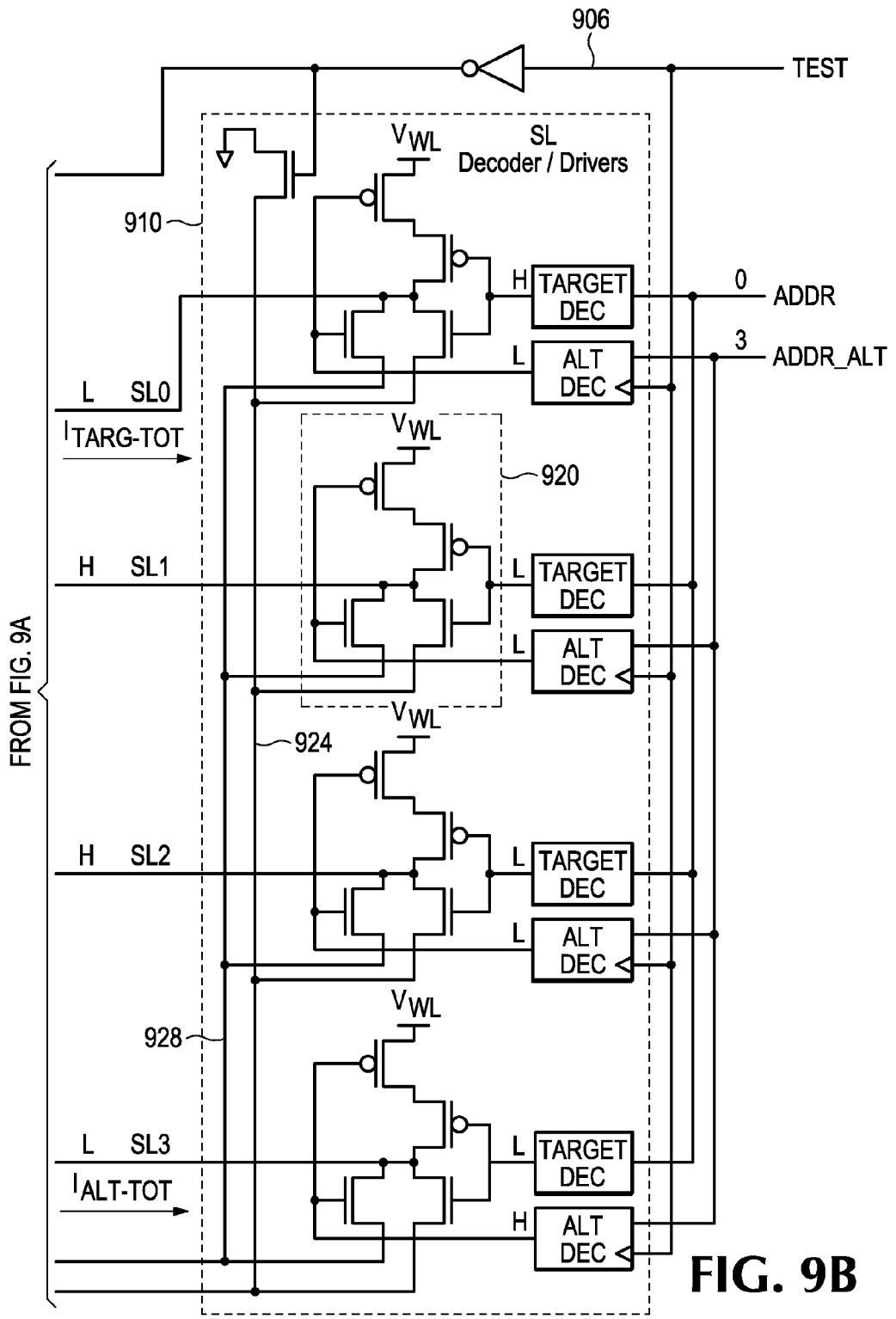

FIGS. 9A-9B together form a simplified schematic diagram illustrating circuitry for direct source line (SL) current comparison within a bank of a 1T-1R memory cells, for example cell 900. Each cell is coupled to a corresponding bit line (BL), word line (WL) and source line (SL). In FIG. 9A, a target address ADDR and alternate address ADDR-ALT are input to word line (WL) drivers 902, which activate corresponding word lines WL0 and WL3 (active high indicated by "H"), respectively, during a test operation. In FIG. 9B, the ADDR and ADDR-ALT addresses are input to target decoders (TARGET DEC) and alternate decoders (ALT DEC), respectively which, in turn, activate the corresponding source lines SL0 and SL3 (the source lines are active low in the present example). Further, for a test operation, the sense amps (SA) are again decoupled from the bit lines, and the test logic signal couples the bit lines to a test voltage $V_{TEST}$ at node 922 by turning on transistors 926 (FIG. 9A).

During a test operation, in one embodiment, switch logic provided per row, for example logic 920, may be arranged to steer the target row source line current $I_{TARG-TOT}$ from the corresponding cells to a common node 924 while isolating the non-selected rows. Similarly, the switch logic steers the alternate row source line current $I_{ALT-TOT}$ from the corresponding (SL3) cells to a common node 928. The target row source line current, node 924, and the alternate row source line current, node 928, are input to a current comparison circuit I-CMP 930 for comparison. The comparison circuit I-CMP generates a result signal SWAP as discussed above and further explained below.

Figure 10:
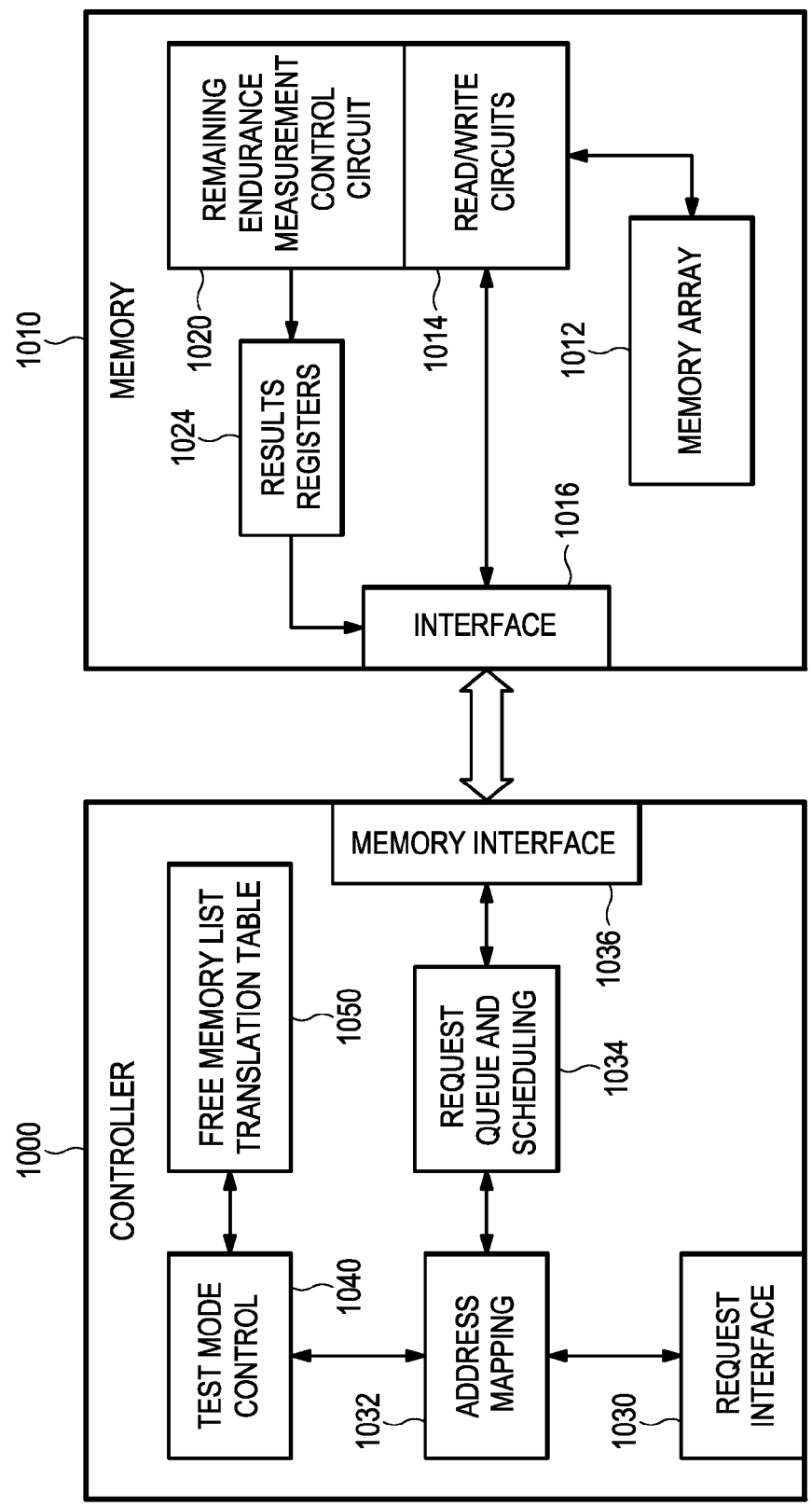
FIG. 10 is a simplified block diagram of a memory system in accordance with some embodiments.

FIG. 10 is a simplified block diagram of an example of a memory system in accordance with some embodiments, comprising a controller 1000 operatively coupled to a memory 1010. The memory 1010 comprises a memory array 1012 coupled to appropriate read/write circuits 1014, which in turn are coupled to an interface 1016 for interaction with the controller to communicate commands, status, data, etc. The memory array is used broadly; for example, it may comprise one or more arrays, and it may comprise one or more banks. It includes at least one array of resistive change memory cells. A control circuit 1020 is arranged to conduct measurements to assess remaining endurance of selected groups of cells (for example, rows, banks, etc.) of the memory array. Such measurements may be conducted, for example, using circuits and or methods such as those described above. Results of the measurements may be stored in buffers such as results registers 1024. The results registers may be coupled to the interface 1016 so that they are accessible to the controller 1000.

The controller may include a request interface 1030 for interfacing with a host or client user of the memory system. The request interface is coupled to an address mapping component 1032, which in turn is coupled to request queue and scheduling components 1034, details of which are known. The request queue and scheduling components 1034 are coupled to a memory interface 1036 for interaction with the memory 1010 via the interface 1016.

Test mode control logic 1040 may be implemented using hardware, firmware or any combination of circuits and or software. The test mode control logic may communicate a test request or instructions to the memory 1010 via the memory interface, for assessing the relative remaining endurance of selected groups of cells in the memory array 1012. The control logic may request memory cell testing at various times; including, for example, upon initialization, during idle periods, periodically, or based on other inputs or factors such as memory access counts. The logic 1040 may read test results from the results registers 1024. The test mode control logic may then utilize the results in connection with address mapping 1032, for example to remap a write request to an alternate address having relatively greater remaining endurance.

In some embodiments, the controller may implement one or more free memory list translation tables 1050. The test mode logic 1040 may update the translation tables based on test results from the result registers 1024 in the memory. In one example, the free memory list may be an ordered list, and the test mode logic may update the order responsive to the test results. For example, the list may be arranged so that memory cells having relatively greater remaining endurance are used (written to) before those cells having relatively lesser remaining endurance. The control logic may request a series of tests, for example over a range of rows, or multiple banks, of the memory 1012. The results may be used to form or update an ordered list of groups of memory cells. The endurance testing may be transparent to the host.

Figure 11:
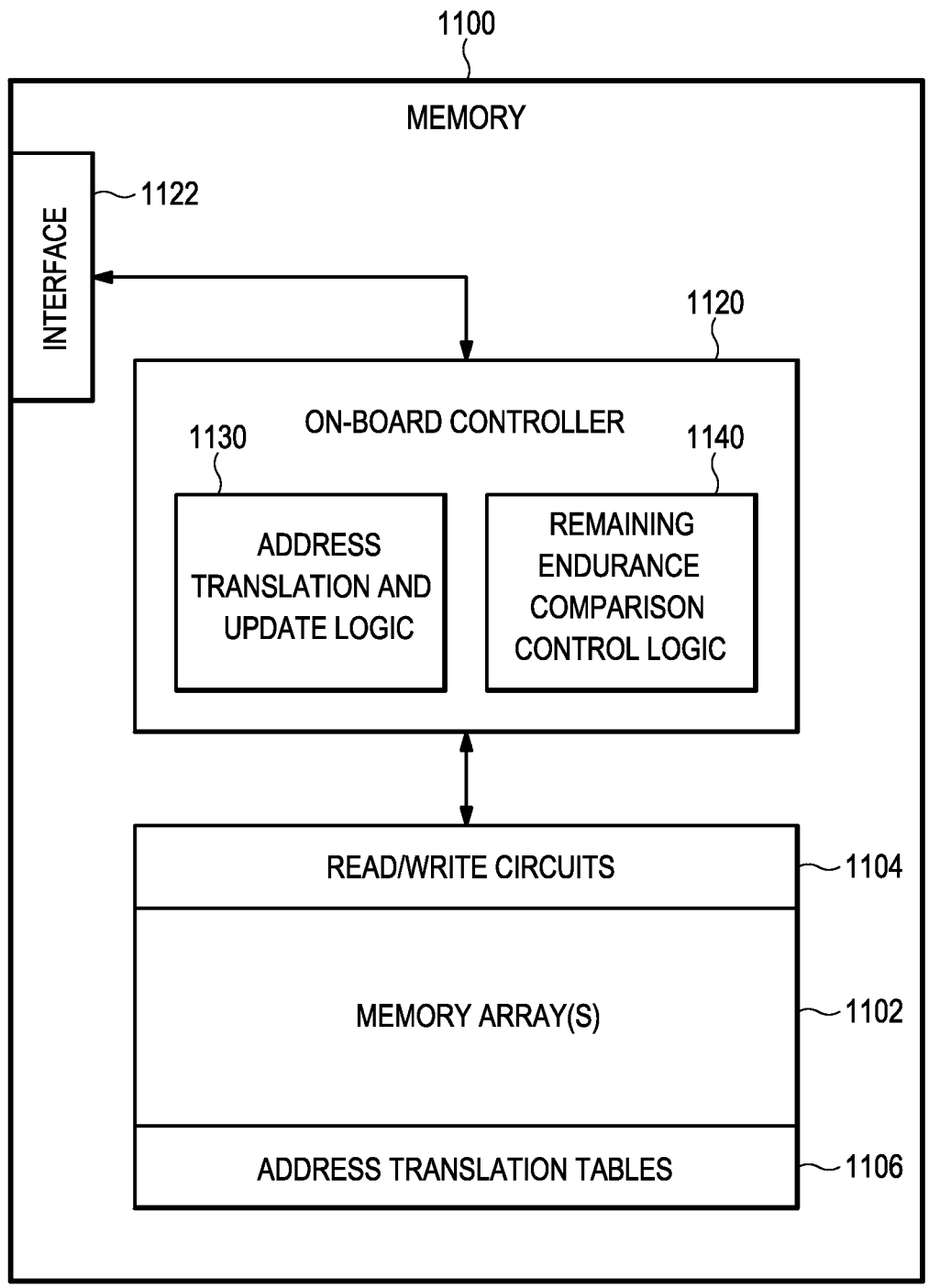
FIG. 11 is a simplified block diagram of a memory system in accordance with some embodiments.

FIG. 11 is a simplified block diagram of a memory system in accordance with some alternative embodiments. Here, a memory system 1100 includes one or more memory arrays 1102 coupled to associated read/write circuits 1104 and address translation tables 1106. The system includes an on-board memory controller 1120 which is operatively coupled to the memory arrays 1102, and to an interface 1122 for interacting with a host user of the memory.

In this example, the on-board controller includes address translation logic 1130 and a remaining endurance comparison control circuit 1140, or "test control logic" 1140 for brevity. The term "logic" is used broadly herein, and may refer to any combination of circuits and or software used to provide the indicated function. The test control logic is arranged to conduct direct relative endurance testing of selected groups of cells in the memory array 1102. Toward that end, the test control logic may interact with the memory to conduct such tests by, for example, selecting a target address, selecting an alternate address, isolating sense amps, and asserting test control signals so as the generate test results which may be reflected, for example, in a SWAP result signal as discussed above. The test results may be used to update the address translation logic 1130.

The on-board controller 1120, using the test control logic 1140, may implement some of the same functions as those of the discrete controller 1000 of FIG. 10. Thus, the on-board controller may maintain and update ordered lists of free memory, for example, responsive to the direct relative endurance testing results garnered by the test control logic 1140. Again, these operations may be transparent to the host. Similar to the discrete controller, the on-board controller may execute testing operations at various times; including, for example, upon initialization, during idle periods, periodically, or based on other inputs or factors such as memory access counts.

Figure 12:
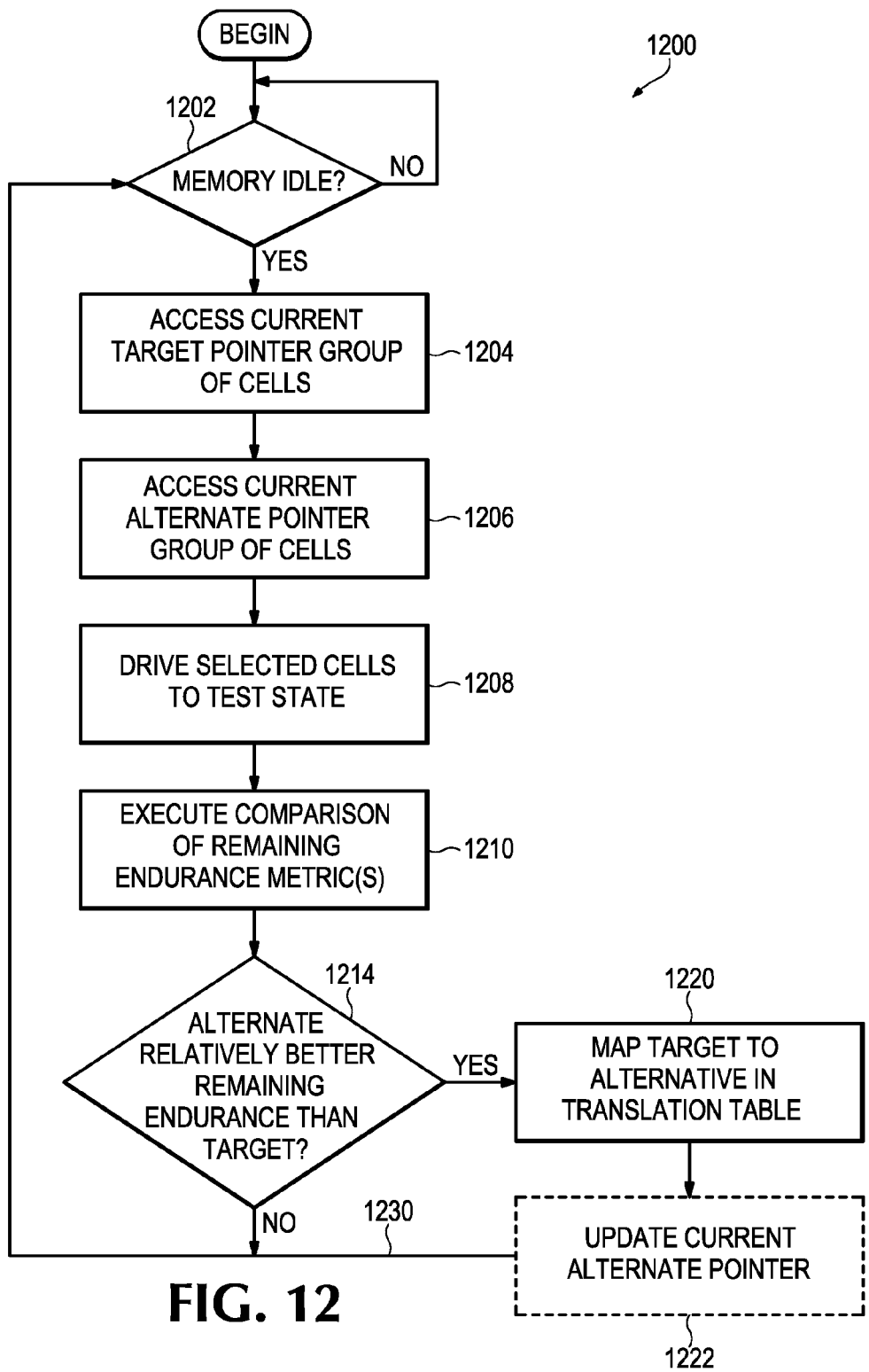
FIG. 12 is a simplified flow diagram for directly comparing relative operation of selected groups of memory cells with regard to a selected durability metric and updating translation tables as a background operation in accordance with some embodiments.

FIG. 12 is a simplified flow diagram 1200 showing one process for directly comparing relative operation of selected groups of memory cells with regard to a selected durability metric, and updating translation tables as a background operation in accordance with some embodiments. If the memory is idle, decision 1202, the process calls for accessing a current pointer to identify a target group of cells, block 1204. And accessing an alternate pointer to identify an alternate group of cells, block 1206. The selected cells (both the target group and the alternate group) are driven to a test state, block 1208. Then, a comparison is made of the relative endurance of the selected cells, based on a direct measurement which may include one or more of the techniques described above, block 1210. In the case that the alternate group of cells exhibits relatively better remaining endurance, decision 1214, the process continues to mapping the target locations to the alternate locations, block 1220. This mapping may be stored in an address translation table.

In some embodiments, the process may continue to testing additional memory cells by updating the current alternate pointer, block 1222, and repeating the foregoing steps, path 1230. Further, multiple passes through this type of process can be conducted to effect a "bubble sort" resulting in an ordered list of groups of memory cells according to remaining endurance test results.

Figure 13A:
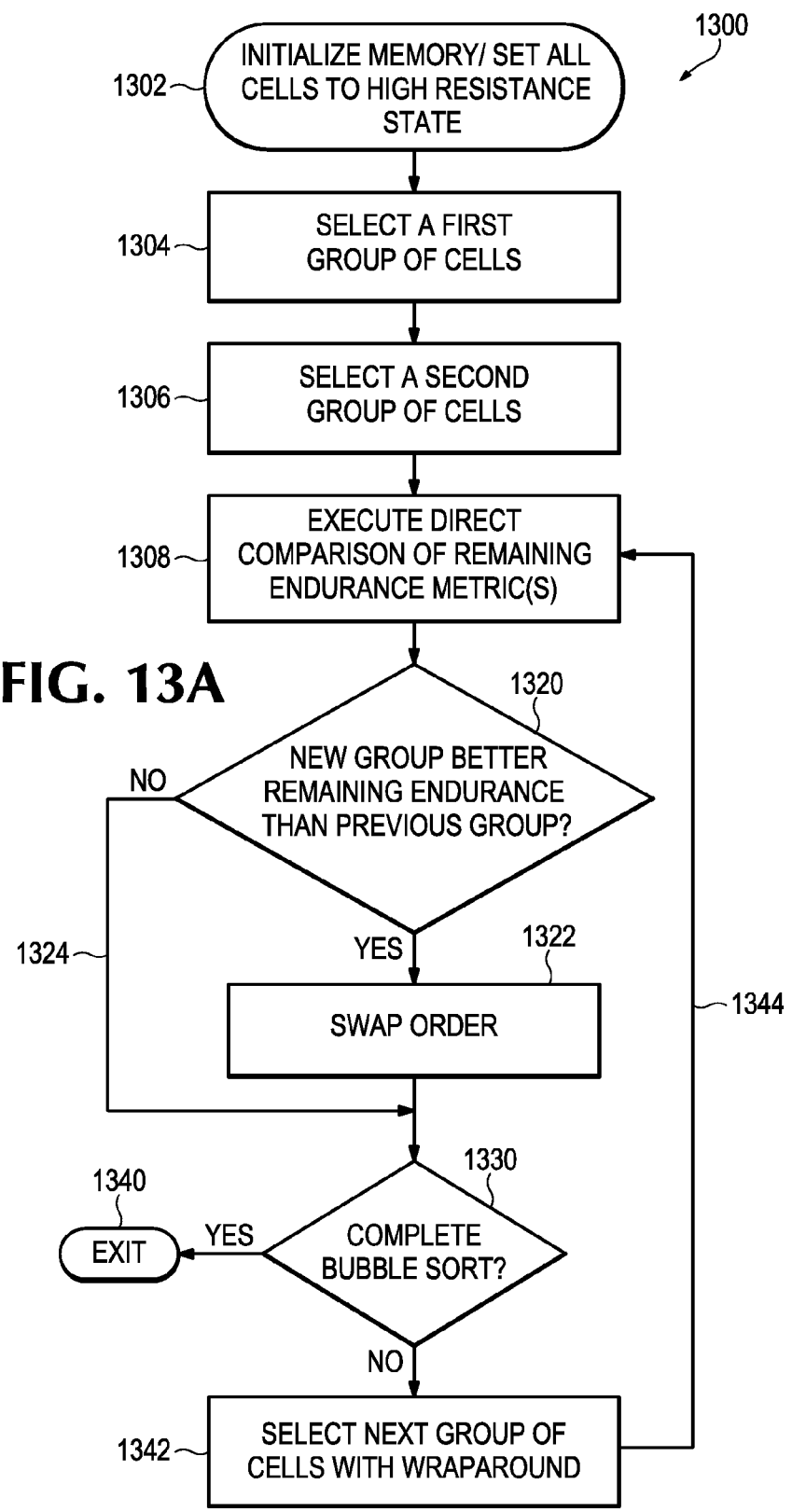
FIG. 13A is a simplified flow diagram illustrating one method for concurrently comparing relative operation of selected groups of memory cells with regard to a selected durability metric to generate a ranked list of available memory cells in accordance with some embodiments.

FIG. 13A is a simplified flow diagram 1300 illustrating one method for concurrently comparing relative operation of selected groups of memory cells, and ordering the groups of memory cells. Here, a memory or a portion thereof (array, sub-array, block, page, bank, etc.) is initialized by setting all of the cells of interest to a high resistance state, block 1302. We assume a set of at least two groups of cells. The process then calls for selecting a first group of cells, block 1304, and selecting a second group of cells, block 1306. Next, at block 1308, a direct comparison is made of a metric that is indicative of remaining endurance of the first and second groups of cells. If the second group has better remaining endurance than the first group, decision 1320, the order of the groups are swapped in an ordered list (not shown), block 1322. In the case that the first group exhibits a relatively better remaining endurance than the second group, path 1324, the process continues at decision 1330, which determines whether a bubble sort of a selected set of groups of cells has completed. If the sort is complete, the process terminates at exit 1340.

If the sort is not complete, at block 1342, the next group of cells of the set is selected, and the process loops via path 1344 back to block 1308 to execute a comparison relative to the selected next group of cells. This loop via 1344 may be repeated until the end of the set of groups of cells, and then further repeated, wrapping around back to the beginning of the set, making such multiple passes as necessary to complete a bubble sort, and thus generate a ranked list of available groups of memory cells. Various methods of this general type may be conducted by a discrete memory controller or an on-board controller.

Figure 13B:
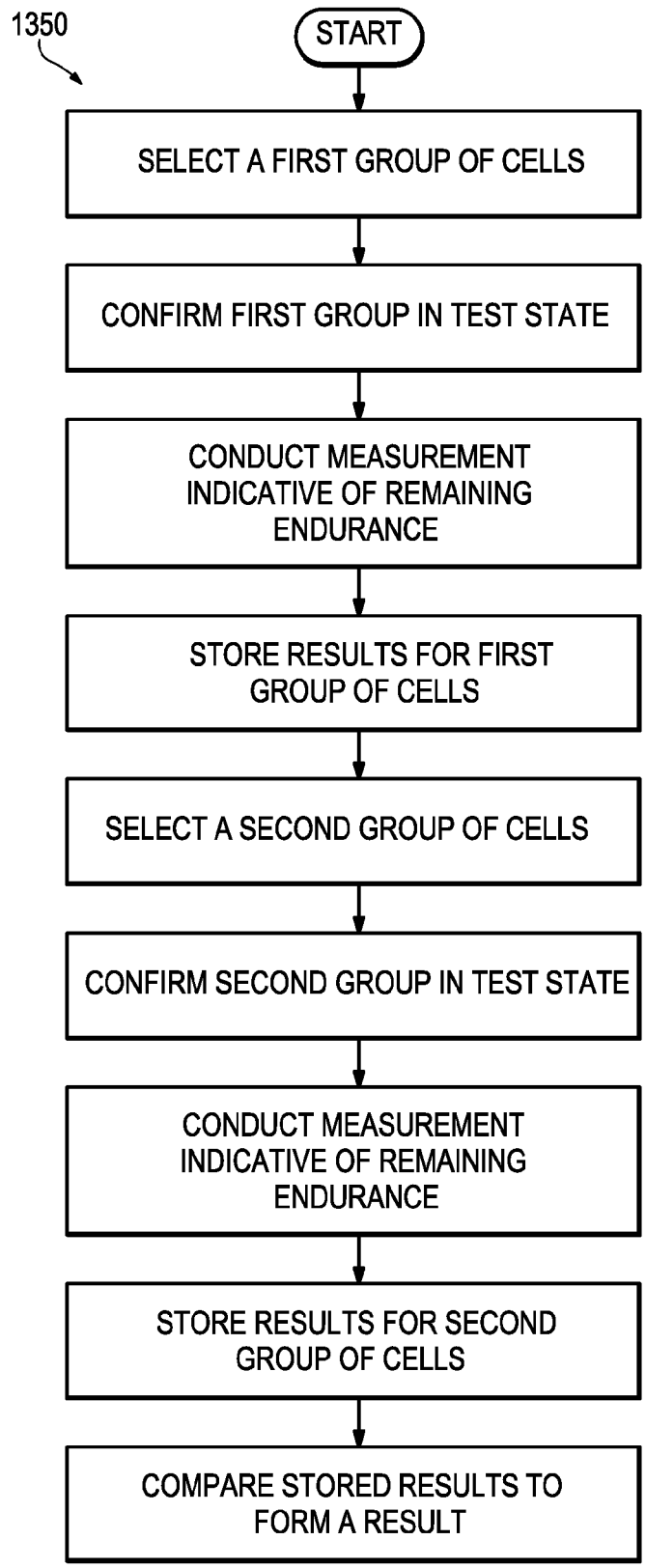
FIG. 13B is a simplified flow diagram illustrating one method for sequentially comparing selected groups of memory cells with regard to measurements indicative of remaining endurance of the memory cells.

FIG. 13B is a simplified flow diagram 1350 illustrating one method for sequentially comparing selected groups of memory cells based on measurements indicative of remaining endurance of the memory cells. The text shown in the drawing figure is explanatory, and need not be repeated here.

Figure 14:
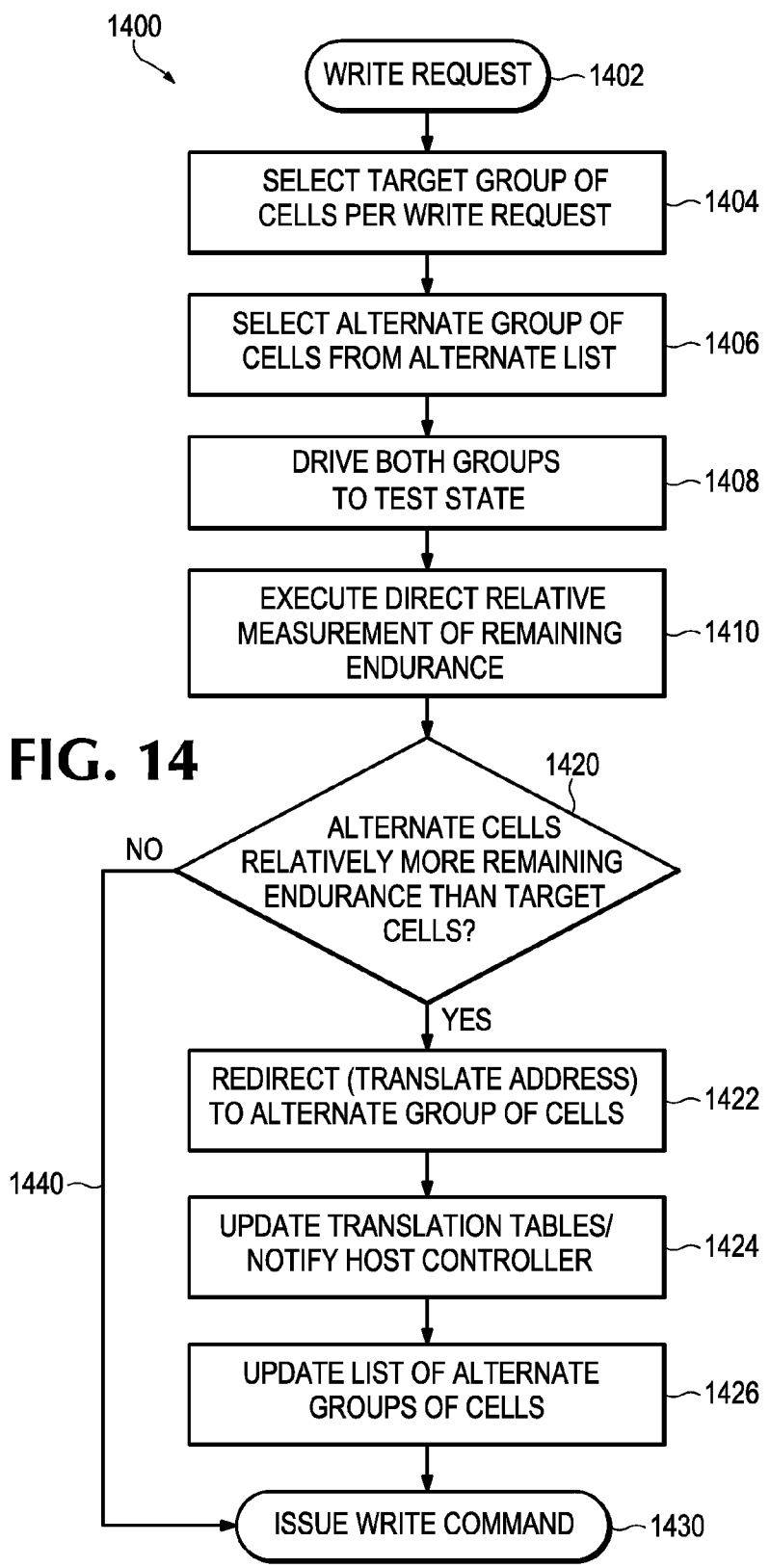
FIG. 14 is a simplified flow diagram for directly comparing relative operation of selected groups of memory cells with regard to a selected durability metric during a write operation in accordance with some embodiments.

FIG. 14 is a simplified flow diagram 1400 for directly comparing relative remaining endurance of selected groups of memory cells during a write operation. A write request is received, block 1402. The process comprises selecting a target group of cells per the write request, block 1404. It may be a row of cells, for example. An alternate group of cells is selected, block 1406. The alternate group may be taken from a list of available groups of cells. Both groups of cells are driven to a test state, block 1408. In resistive memory cells, the test state may be a high resistance state. Next, the process calls for executing a direct relative measurement of remaining endurance of the target group of cells as compared to the alternate group of cells, block 1410.

In the case that the measurement result indicates the alternate group of cells has a relatively better remaining endurance than the target group, decision 1420, the write request is redirected; that is, the write is directed to the alternate group of cells, block 1422, rather than to the target group identified in the write request at 1402. In that case, the translation tables are updated to reflect the change in the target address for the write request, block 1424. A host controller also may be notified of the change. Further, a list of alternate groups of cells is updated, block 1426, to indicate the location where the present write request is redirected as unavailable. Finally, a write command is issued to the memory, block 1430, in accordance with the redirection of block 1422. Referring once again to decision 1420, in the case that the measurement result indicates the alternate group of cells does not have a relatively better remaining endurance than the target group, the write command is issued, (see path 1440), without redirection.

Figure 15:
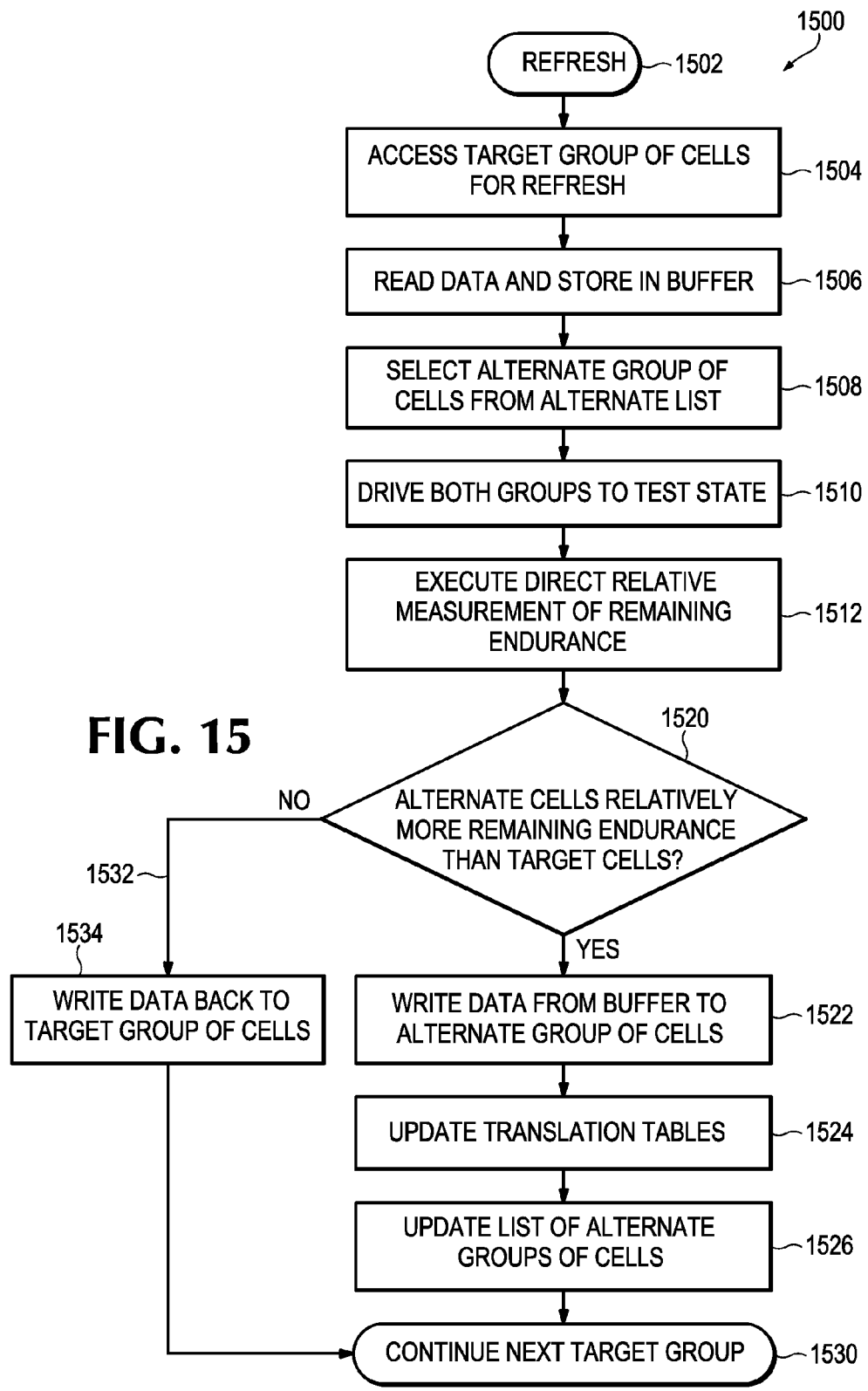
FIG. 15 is a simplified flow diagram for directly comparing relative operation of selected groups of memory cells with regard to a selected durability metric during a refresh operation in accordance with some embodiments.

FIG. 15 is a simplified flow diagram 1500 that illustrates an example of a method that comprises directly comparing relative remaining endurance of selected groups of memory cells during a refresh operation. A refresh operation commences at 1502. The operation includes accessing a target group of cells for refresh, block 1504. Data from the target group of cells is read and stored in a buffer, block 1506. An alternate group of cells is selected from an alternate list, block 1508. Both groups of cells are driven to a test state, preferably a high-resistance state, block 1510. Then a measurement is executed comprising a direct relative measurement of remaining endurance of the target group of cells as compared to the alternate group of cells, block 1512.

With regard to decision block 1520, in the case that the measurement result indicates the alternate group of cells has a relatively better remaining endurance than the target group of cells, the method proceeds to write the data that was stored in a buffer (block 1506) to the alternate group of cells, block 1522. Translation tables are updated accordingly, block 1524. And a list of alternate groups of cells likewise is updated, block 1526, to reflect the selected alternate group (see 1508) is now in use. Finally, the method continues to the next target group in the refresh operation, block 1530. Referring once again to decision 1520, in the case that the measurement result indicates the alternate group of cells does not have a relatively better remaining endurance than the target group, path 1532, then the buffered data is written back to the target group of cells from which it came, block 1534. The process continues, block 1530, as noted, to process the next target group in the refresh operation.

In some embodiments, a method of operating a resistive change memory device includes operating the device in a first mode of operation and a second mode of operation distinct from the first mode. In the first mode, a read command is received from a memory controller. In response to the read command, a parameter associated with a resistive change memory cell of the resistive change memory device is compared to a first threshold to determine a value of a bit stored in the resistive change memory cell. In the second mode of operation, a characterization command is received from the memory controller. In response to the characterization command, the parameter associated with the resistive change memory cell is compared to a second threshold to produce a result signal that provides an indication of future endurance of the resistive change memory cell. The second threshold is stricter than the first threshold. Based on the comparing, the result signal is transmitted to the memory controller.

In some embodiments, a method of controlling a resistive change memory device is performed at a memory controller coupled to the resistive change memory device. In the method, a first instruction is transmitted to the resistive change memory device to perform a read operation for a first set of resistive change memory cells in the resistive change memory device in accordance with a first threshold. In response to the first instruction, data stored in the first set of resistive change memory cells is received. A second instruction is transmitted to the resistive change memory device to characterize a second set of resistive change memory cells in the resistive change memory device in accordance with a second threshold. The second threshold is stricter than the first threshold. In response to the second instruction, a result signal providing an indication of future endurance of the second set of resistive change memory cells is received.

In some embodiments, a resistive change memory device includes a resistive change memory cell to store a bit, a bit line coupled to the resistive change memory cell, and a sense amplifier coupled to the bit line. The sense amplifier is configurable in a first mode to determine a value of the bit stored in the resistive change memory cell in accordance with a first threshold and in a second mode to characterize future endurance of the resistive change memory cell in accordance with a second threshold. The second threshold is stricter than the first threshold.

In some embodiments, a resistive change memory device is provided that includes a resistive change memory cell. The resistive change memory cell includes a resistive memory element. A first biasing condition is applied to the resistive change memory cell to program the resistive change memory cell to a reset state. A determination is made that the resistance of the resistive change memory cell in the reset state has decreased below a predefined threshold. In response to the determination, a second biasing condition is applied to the resistive change memory cell for a restore operation to counteract the decrease in resistance of the resistive change memory cell in the reset state. At least one of a voltage, current, and duration of the second biasing condition is greater than a corresponding voltage, current, or duration of the first biasing condition.

In some embodiments, to at least partially reverse the decrease in reset resistance resulting from subjecting the resistive change memory cell to repeated set/reset cycles, a restore operation is performed under a more extreme biasing condition, referred to as a second biasing condition, than the biasing condition for the reset operation, which is referred to as a first biasing condition. Each biasing condition involves applying a specified voltage to a resistive change memory cell for a specified duration, or alternatively applying a specified current to a resistive change memory cell for a specified duration. For example, the specified voltage (or current) of the second biasing condition has a greater magnitude than, but the same polarity as, the specified voltage (or current) of the first biasing condition, and/or the specified duration of the second biasing condition is greater than the specified duration of the first biasing condition. Because the second biasing condition is more extreme than the first biasing condition, the restore operation more effectively reverses the set operation than does the reset operation. For example, the second biasing condition results in greater migration of ions out of the solid electrolyte onto the electrode than does the first biasing condition. Performing a restore operation increases the future endurance of the resistive change memory cell and therefore increases the number of set/reset cycles the resistive change memory cell can undergo to a value greater than the cell's specified write endurance.

In the implementation shown in FIG. 16A, a pair of bit lines (e.g., BL0A and BL0B) shares a single read/write circuit 302 (e.g., 302-1), as controlled by the transistors 306 and 308. Bit line BL0A is coupled to read/write circuit 302-1 and to a pull-down transistor 304 by applying a logic-high ("H") column-select signal CS0 to the gate of a respective transistor 306, thereby turning on the respective transistor 306. Additionally, a logic-low ("L") column select signal CS1 is applied to the gate of a respective transistor 308 to decouple bit line BL0B from read/write circuit 302-1. Likewise, bit line BL0B is coupled to read/write circuit 302-1 and to a pull-down transistor 304 by applying a logic-high ("H") column-select signal CS1 to the gate of a respective transistor 308. Additionally, a logic-low ("L") column select signal CS0 is applied to the gate of a respective transistor 306 to decouple bit line BL0A from read/write circuit 302-1.

Each of the word lines WL0, WL1 and WL2, bit lines BL0A, BL0B, BL1A, BL1B, BL2A, and BL2B, and source line SL is a distinct conductive line. A source line SL connects to each resistive change memory cell 200 in the array 300. For example, the source line SL connects to the resistive memory element 210 of each resistive change memory cell 200 (e.g., via node 206, FIG. 2A). The source line SL also connects to the drains of pull-up transistors (e.g., p-type MOSFETs) 312 and 314. The source of the pull-up transistor 312 connects to a power supply that supplies a reset voltage $V_{RESET}$ and the source of the pull-up transistor 314 connects to a power supply that supplies a restore voltage $V_{RESTORE}$. The source line SL thus can be coupled to either $V_{RESET}$ or $V_{RESTORE}$ via respective pull-up transistors 312 and 314. For example, the source line SL is coupled to $V_{RESET}$ when a logic-low ("L") complementary write-enable signal /EN_WR is applied to the gate of the pull-up transistor 312 and is coupled to $V_{RESTORE}$ when a logic-low ("L") complementary restore-enable signal /EN_RE is applied to the gate of the pull-up transistor 314. A restore-enable signal EN_RE (e.g., the complement of /EN_RE) is also applied to the gates of the pull-down transistors 304, the drains of which are connected to ground (sometimes herein called circuit ground). The source line SL thus is coupled to $V_{RESTORE}$ during a restore operation, while any bit lines coupled to the transistors 304 through transistors 306 or 308 are simultaneously grounded. In some implementations, the array 300 includes a plurality of source lines. In these implementations, a respective source line connects a respective subset of resistive change memory cells 200 in the array 300. In one example, a respective source line is connected to the resistive change memory cells 200 in each word line; in other examples, a respective source line is connected to the resistive change memory cells 200 in two or more word lines, a respective source line is connected to the resistive change memory cells 200 in each bit line, or a respective source line is connected to the resistive change memory cells 200 in two or more bit lines. The pull-down transistors 304, pull-up transistors 312 and 314, and power supplies supplying the voltages $V_{RESET}$ and $V_{RESTORE}$ together constitute control circuitry 310 (e.g., control circuitry 2510, FIG. 18). The pull-down transistors 304 and pull-up transistors 312 and 314 serve as bias circuits to ground the bit lines and couple the source line SL to either voltage $V_{RESET}$ or voltage $V_{RESTORE}$, respectively.

In the example of FIG. 16A, biasing conditions are applied to the resistive change memory cells 200-1, 200-2, and 200-3 to simultaneously perform (or perform within a predetermined time each other) a set operation for the resistive change memory cell 200-1 and a reset operation for the resistive change memory cell 200-2 while not programming the resistive change memory cell 200-3. A logic-high signal is applied to the word line WL0 to turn on the pass gates 208 in the row corresponding to the word line WL0 and thereby couple the resistive memory elements 210 in the row to the corresponding bit lines. Logic-low signals are applied to the other word lines WL1, WL2, etc. to decouple the resistive memory elements in these rows from the corresponding bit lines. A logic-high column-select signal CS0 is applied to the transistors 306 to couple the bit lines BL0A, BL1A, and BL2A to respective read/write circuits 302-1, 302-2, and 302-3, while a logic-low column-select signal CS1 is applied to the transistors 308 to decouple the bit lines BL0B, BL1B, and BL2B from the respective read/write circuits 302-1, 302-2, and 302-3. The read-write circuit 302-1 provides a voltage of ($V_{SET}+V_{RESET}$) to the bit line BL0A. Simultaneously (or within a predetermined time of each other), the read-write circuit 302-2 provides a voltage of 0V to the bit line BL1A and the read-write circuit 302-3 provides a voltage of $V_{RESET}$ to the bit line BL2A. A logic-low complementary write-enable signal /EN_WR is applied to the gate of the pull-up transistor 312, thus turning on the pull-up transistor 312 and providing a voltage of $V_{RESET}$ to the source line SL. The voltage applied to each of the resistive change memory cells 200-1, 200-2, and 200-3 is the difference between the respective bit line voltage and the source line SL voltage. The voltage applied to resistive change memory cell 200-1 is ($V_{SET}+V_{RESET}$)−$V_{RESET}$=$V_{SET}$, so that a set operation is performed on resistive change memory cell 200-1. The voltage applied to resistive change memory cell 200-2 is 0−$V_{RESET}$=−$V_{RESET}$, so that a reset operation is performed on resistive change memory cell 200-2. The voltage applied to resistive change memory cell 200-3 is $V_{RESET}$−$V_{RESET}$=0V, so that neither a set nor a reset operation is performed on resistive change memory cell 200-2; as a result, resistive change memory cell 200-2 remains in its previous state. As discussed above, the voltage applied to each of the resistive change memory cells 200-1, 200-2, and 200-3 is removed after a duration appropriate for the programming operation.

FIG. 16A thus illustrates how to perform set and reset operations for resistive change memory cells 200 in the array 300. FIG. 16B illustrates biasing conditions for simultaneously restoring (or restoring within a predetermined time of each other) multiple resistive change memory cells 200 in a row in the array 300 in accordance with some embodiments. Specifically, FIG. 16B illustrates a restore operation for the resistive change memory cells 200 in the row corresponding to word line WL0, which are accessed in response to column-select signal CS0. In some embodiments, these resistive change memory cells 200, which include the resistive change memory cells 200-1, 200-2, and 200-3, correspond to a page or other logical unit of data.

In the example of FIG. 16B, a logic-high signal is applied to the word line WL0 and logic-low signals are applied to the other word lines WL1, WL2, etc., thus enabling access to resistive change memory cells in the row corresponding to word line WL0 but not to resistive change memory cells in the other rows. A logic-high column-select signal CS0 is applied to the transistors 306 and a logic-low column-select signal CS1 is applied to the transistors 308, thereby coupling the resistive change memory cells to be restored to the pull-down transistors 304 via corresponding bit lines BL0A, BL1A, BL2A, etc. A logic-high restore-enable signal EN_RE is applied to the gates of the transistors 304, thus grounding the bit lines BL0A, BL1A, BL2A, etc. A logic-low complementary restore-enable signal /EN_RE is applied to the gate of the transistor 314, thereby providing $V_{RESTORE}$ to the source line SL. The voltage across the resistive change memory cells to be restored is the difference between the bit line and source line SL voltages, which equals −$V_{RESTORE}$, the voltage corresponding to the restore operation. The restore voltage applied to the resistive change memory cells 200-1, 200-2, and 200-3 is removed after a duration appropriate for the restore operation.

FIG. 16B shows a restore operation performed on half of the resistive change memory cells 200 in a single row. In some embodiments, every resistive change memory cell 200 in a row is restored by concurrently applying logic-high column-select signals CS0 and CS1 to the gates of the transistors 306 and 308, and otherwise biasing the array 300 as shown in FIG. 16B.

Figure 16C:
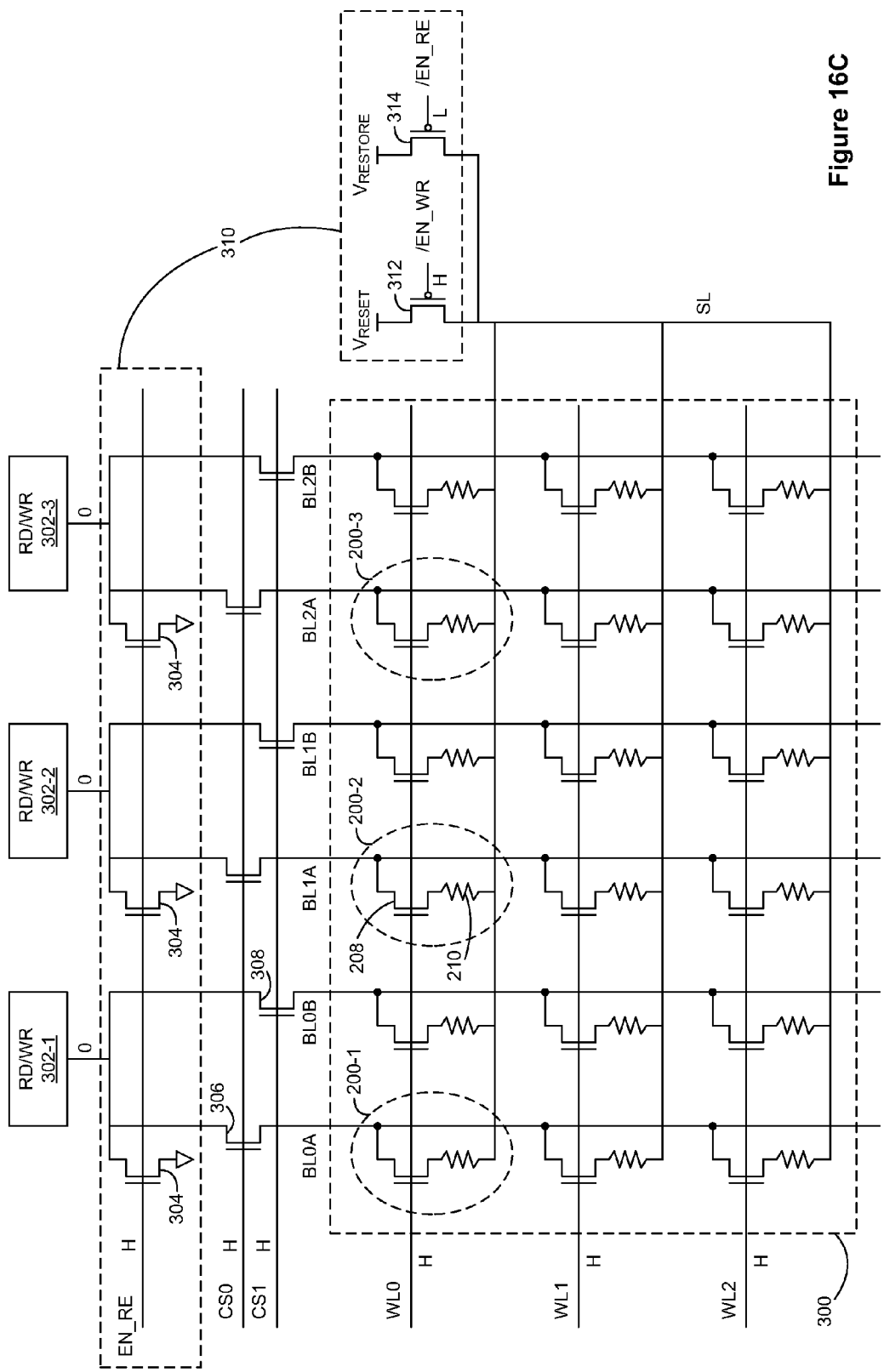

FIG. 16C illustrates biasing conditions for simultaneously restoring (or restoring within a predetermined time of each other) every resistive change memory cell 200 in the array 300 in accordance with some embodiments. Logic-high column-select signals CS0 and CS1 are concurrently applied to the gates of the transistors 306 and 308, turning on both transistors 306 and 308. Logic-high signals are simultaneously applied (or applied within a predetermined time of each other) to every word line WL0, WL1, WL2, etc., to couple every resistive change memory cell 200 to its corresponding bit line. The array 300 is otherwise biased as shown in FIG. 16B. As a result, −$V_{RESTORE}$ is applied to every resistive change memory cell 200 in the array 300 simultaneously (or within a predetermined time of each other), thus restoring every resistive change memory cell 200 in parallel. In some implementations, the logic-high signals are simultaneously applied (or applied within a predetermined time of each other) to a subset of the word lines WL0, WL1, WL2, etc., to couple resistive change memory cells 200 in the subset of word lines to their corresponding bit lines. The restore voltage applied to the resistive change memory cells in the array 300 is removed after a duration appropriate for the restore operation.

Figure 16D:
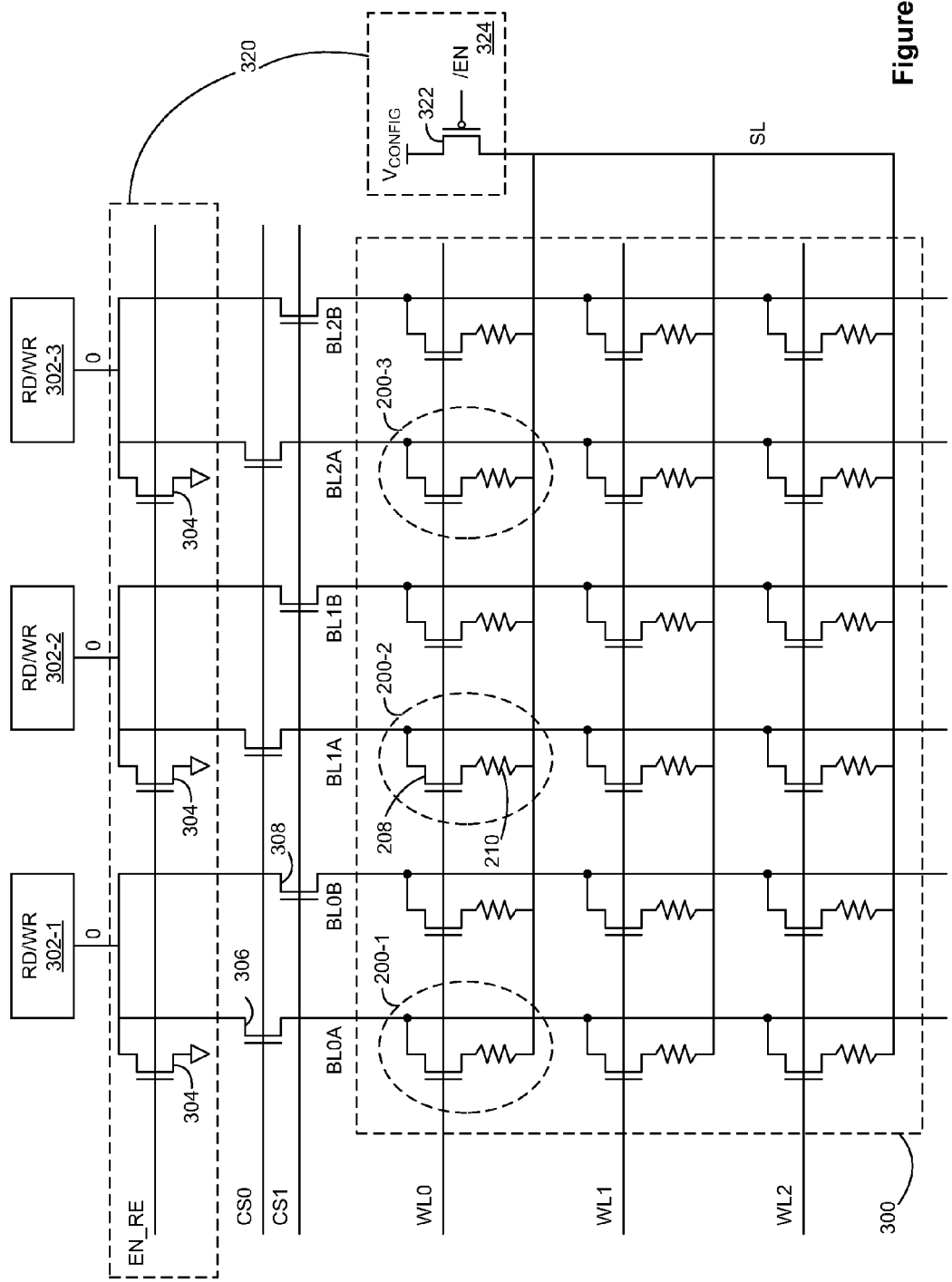

The examples of FIGS. 16A-16C include a first power supply to supply a first voltage $V_{RESET}$ when programming operations (e.g., set and reset operations) are performed on the resistive change memory cells 200 and a second power supply to supply a second voltage $V_{RESTORE}$ for when performing a restore operation on the resistive change memory cells 200. In some embodiments, however, a single configurable power supply supplies both voltages. FIG. 16D illustrates an array 300 in which the source line SL is coupled to a configurable power supply 324 via a pull-up transistor 322 (e.g., a p-type MOSFET) controlled by a complementary enable signal /EN. The complementary enable signal /EN is asserted both for programming and restore operations, to couple the source line SL to the configurable power supply 324, which supplies a voltage $V_{CONFIG}$ during these operations. The configurable power supply 324 is configurable to provide voltage $V_{RESET}$ during programming operations (e.g., set and reset operations) and voltage $V_{RESTORE}$ during restore operations. The pull-down transistors 304, pull-up transistor 322, and configurable power supply 324 together constitute control circuitry 320 (e.g., control circuitry 2510, FIG. 18).

Figure 16E:
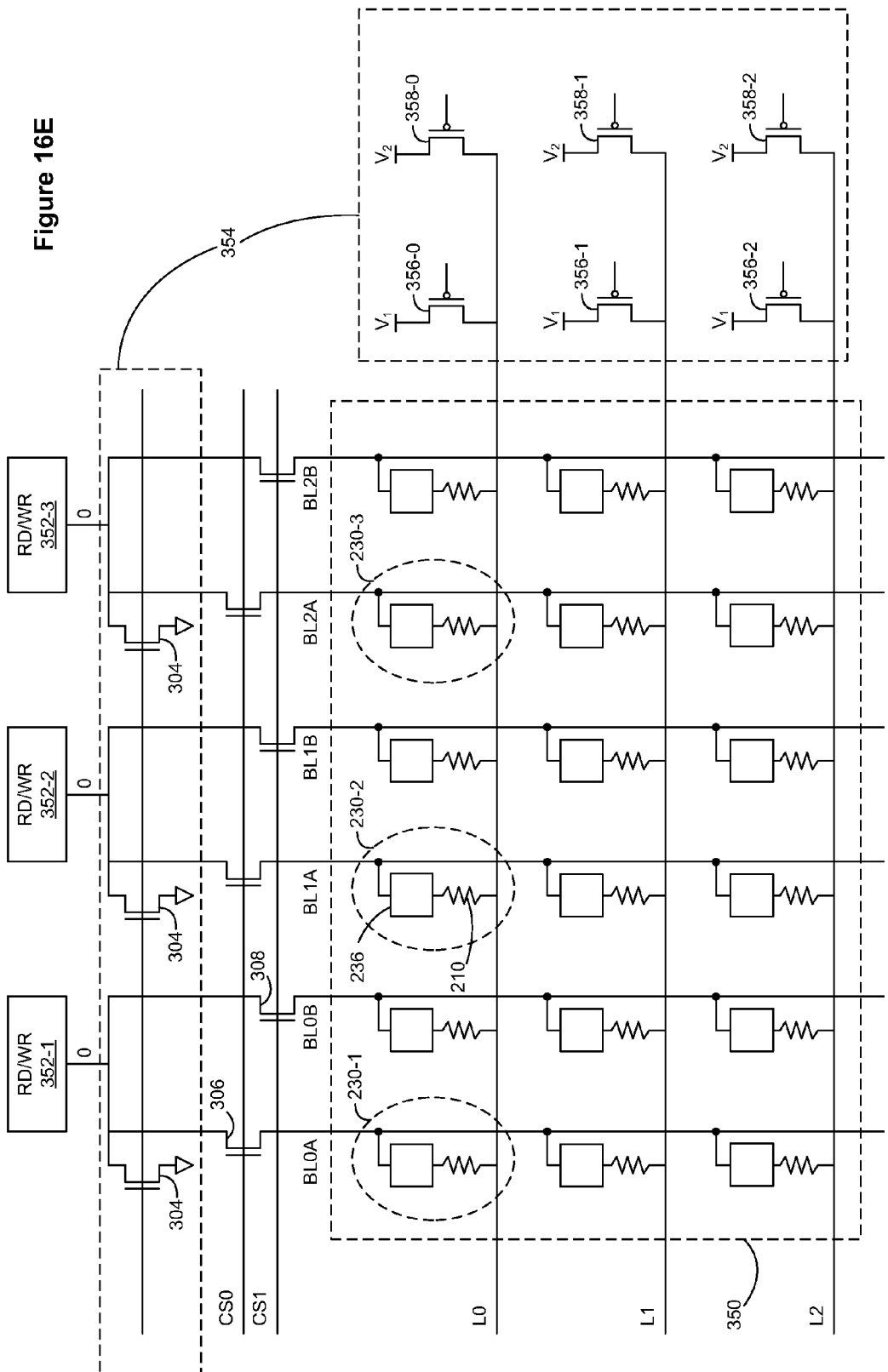

FIG. 16A-16D show an array 300 of three-terminal resistive change memory cells 200. Restore operations also may be performed on two-terminal resistive change memory cells, such as resistive change memory cells 230 (FIG. 2C) or 240 (FIG. 2D). FIG. 16E shows an array 350 of two-terminal resistive change memory cells 230 in accordance with some embodiments. While the array 350 is made up of resistive change memory cells 230, it alternatively could be made up of resistive change memory cells 240 (FIG. 2D). Conductive lines L0, L1, L2, etc. extend across respective rows of resistive change memory cells 230. The conductive lines L0, L1, L2, etc. are distinct from the bit lines, although the bit lines may also be referred to as conductive lines. Each conductive line L0, L1, L2, etc. connects to the resistive memory elements 210 of the resistive change memory cells 230 in its row (e.g., via nodes 234, FIG. 2C). Each conductive line L0, L1, L2, etc. may be coupled to a first power supply supplying a first voltage $V_1$ via a first pull-up transistor 356 and to a second power supply supplying a second voltage $V_2$ via a second pull-up transistor 358. Note that conductive lines L0, L1, L2, etc., may be referred to as word lines.

To perform a reset operation for the resistive change memory cell 230-1, transistors 306 and 356-0 are turned on. The read/write circuit 352-1 (or alternatively, the respective pull-down transistor 304) grounds the bit line BL0A and the first power supply supplies the first voltage $V_1$ corresponding to the reset operation (e.g., $V_{RESET}+V_{TH}$) to the conductive line L0. The first voltage $V_1$ applied to the resistive change memory cell 230-1 is removed after a predetermined duration appropriate for the reset operation.

To perform a restore operation for the resistive change memory cell 230-1, the transistors 306 and 358-0 are turned on. The respective pull-down transistor 304 (or alternatively, the read/write circuit 352-1) grounds the bit line BL0A and the second power supply supplies the second voltage $V_2$ corresponding to the restore operation (e.g., $V_{RESTORE}+V_{TH}$) to the conductive line L0. The second voltage $V_2$ applied to the resistive change memory cell 230-1 is removed after a duration appropriate for the restore operation.

Restore operations may be performed in parallel for multiple resistive change memory cells 230 in one or more rows (e.g., every other resistive change memory cell in a row, every resistive change memory cell in a row, or every resistive change memory cell in the array 350) through appropriate biasing of the conductive lines and bit lines, by analogy to the three-terminal examples of FIGS. 16B-16C. Similarly, reset operations may be performed in parallel for multiple resistive change memory cells 230 in one or more rows.

To perform a set operation for resistive change memory cell 230-1, the transistor 306 is turned on, the write/read circuit 352-1 provides a voltage corresponding to the set operation (e.g., $V_{SET}+V_{TH}$) to the bit line BL0A, and the conductive line L0 is grounded (e.g., using a pull-down transistor, not shown). The voltage corresponding to the set operation applied to the resistive change memory cell 230-1 is removed after a duration appropriate for the set operation.

In some embodiments, the first power supply and the second power supply are replaced with a single configurable power supply that is configurable to supply the first voltage $V_1$ and the second voltage $V_2$, during reset and restore operations, respectively, by analogy to the configurable power supply 324 supplying the voltage $V_{CONFIG}$ of FIG. 16D. For example, the single configurable power supply is configurable to supply 0V, the first voltage $V_1$, and the second voltage $V_2$, during set, reset, and restore operations, respectively.

In some embodiments, resistive change memory cells to be restored (e.g., in accordance with the examples of FIGS. 16A-16E) are reset before being restored, to avoid high currents on the corresponding bit lines and source lines or word lines during the restore operation.

FIG. 16A-16D illustrate reset and restore operations performed by applying specified voltages (e.g., $V_{RESET}$ and $V_{RESTORE}$) to resistive change memory cells for a predetermined duration. For example, the voltage applied during a restore operation (e.g., $V_{RESTORE}$) is greater than the voltage applied during a reset operation (e.g., $V_{RESET}$) and/or is applied for a longer duration than the voltage that is applied during a reset operation. Alternatively, reset and restore operations are performed by applying specified currents to resistive change memory cells for a predetermined duration. For example, the restore current is greater than the reset current and/or is applied for a longer duration than the reset current. As discussed above, in some implementations, the voltage used during the reset operation (e.g., $V_{RESET}$) is the same voltage as the voltage used during the restore operation (e.g., $V_{RESTORE}$). In these implementations, the voltage used during the restore operation (e.g., $V_{RESTORE}=V_{RESET}$) is applied for a longer duration than the voltage used during the reset operation is applied.

Figure 17A:
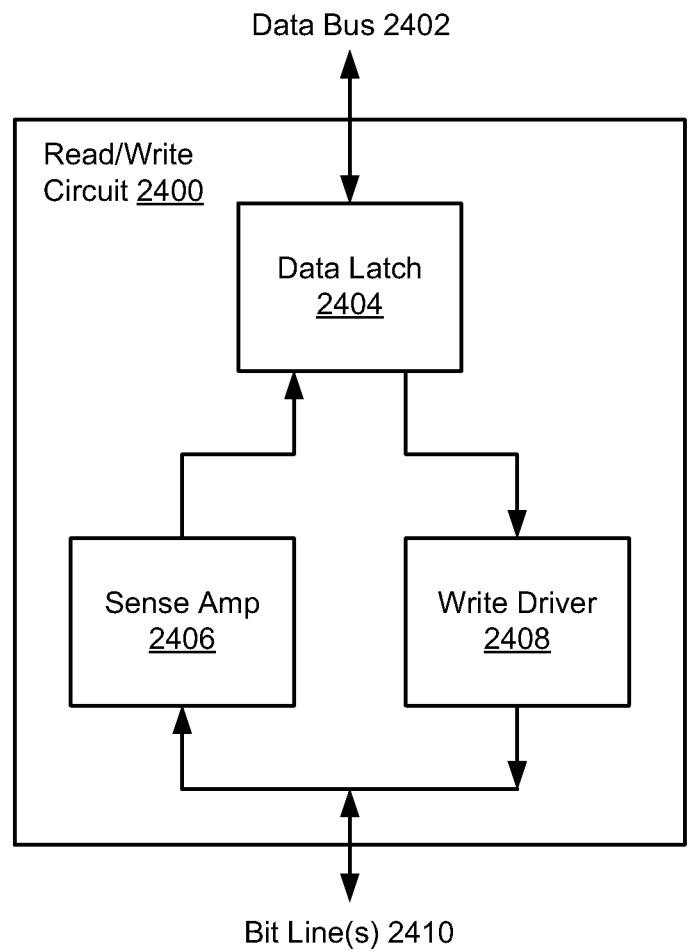
FIG. 17A is a block diagram illustrating a read/write circuit in accordance with some embodiments.

FIG. 17A is a block diagram illustrating a read/write circuit 2400 in accordance with some embodiments. The read/write circuit 2400 is an example of a read/write circuit 302 (FIG. 16A-16D) or 352 (FIG. 16E). One or more bit lines 2410 are coupled to a sense amplifier 2406 and a write driver 2408. In one example, read/write circuit 2400 corresponds to the read/write circuit 302-1 (FIGS. 16A-16D) and the one or more bit lines 2410 correspond to the bit lines BL0A and BL0B (FIGS. 16A-16D). In read/write circuit 2400, sense amplifier 2406 is arranged in parallel with write driver 2408, both of which are coupled to a data latch 2404. The sense amplifier 2406 and write driver 2408 thus are both coupled between the bit line(s) 2410 and the data latch 2404.

Figure 17B:
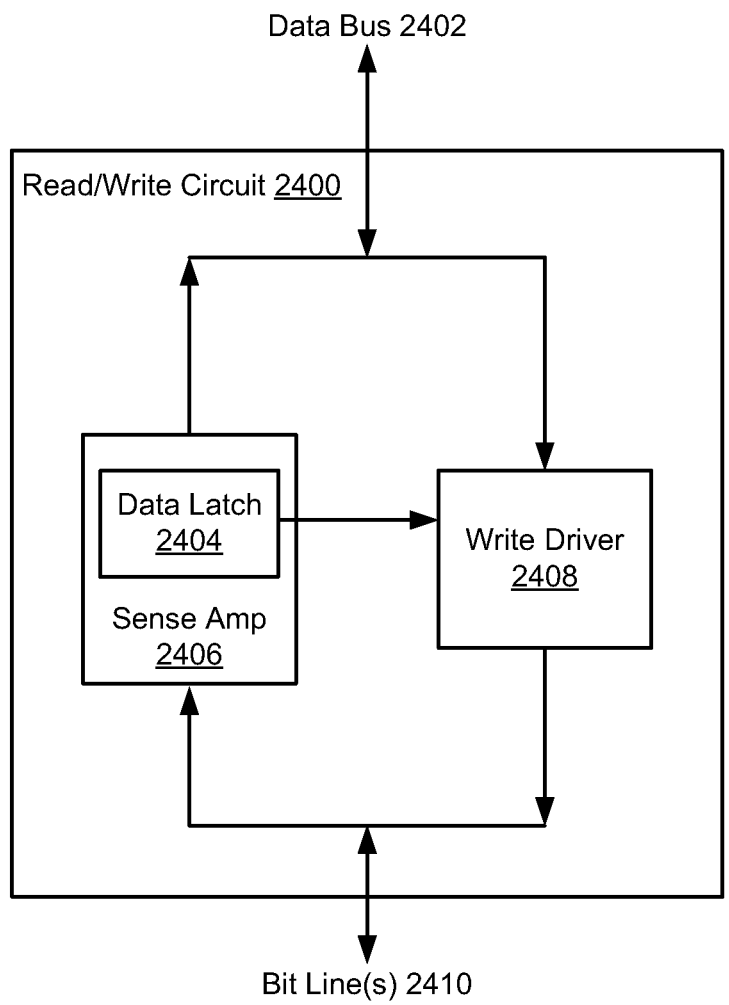
FIG. 17B is a block diagram illustrating an alternative implementation of read/write circuit in accordance with some embodiments.

FIG. 17B is a block diagram illustrating an alternative implementation of read/write circuit 2400 in accordance with some embodiments. As illustrated in FIG. 17B, sense amp 2406 includes data latch 2404. Furthermore, sense amp 2406 and write driver 2408 are coupled in parallel with each other between the data bus 2402 and bit line(s) 2410.

The following discussion refers to either of the read/write circuits 2400 illustrated in FIGS. 17A and 17B. The sense amplifier 2406 determines values of data read from resistive change memory cells connected to the bit line(s) 2410 and provides the determined values to the data latch 2404. Data latch 2404 stores the values of the data and forwards the values onto a data bus 2402. Data bus 2402 is coupled, for example, to an interface (e.g., interface 2506, FIG. 18) to transmit the data to a separate device (e.g., to a memory controller that requested the data.) Data bus 2402 also provides data to data latch 2404 (e.g., data provided by a memory controller for storage in the resistive change memory device). Data latch 2404 stores the data and forwards the data to write driver 2408, which drives the data onto bit line(s) 2410 by supplying to the bit line(s) 2410 the appropriate voltages for set or reset operations, depending on the value(s) of the data. Write driver 2408 thus is used to program resistive change memory cells connected to the bit line(s) 2410. Examples of this programming are described above with respect to FIGS. 16A and 16E. Data latch 2404 also provides data to write driver 2408 during a refresh operation or a restore operation, as described in more detail below.

In some embodiments, restore operations are performed on resistive change memory cells in a single row, as described with regard to FIGS. 16B and 16E. In some of these embodiments, the data from the resistive change memory cells is stored in data latches 2404 before the restore operation and then written back to the resistive change memory cells after the restore operation, thus allowing the data to be retained. Before the restore operation, sense amplifiers 2406 read the data from the resistive change memory cells and provide the data to the data latches 2404. After the restore operation, the data latches 2404 provide the data to the write drivers 2408, which program the data back into the resistive change memory cells. Alternatively, the data is stored in a buffer in the resistive change memory device (e.g., the buffer 2505, FIG. 18) or in an external device during the restore operation.

Figure 18:
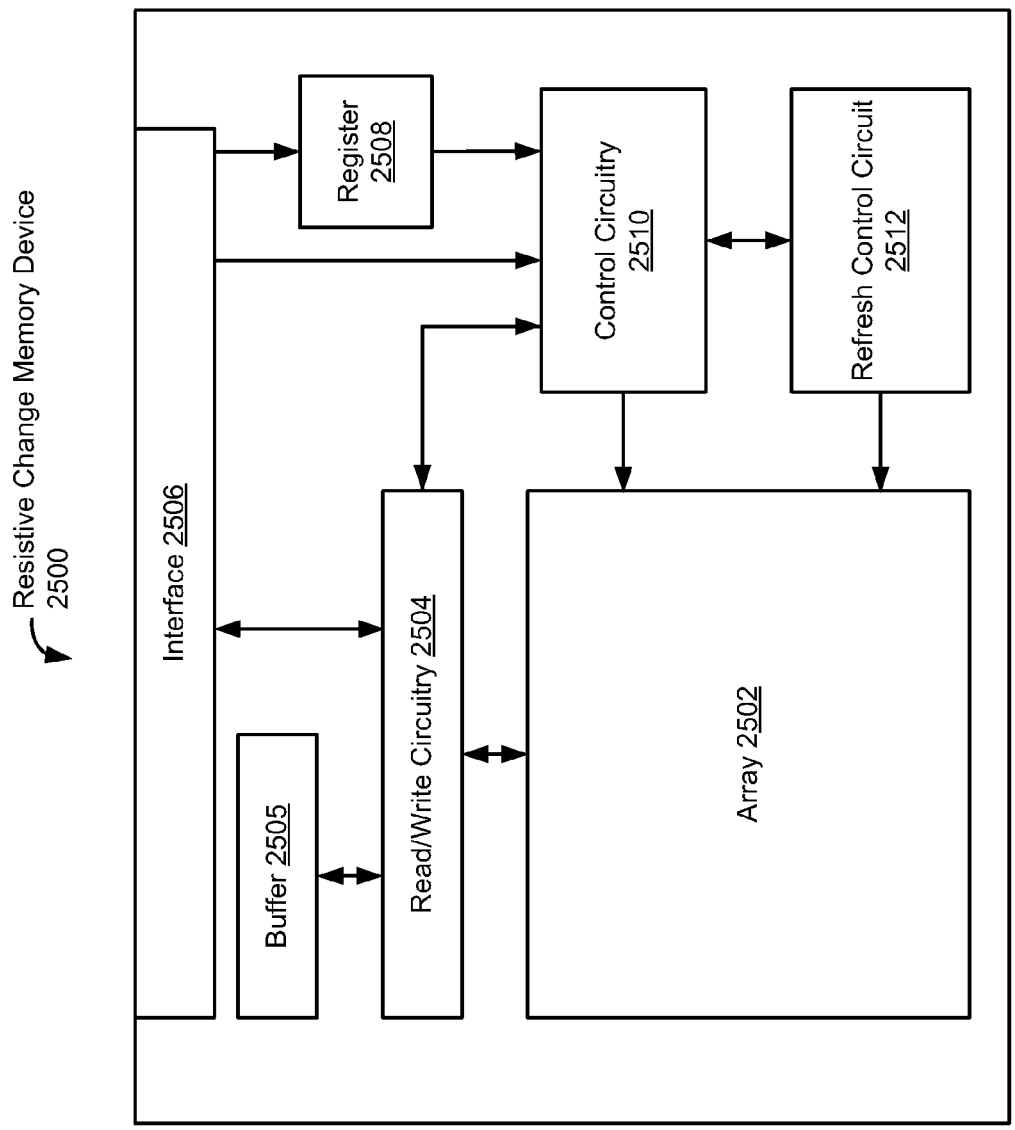
FIG. 18 is a block diagram of a resistive change memory device in accordance with some embodiments.

FIG. 18 is a block diagram of a resistive change memory device 2500 in accordance with some embodiments. FIG. 18 is not intended to be a complete schematic diagram of memory device 2500 but instead illustrates components of memory device 2500 corresponding to disclosed embodiments. Memory device 2500 includes an array 2502 (e.g., array 300, FIG. 16A-16D, or array 350, FIG. 16E) of resistive change memory cells (e.g., resistive change memory cells 200, 220, 230, or 240, FIGS. 2A-2D). Coupled to array 2502 are read/write circuitry 2504, which includes a plurality of read/write circuits 2400 (e.g., the read/write circuits shown in either FIG. 17A or FIG. 17B, read/write circuits 302, FIG. 16A-16D, or read/write circuits 352, FIG. 16E), and control circuitry 2510 (e.g., control circuitry 310, FIGS. 16A-16C, 320, FIG. 16D, or 354, FIG. 16E). The read/write circuitry 2504 is coupled to an interface 2506 (e.g., via a data bus 2402, FIGS. 17A and 17B) of memory device 2500, as described with reference to FIGS. 17A and 17B.

In some embodiments, memory device 2500 includes a buffer 2505 to store data from resistive change memory cells being restored. Prior to a restore operation, data from the resistive change memory cells to be restored is read by read/write circuitry 2504 and provided to buffer 2505 for storage. After the restore operation, buffer 2505 provides the data to the read/write circuitry 2504, which writes the data back into the restored resistive change memory cells. In some embodiments, buffer 2505 is used to store data from resistive change memory cells in multiple rows that are being restored in parallel. In some embodiments, when restoring resistive change memory cells in a single row, the data is stored in buffer 2505 or alternatively in data latches 2404 (e.g., FIGS. 17A and 17B).

In some embodiments, the resistive change memory cells in array 2502 have limited data retention times and thus are volatile. In other embodiments, the resistive change memory cells are nonvolatile. In embodiments with volatile resistive change memory cells, memory device 2500 includes a refresh control circuit 2512 to periodically refresh the data in the resistive change memory cells. These periodic refresh operations are referred to as refresh cycles. Refresh control circuit 2512 is coupled to control circuitry 2510 to instruct control circuitry 2510 to perform restore operations during the refresh cycles, as described below for the method 2650 (FIG. 19C), for example.

In some embodiments, interface 2506 is configured to receive commands to perform restore operations. The commands are received, for example, from an external device (e.g., a memory controller). In response to such a command, interface 2506 instructs control circuitry 2510 to perform a restore operation, as described below for the method 1630 (FIG. 19B), for example.

In some embodiments, memory device 2500 includes a register 2508 to store one or more settings for restore operations. For example, in some implementations, register 2508 stores a setting specifying the restore voltage $V_{RESTORE}$ to be used for the restore operations and/or a setting specifying the duration for which the restore voltage $V_{RESTORE}$ is applied during the restore operations. Alternatively, register 2508 stores a setting specifying a restore current to be used for the restore operations and/or a setting specifying the duration for which the restore current is applied during the restore operations. Register 2508 is coupled to control circuitry 2510 to apply the setting(s) to control circuitry 2510. In some embodiments, the setting(s) stored in register 2508 are set externally. For example, interface 2506 receives a command from an external device specifying one or more settings; in response, the specified setting(s) are stored in register 2508.

Figure 19A:
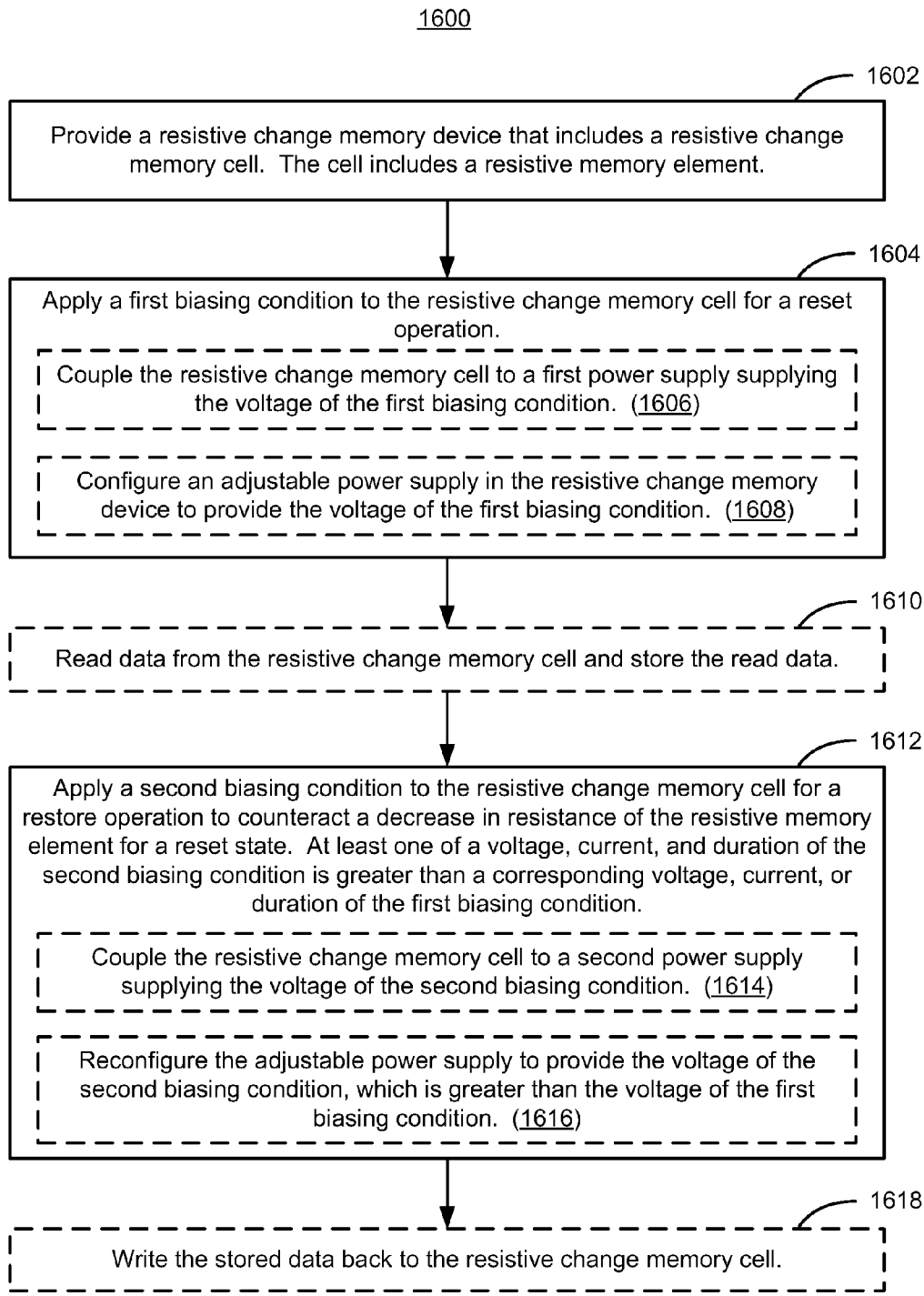
FIGS. 19A-19C are flow diagrams illustrating methods of operating a resistive change memory device in accordance with some embodiments.

FIG. 19A is a flow diagram illustrating a method 1600 of operating a resistive change memory device in accordance with some embodiments. In method 1600, a resistive change memory device (e.g., memory device 2500, FIG. 18) is provided (1602) that includes a resistive change memory cell (e.g., a resistive change memory cell 200, 220, 230, or 240, FIG. 2D). The resistive change memory cell includes a resistive memory element (e.g., an element 210, FIGS. 2A-2D).

A first biasing condition is applied (1604) to a resistive change memory cell for a reset operation. In some embodiments, the resistive change memory cell is coupled (1606) to a first power supply (e.g., the power supply providing the voltage $V_{RESET}$ in FIGS. 16A-16C) that supplies the voltage of the first biasing condition. In some embodiments, a configurable power supply (e.g., the configurable power supply 324 producing the voltage $V_{CONFIG}$ in FIG. 16D) in the resistive change memory device is configured (1608) to provide the voltage of the first biasing condition. As discussed above, in accordance with the first biasing condition, the voltage for the reset operation is applied to the resistive change memory cell for a first predetermined duration.

A second biasing condition is applied (1612) to the resistive change memory cell for a restore operation to counteract a decrease in resistance of the resistive memory element for a reset state. At least one of a voltage, current, and duration of the second biasing condition is greater than a corresponding voltage, current, or duration of the first biasing condition. In some embodiments, the resistive change memory cell is coupled (1614) to a second power supply (e.g., the power supply providing the voltage $V_{RESTORE}$ in FIGS. 16A-16C) that supplies the voltage of the second biasing condition. In some embodiments, the adjustable power supply (e.g., the configurable power supply 324 producing the voltage $V_{CONFIG}$ in FIG. 16D) is reconfigured (1616) to provide the voltage of the second biasing condition, which is greater than the voltage of the first biasing condition. As discussed above, in accordance with the second biasing condition, the voltage for the restore operation is applied to the resistive change memory cell for a second predetermined duration.

Figure 19B:
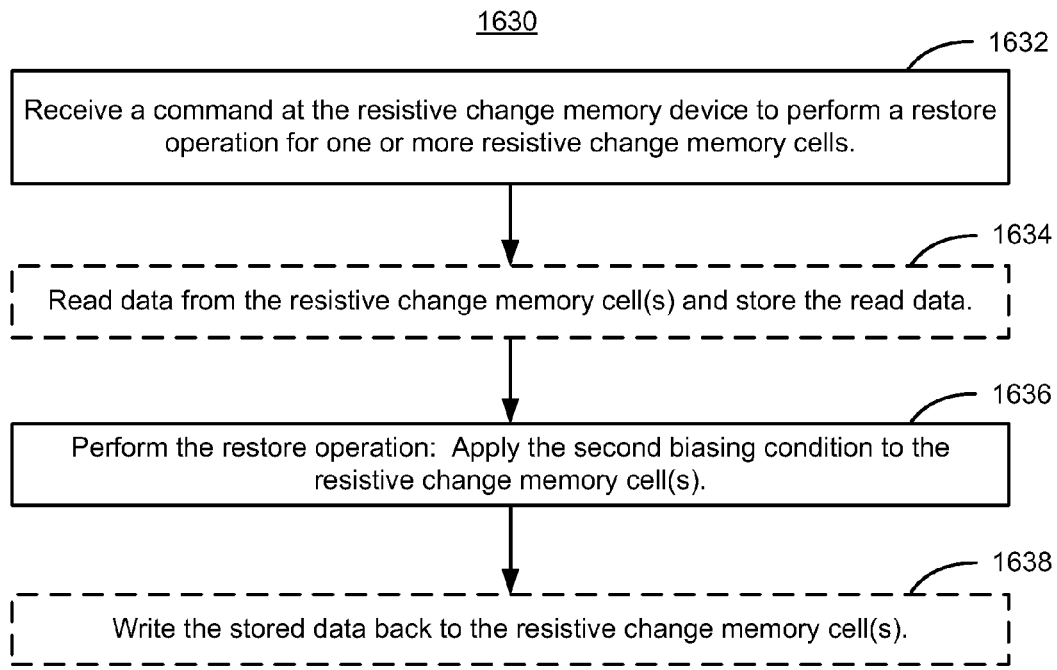
Figure 19C:
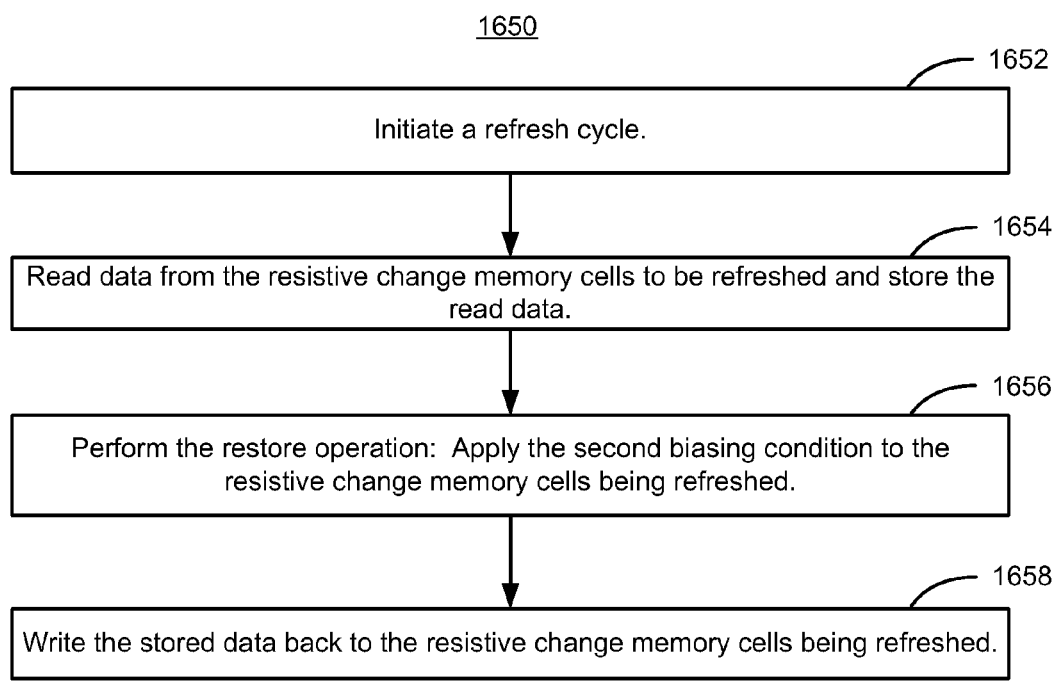

Note that the difference between the first predetermined duration and the second predetermined duration, and the magnitudes of the voltages associated with the application of the first biasing condition and the second biasing condition discussed above with reference to FIG. 16A-16D apply to the discussion of FIGS. 19A-19C.

In some embodiments, before applying (1612) the second biasing condition to the resistive change memory cell, data is read (1610) from the resistive change memory cell (e.g., using a sense amplifier 2406, FIGS. 17A and 17B) and stored (e.g., in data latch 2404, FIGS. 17A and 17B, or buffer 2505, FIG. 18). After applying (1612) the second biasing condition to the resistive change memory cell, the stored data is written (1618) back to the resistive change memory cell (e.g., using the write driver 2408, FIGS. 17A and 17B).

In some embodiments, applying (1612) the second biasing condition is performed simultaneously (or performed within a predetermined time of each other) for multiple resistive change memory cells. For example, the second biasing condition is applied in parallel to multiple resistive change memory cells in a row, to every resistive change memory cell in a row, to multiple resistive change memory cells (or every resistive change memory cell) in multiple rows, and/or to every resistive change memory cell in an array (e.g., array 300, FIGS. 16A-D, or array 350, FIG. 16E). In some embodiments, the read operation 1610 is performed on every resistive change memory cell to be restored, and the write operation 1618 is performed on every resistive change memory cell that has been restored.

Method 1600 thus helps to counteract a decrease in the reset resistance of a resistive memory element in a resistive change memory cell resulting from repeated use of the resistive change memory cell. While method 1600 includes a number of operations that appear to occur in a specific order, method 1600 can include more or fewer operations, an order of two or more operations may be changed, and/or two or more operations may be combined into a single operation.

A restore operation may be performed in response to a command (e.g., a command from an external device), as illustrated in the method 1630 of FIG. 19B in accordance with some embodiments. In method 1630, a command is received (1632) at a resistive change memory device (e.g., at interface 2506 of memory device 2500, FIG. 18) to perform a restore operation for one or more resistive change memory cells (e.g., one or more resistive change memory cells in array 300, FIG. 16A-16D, or array 350, FIG. 16E). In response to the command, the restore operation is performed (1636): the second biasing condition is applied to the one or more resistive change memory cells (e.g., in accordance with the applying operation 1612, FIG. 19A).

In some embodiments, before performing (1636) the restore operation, data is read (1634) from the one or more resistive change memory cells (e.g., using sense amplifiers 2406, FIGS. 17A and 17B) and stored (e.g., in data latches 2404, FIGS. 17A and 17B, or buffer 2505, FIG. 18). After performing (1636) the restore operation, the stored data is written (1638) back to the one or more resistive change memory cells (e.g., using write drivers 2408, FIGS. 17A and 17B).

Method 1630 thus provides a technique for controlling performance of a restore operation. While method 1630 includes a number of operations that appear to occur in a specific order, method 1630 can include more or fewer operations and/or two or more operations may be combined into a single operation.

A restore operation may be performed during a refresh cycle, as illustrated in the method 1650 of FIG. 19C in accordance with some embodiments in which the resistive change memory cells are volatile. In method 1650, a refresh cycle is initiated (1652) in a resistive change memory device (e.g., the device 2500, FIG. 18). For example, the refresh cycle is initiated under the control of refresh control circuit 2512 (FIG. 18). In response, data is read (1654) from the resistive change memory cells to be refreshed (e.g., using sense amplifiers 2406, FIGS. 17A and 17B) and stored (e.g., in data latches 2404, FIGS. 17A and 17B, or buffer 2505, FIG. 18). The restore operation is performed (1656): the second biasing condition is applied to the resistive change memory cells being refreshed (e.g., in accordance with the applying operation 1612, FIG. 19A). After performing (1656) the restore operation, the stored data is written (1658) back to the resistive change memory cells being refreshed (e.g., using write drivers 2408, FIGS. 17A and 17B).

Method 1650 thus provides another technique for controlling performance of a restore operation. While method 1650 includes a number of operations that appear to occur in a specific order, method 1650 can include more or fewer operations and/or two or more operations may be combined into a single operation.

Methods 1630 (FIG. 19B) and 1650 (FIG. 19C) illustrate examples in which restore operations are performed in response to commands or refresh operations. Other examples of conditions that, in various implementations, trigger performance of restore operations include powering on the system that includes the resistive change memory device, calibrating the system that includes the resistive change memory device, performing a specified number of programming operations, and/or passage of a specified time.

In some embodiments, performance of a restore operation is triggered based on the result of a characterization operation to identify degradation of a resistive change memory cell. For example, read currents for resistive change memory cells in a reset state are compared to a reference current to determine whether the reset resistance of one or more of the resistive change memory cells has decreased below a specified threshold. Examples of reference currents for characterization operations as well as for read operations are shown in FIGS. 20A and 20B.

Figure 20A:
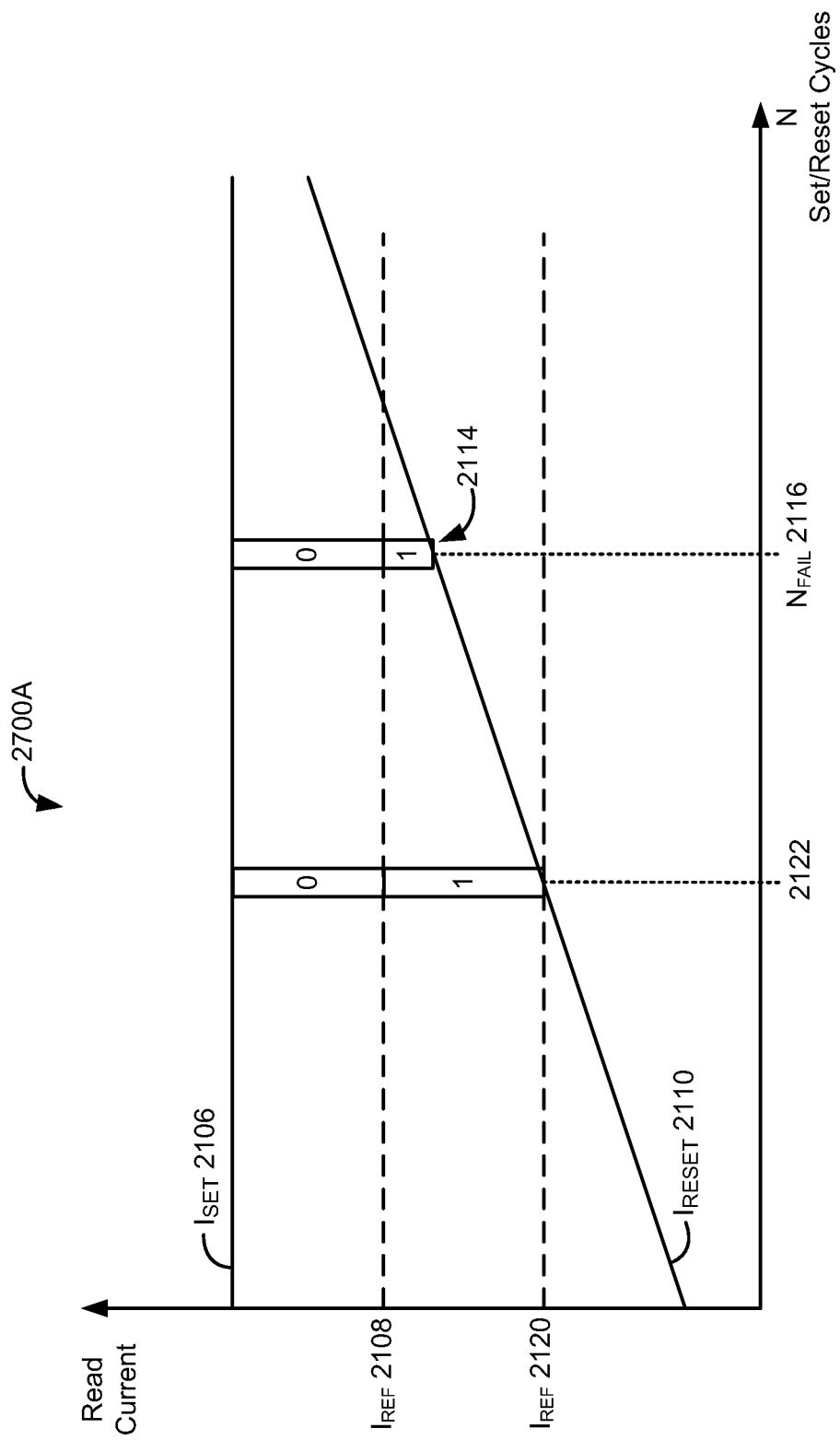
FIGS. 20A and 20B show a prophetic example of a graph of read current versus the number of set/reset cycles that have been performed for a resistive change memory cell in a resistive change memory device in accordance with some embodiments.
Figure 20B:
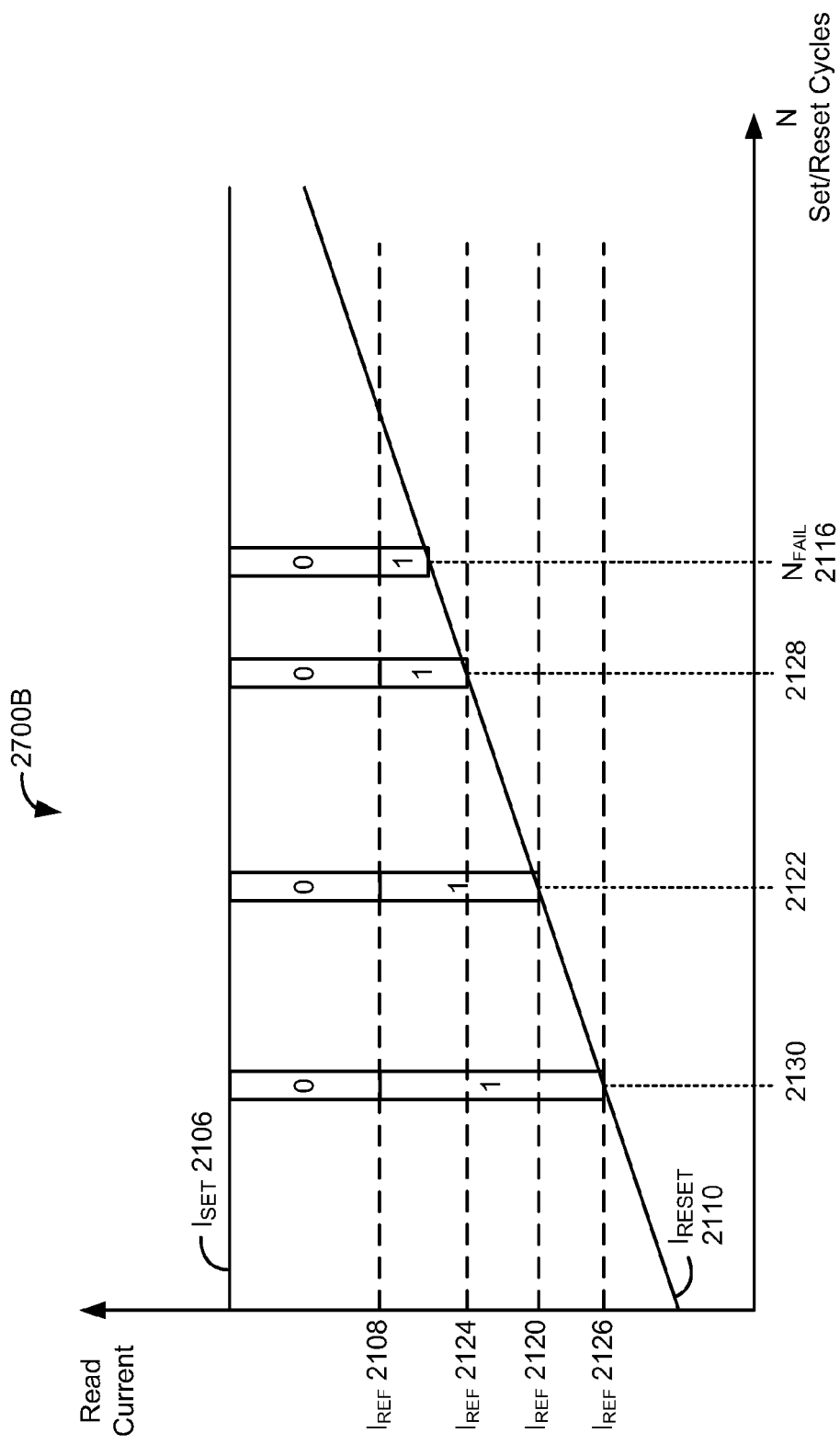

FIG. 20A shows a prophetic example of a graph 2700A of read current versus the number N of set/reset cycles that have been performed for a resistive change memory cell in a resistive change memory device in accordance with some embodiments. The graph 2700A corresponds to the graph 100 (FIG. 1) and shows reference current 2108, which is used when performing read operations. In a read operation, the read current of a resistive change memory cell is compared to the reference current $I_{REF}$ 2108. If the read current is less than the reference current $I_{REF}$ 2108, a determination is made that the resistive change memory cell is in a reset state (e.g., the resistive change memory cell stores a "1," as shown in FIG. 20A, or alternatively a "0"). If the read current is greater than the reference current $I_{REF}$ 2108, a determination is made that the resistive change memory cell is in a set state (e.g., the resistive change memory cell stores a "0," as shown in FIG. 20A, or alternatively a "1").

The graph 2700A also shows a reference current $I_{REF}$ 2120 that is less than the reference current $I_{REF}$ 2108 but greater than $I_{RESET}$ 2110 before the resistive change memory cell has been subjected to any set/reset cycles. The reference current $I_{REF}$ 2120 corresponds to a reset resistance of the resistive change memory cell after a number 2122 of set/reset cycles. At this point, the resistive change memory cell's reset resistance has decreased somewhat but is still sufficiently high that the read current in the reset state can be rapidly and reliably distinguished from the read current in the set state. The reference current $I_{REF}$ 2120 is used to perform a characterization operation:

the resistive change memory cell is reset and its read current in the reset state ($I_{RESET}$ 2110) is compared to the reference current $I_{REF}$ 2120. If $I_{RESET}$ 2110 is greater than the reference current $I_{REF}$ 2120, the reset resistance of the resistive change memory cell is determined to have decreased below a resistance threshold corresponding to the reference current $I_{REF}$ 2120 (e.g., equal to a bit line voltage divided by the reference current $I_{REF}$ 2120). A reset resistance less than the resistance threshold provides an indication that the future endurance of the memory cell is less than a threshold future endurance, and the memory cell should be subject to a restore operation.

In some embodiments, characterization operations are performed using multiple reference currents. FIG. 20B shows a prophetic example of a graph 2700B that corresponds to the graph 2700A (FIG. 20A) but includes additional reference currents beyond the reference currents $I_{REF}$ 2108 and $I_{REF}$ 2120. A reference current $I_{REF}$ 2124 corresponds to a reset resistance of the resistive change memory cell after a number 2128 of set/reset cycles and a reference current $I_{REF}$ 2126 corresponds to a reset resistance of the resistive change memory cell after a number 2130 of set/reset cycles. To perform a characterization operation, the resistive change memory cell is reset and its read current $I_{RESET}$ 2110 is compared (e.g., serially or in parallel) to each of the multiple reference currents $I_{REF}$ 2120, $I_{REF}$ 2124, and $I_{REF}$ 2126. Use of multiple reference currents $I_{REF}$ 2120, $I_{REF}$ 2124, and $I_{REF}$ 2126 in the characterization operation allows resistive change memory cells to be sorted into multiple bins based on their degrees of degradation and, hence, their future endurances.

The examples of FIGS. 20A and 20B involve decreases in a resistive change memory cell's reset resistance as the resistive change memory cell is repeatedly programmed. In other prophetic examples, a resistive change memory cell's set resistance (i.e., its resistance in a low-resistance set state) increases (or decreases) as the resistive change memory cell is subjected to set/reset cycles. In such examples, characterization operations are performed using one or more reference currents that are greater than the reference current $I_{REF}$ 2108 used for read operations. Such characterization operations identify resistive change memory cells that are still functional but have set resistances that have increased above resistance thresholds corresponding to the one or more reference currents (e.g., resistance thresholds equal to a bit line voltage divided by respective ones of the one or more reference currents). A set resistance greater than a resistance threshold provides an indication that the future endurance of the memory cell is less than a threshold future endurance, and the memory cell should be subject to a restore operation.

Figure 21:
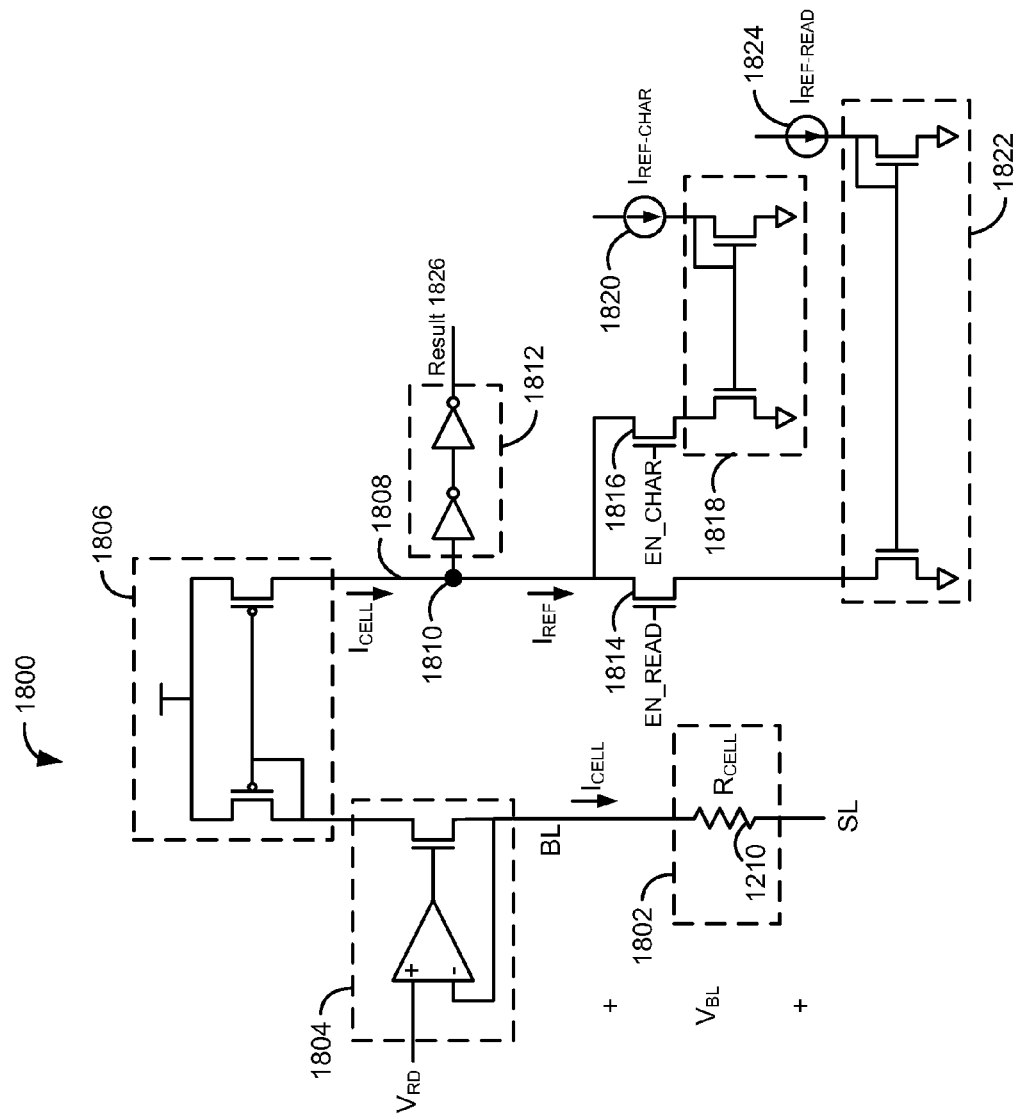
FIG. 21 is a schematic diagram illustrating a sense amplifier and associated circuitry for performing read and characterization operations in a resistive change memory device in accordance with some embodiments.

FIG. 21 illustrates circuitry 1800, including a sense amplifier and associated circuitry, for performing read and characterization operations in a resistive change memory device in accordance with some embodiments. A resistive change memory cell 1802 (e.g., the resistive change memory cell 200, 220, 230, or 240, FIGS. 2A-2D) is connected to a bit line BL (e.g., bit line BL0A, BL0B, BL1A, BL1B, BL2A, or BL2B, FIG. 16A-16D). The resistive change memory cell 1802 includes a resistive memory element 1210 with a resistance $R_{CELL}$ that varies depending on whether the resistive change memory cell 1802 is in a set or reset state. For visual simplicity, FIG. 21 shows a single resistive change memory cell 1802 coupled to the bit line BL. However, in practice, multiple resistive change memory cells are connected to a bit line in parallel, as shown, for example, in the arrays 300 (FIGS. 16A-16D) and 350 (FIG. 16E). The bit line BL is connected to a bit line voltage regulator 1804 that regulates the voltage on the bit line BL and to a first node of the resistive change memory cell 1802. The second node of the resistive change memory cell 1802 is connected to a source line SL. During read and characterization operations, the source line SL is grounded, resulting in a current $I_{CELL}$ on the bit line BL. For example, $I_{CELL}$ equals the bit line voltage $V_{BL}$ divided by $R_{CELL}$. Alternatively, during read and characterization operations, the source line SL is coupled to a predetermined voltage, resulting in a cell current $I_{CELL}$ on the bit line BL (e.g., $I_{CELL}$=the difference between the bit line voltage $V_{BL}$ and the predetermined voltage, divided by $R_{CELL}$). A current mirror 1806 mirrors $I_{CELL}$ onto a line 1808, which provides $I_{CELL}$ to a node 1810.

The circuitry 1800 also includes a reference current generator 1820 that generates a reference current $I_{REF-CHAR}$ (e.g., reference current $I_{REF}$ 2120, $I_{REF}$ 2124, or $I_{REF}$ 2126, FIG. 20B) for use during characterization operations and a reference current generator 1824 that generates a reference current $I_{REF-READ}$ (e.g., reference current $I_{REF}$ 108, FIG. 1, $I_{REF}$ 2108 FIGS. 20A-20B) for use during read operations. For a specified supply voltage, the reference current generators 1820 and 1824 generate distinct reference currents. In some implementations, a mode control circuit 11006 (FIG. 23A) generates read-enable signal EN_READ during read operations. During a read operation, the read-enable signal EN_READ turns on a transistor 1814, which provides read reference current $I_{REF-READ}$ to the line 1808 via a current mirror 1822. If $I_{CELL}$ is greater than $I_{REF-READ}$, which occurs when the resistive change memory cell 1802 is in a set state, the node 1810 charges and a pair of inverters 1812 connected to the node 1810 outputs a result signal 1826 of "1" (i.e., logic-high). If $I_{CELL}$ is less than $I_{REF-READ}$, which occurs when the resistive change memory cell 1802 is in a reset state, the node 1810 discharges and the pair of inverters 1812 connected to the node 1810 outputs a result signal 1826 of "0" (i.e., logic-low). In embodiments in which the set state corresponds to a stored value of "0" in the resistive change memory cell 1802 and the reset state corresponds to a stored value of "1," the result signal 1826 in the read operation gives the complement of the stored value. In embodiments in which the set state corresponds to a stored value of "1" in the resistive change memory cell 1802 and the reset state corresponds to a stored value of "0," the result signal 1826 in the read operation gives the stored value.

In some implementations, mode control circuit 11006 (FIG. 23A) generates characterization-enable signal EN_CHAR during characterization operations. During a characterization operation, the characterization-enable signal EN_CHAR turns on a transistor 1816, which provides characterization reference current $I_{REF-CHAR}$ to the line 1808 via a current mirror 1818. If $I_{CELL}$ is greater than $I_{REF-CHAR}$, the node 1810 charges and the pair of inverters 1812 connected to the node 1810 outputs a result signal 1826 of "1." If $I_{CELL}$ is less than $I_{REF-CHAR}$, the node 1810 discharges and the pair of inverters 1812 connected to the node 1810 outputs a result signal 1826 of "0." For a characterization operation performed to determine whether the reset resistance of the resistive change memory cell 1802 has decreased below the threshold corresponding to $I_{REF-CHAR}$, a value of "1" for the result signal 1826 indicates that the reset resistance indeed has decreased below the threshold, while a value of "0" for the result signal 1826 indicates that the reset resistance has not decreased below the threshold. A "1" in this context thus is considered to be a failing result with respect to the threshold. For a characterization operation performed to determine whether the set resistance of the resistive change memory cell 1802 has increased above the threshold corresponding to $I_{REF-CHAR}$, a value of "0" for the result signal 1826 indicates that the set resistance has increased above the threshold, while a value of "1" for the result signal 1826 indicates that the set resistance has not increased above the threshold. A "0" in this context thus is considered to be a failing result with respect to the threshold.

The inverter pair 1812, current mirror 1806, and line 1808 together constitute a sense amplifier used to both read and characterize resistive change memory cells, as described. This sense amplifier is an example of sense amplifier 2406 (FIGS. 17A and 17B). Note that the sense amplifier illustrated in FIGS. 17A and 17B is simplified for the sake of clarity. For example, in some implementations, the sense amplifier includes precharge and/or enable circuitry. Also note that the sense amplifiers illustrated in FIGS. 17A and 17B are simply examples. Other types of sense amplifiers may be used. In some embodiments, transistor 1816, current mirror 1818, and reference current generator 1820 are not present (or not used). In these embodiments, the current $I_{REF-READ}$ is set to the appropriate value for a particular characterization operation.

Figure 22:
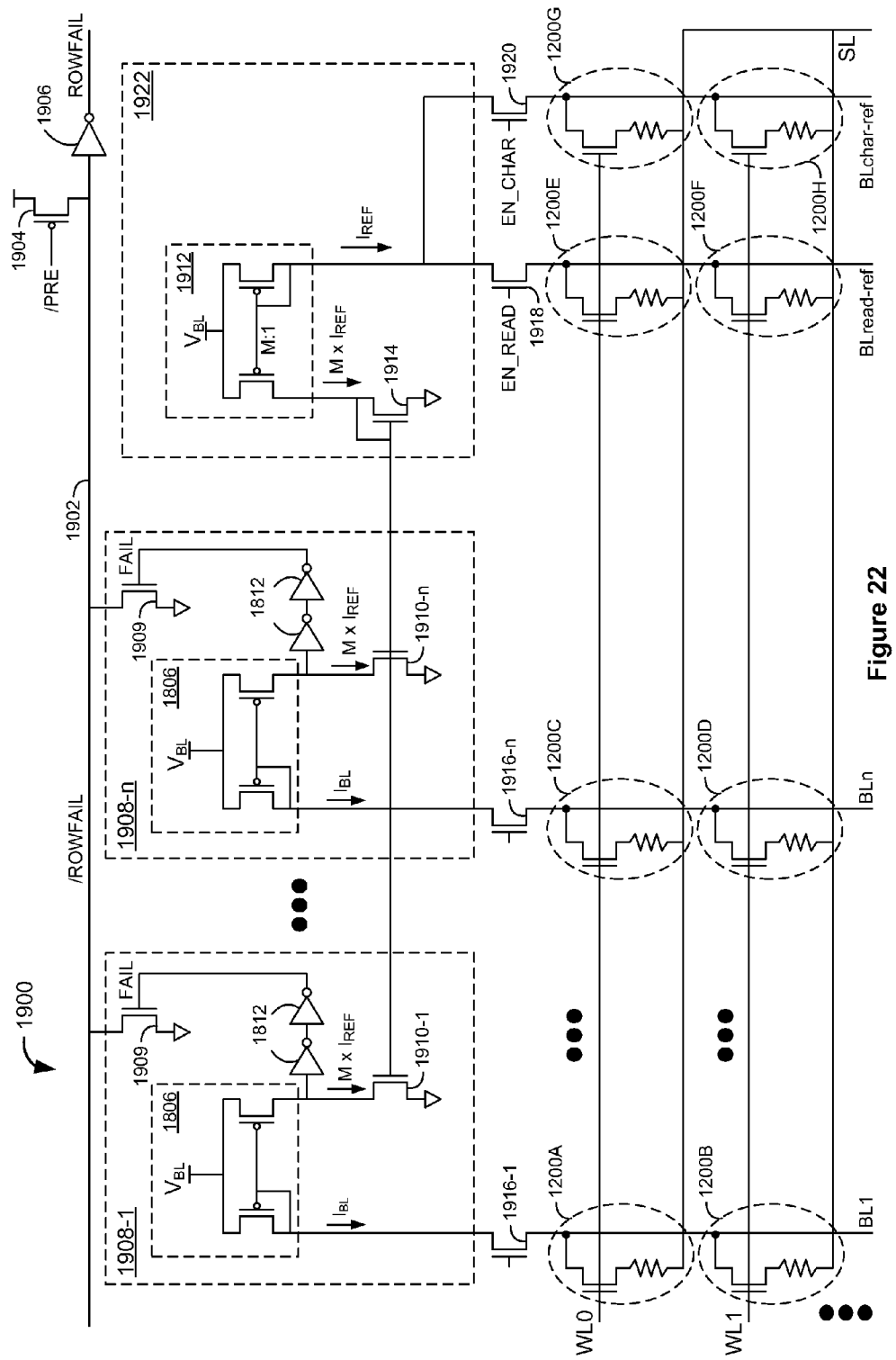
FIG. 22 is a schematic diagram illustrating resistive change memory cells, sense amplifiers, and reference cells for generating reference currents in accordance with some embodiments.

In some embodiments, reference currents (e.g., $I_{REF-READ}$ and $I_{REF-CHAR}$) are generated using reference resistive change memory cells. For example, FIG. 22 illustrates an array of resistive change memory cells 200 (FIG. 2A) in a resistive change memory device 1900 that includes both resistive change memory cells for storing data and reference resistive change memory cells for generating reference currents. In FIG. 22, rows of resistive change memory cells correspond to respective word lines WL0, WL1, etc. Each row of resistive change memory cells includes n resistive change memory cells (where n is an integer greater than 1) that are accessible for write and read operations, and thus are used to store data, as well as a first reference resistive change memory cell to generate read reference current $I_{REF-READ}$ and a second reference resistive change memory cell to generate characterization reference current $I_{REF-CHAR}$. In the example shown in FIG. 22, the row corresponding to word line WL0 includes resistive change memory cells 1200A and 1200C for storing data, reference resistive change memory cell 1200E for generating $I_{REF-READ}$, and reference resistive change memory cell 1200G for generating $I_{REF-CHAR}$. Likewise, the row corresponding to word line WL1 includes resistive change memory cells 1200B and 1200D for storing data, reference resistive change memory cell 1200F for generating $I_{REF-READ}$, and reference resistive change memory cell 1200H for generating $I_{REF-CHAR}$. While FIG. 22 illustrates an array of resistive change memory cells 1200, in other embodiments resistive change memory cells 220, 230, or 240 (FIGS. 2B-2D) are used.

Each column of resistive change memory cells for storing data is coupled, via a bit line and column-select transistor, to a sense amplifier 1908 used during read operations to determine values stored in respective resistive change memory cells. For example, the resistive change memory cells 1200A and 1200B along the column corresponding to bit line BL1 are coupled to sense amplifier 1908-1 via bit line BL1 and column-select transistor 1916-1. Likewise, the resistive change memory cells 1200C and 1200D along the column corresponding to bit line BLn are coupled to sense amplifier 1908-n via bit line BLn and column-select transistor 1916-n. The column-select transistors 1916-1 through 1916-n correspond to transistors 306 or 308 (FIGS. 16A-16D). To perform a read or characterization operation, a logic-high signal is applied to the word-line (e.g., WL0 or WL1) of the row being read or characterized and column-select transistors 1916 corresponding to the columns being read or characterized are turned on, thereby coupling the resistive change memory cells 1200 being read or characterized to corresponding sense amplifiers 1908. For example, every column-select transistor 1916-1 through 1916-n is turned on to connect every resistive change memory cell that stores data in a specified row to a corresponding sense amplifier 1908-1 through 1908-n. Each sense amplifier 1908 compares the bit line current $I_{BL}$ to a reference current and the inverter pair 1812 produces a signal indicating a result of the read or characterization operation for a given column, as described for FIG. 21.

In embodiments depicted by FIG. 22, the reference currents used by sense amplifiers 1908-1 through 1908-n are generated using reference resistive change memory cells and current mirrors. Bit line $BL_{read-ref}$ is connected to reference resistive change memory cells 1200E, 1200F used to generate $I_{REF-READ}$ and bit line $BL_{char-ref}$ is connected to reference resistive change memory cells 1200G, 1200H used to generate $I_{REF-CHAR}$. During a read operation, a logic-high EN_READ signal is applied to transistor 1918, a logic-high signal is applied to a respective word line (e.g., WL0 or WL1), and source line SL is grounded (e.g., connected to the circuit ground of the resistive change memory device 1900), thus coupling a respective resistive change memory cell (e.g., 1200E or 1200F) to a current mirror 1912 and causing a reference current $I_{REF}$ to flow along bit line $BL_{read-ref}$. The reference current $I_{REF}$ corresponds to the read current of the respective reference resistive change memory cell (e.g., resistive change memory cell 1200E or 1200F). Similarly, during a characterization operation, a logic-high EN_CHAR signal is applied to transistor 1920, a logic-high signal is applied to a respective word line (e.g., WL0 or WL1), and source line SL is grounded (or coupled to a predetermined voltage), thus coupling a respective resistive change memory cell (e.g., 1200G or 1200H) to the current mirror 1912 and causing a reference current $I_{REF}$ that corresponds to the read current of the respective reference resistive change memory cell (e.g., resistive change memory cell 1200G or 1200H) to flow along bit line $BL_{char-ref}$. In both operations, current mirror 1912 multiplies $I_{REF}$ by a factor M and provides the multiplied current $M \times I_{REF}$ to a transistor 1914. In some implementations, the factor M is used to adjust the multiplied current $M \times I_{REF}$ for margining. In some implementations the factor M is greater than 0. Transistor 1914 is connected to transistors 1910-1 through 1910-n in sense amplifiers 1908-1 through 1908-n in current-mirror configurations that mirror the multiplied current $M \times I_{REF}$ into sense amplifiers 1908-1 through 1908-n. The current mirror 1912 and transistor 1914 together constitute a configurable reference current generator 1922. Along with the transistors 1918 and 1920, configurable reference current generator 1922 thus multiplexes multiple reference currents into sense amplifiers 1908-1 through 1908-n. Note that although FIG. 22 illustrates a common source line that runs parallel to and is shared by multiple word lines, other configurations of the source line may be used. In some implementations, each word line has a corresponding and unique source line. In some implementations, a common source line runs parallel to and is shared by multiple bit lines. In some implementations, each bit line has a corresponding and unique source line.

Each sense amplifier 1908 compares a respective bit line current $I_{BL}$ to $M \times I_{REF}$; the inverter pairs 1812 produce result signals indicating the results of these comparisons, as described with reference to FIG. 21. The reference resistive change memory cells 1200E-H are designed with resistive memory elements 1210 configured to have read currents that, when multiplied by M, provide the desired reference currents. In some embodiments, the reference resistive change memory cells 1200E, 1200F for read operations are initially programmed to set states and the reference resistive change memory cells 1200G, 1200H for characterization operations are initially programmed to reset states. For the resistive change memory cells along bit line $BL_{read-ref}$, $M \times I_{REF}$ equals $I_{REF-READ}$ (FIG. 21). For the resistive change memory cells along bit line $BL_{char-ref}$, $M \times I_{REF}$ equals $I_{REF-CHAR}$ (FIG. 21). Use of reference resistive change memory cells to generate reference currents accounts for manufacturing process variation that affects the resistive change memory cells being read or characterized and thus results in more accurate read and characterization operations.

During a characterization operation, the output of each inverter pair 1812 is coupled to the gate of a pull-down transistor 1909 (e.g., an n-type MOSFET). For example, in some implementations a multiplexer or a pass gate (or a transmission gate) is used to couple an output of an inverter pair 1812 to the gate of a pull-down transistor 1909. Note that the circuitry used to output data to a data bus during a read operation is described below. The source of each pull-down transistor 1909 connects to a /ROWFAIL signal line 1902. A pull-up transistor 1904 precharges the signal line 1902. In a characterization operation performed to determine whether the reset resistance of one or more resistive change memory cells has decreased below the threshold corresponding to $I_{REF-CHAR}$, a FAIL signal of "1" from an inverter pair 1812 indicates that the reset resistance of a respective resistive change memory cell has decreased below the threshold. The FAIL signal of "1" turns on a respective pull-down transistor 1909, which pulls down the /ROW FAIL signal line 1902. An inverter 1906 outputs the complement of the value on the /ROWFAIL signal line 1902 and thus provides a ROWFAIL signal that equals "1" if the reset resistance of at least one resistive change memory cell in the row of resistive change memory cells being characterized has decreased below (i.e., below) the threshold, and otherwise equals "0." The ROW-FAIL signal line 1902, transistors 1904 and 1909, and inverter 1906 together constitute wired-OR detection circuitry coupled to the sense amplifiers 1908-1 through 1908-n to generate a fail signal (e.g., ROW FAIL="1") in response to a determination by any one of the sense amplifiers 1908-1 through 1908-n that the future endurance of a respective resistive change memory cell does not satisfy a specified future endurance threshold.

In a characterization operation performed to determine whether the set resistance of one or more resistive change memory cells has increased above the threshold corresponding to $I_{REF-CHAR}$, a FAIL signal of "0" from an inverter pair 1812 indicates that the set resistance of a respective resistive change memory cell has increased above the threshold. Accordingly, in some embodiments for performing such an operation, a third inverter is added in series with the inverter pair 1812.

In some embodiments, the current mirror 1806 for each sense amplifier 1908 includes multiple parallel outputs (e.g., parallel mirrored current branches) each of which is coupled to its own instance of transistor 1910 and its own instance of inverter pair 1812, which in turn are coupled its own instance of the wired-OR detection circuitry and the FAIL signal. In these embodiments, multiple characterization operations with distinct reference currents are performed simultaneously. Furthermore, these embodiments allow a characterization operation to be performed simultaneously with a read operation.

During a read operation, the output of each inverter pair 1812 is coupled to a data bus (not shown). For example, a multiplexer or a pass gate (or a transmission gate) is used to couple an output of an inverter pair 1812 to the data bus. In some embodiments, sense amplifiers 1908-1 through 1908-n are examples of sense amplifiers 2406 (FIGS. 17A and 17B), as found for example in read/write circuits 302 (FIG. 16A-16D). While write drivers are not shown in FIG. 22 for clarity, write drivers are present (e.g., are arranged in accordance with FIGS. 16A-16D, 17A and 17B). For example, write drivers 2408 (FIGS. 17A and 17B) are used to program resistive change memory cells by biasing bit lines BL1 through BLn to appropriate voltages for a predetermined duration while source line SL is biased to $V_{RESET}$, as described with respect to FIG. 16A. Also, while transistors 304 (FIG. 16A-16D) are not shown in FIG. 22 for clarity, in some embodiments transistors 304 are included for performing restore operations. For example, a restore operation is performed for a group (e.g., a row) of resistive change memory cells in response to an indication by the ROWFAIL signal that at least one resistive change memory cell in the group has degraded beyond a threshold corresponding to $I_{REF-CHAR}$. In some embodiments, prior to performing a characterization operation, the resistive change memory cells being characterized are placed in the reset state. In some embodiments, when performing a characterization operation simultaneously with a read operation, only the resistive change memory cells that are in the reset state are characterized.

Figure 23A:
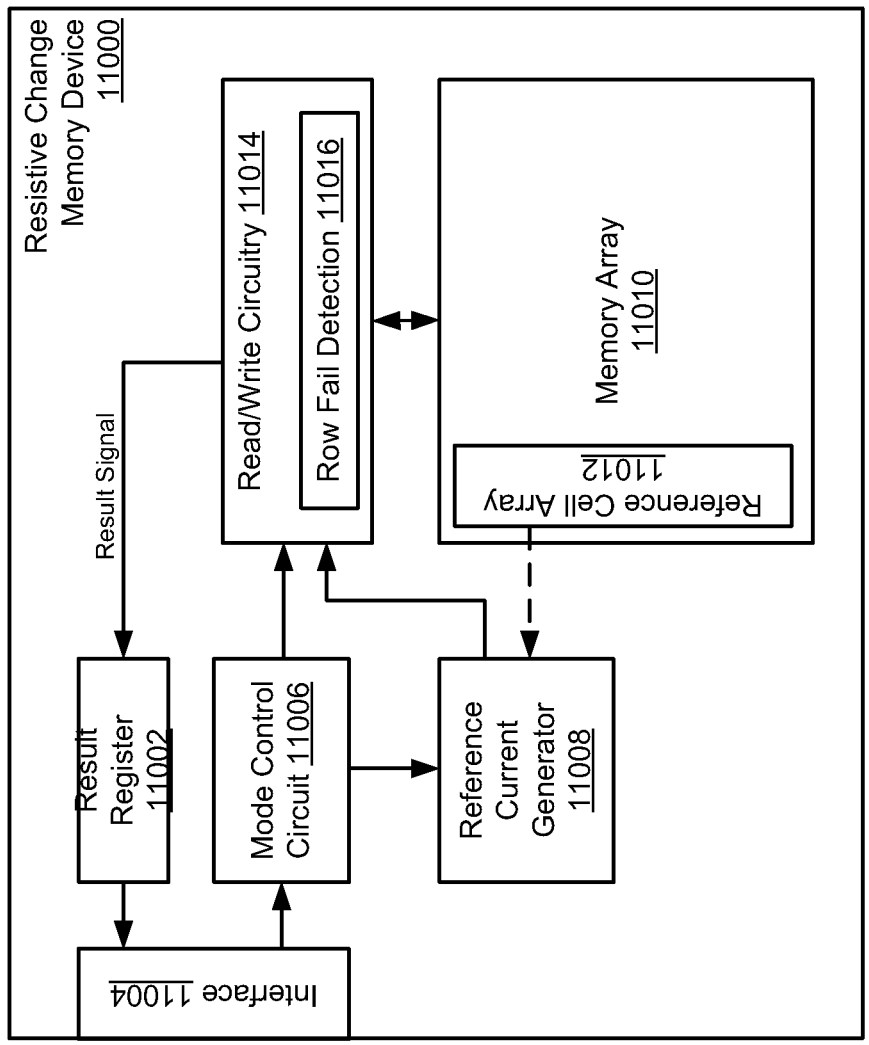
FIG. 23A is a block diagram of a resistive change memory device in accordance with some embodiments.

FIG. 23A is a block diagram of a resistive change memory device 11000 configured to perform both read and characterization operations in accordance with some embodiments. FIG. 23A is not intended to be a complete schematic diagram of memory device 11000 but instead illustrates components of memory device 11000 corresponding to disclosed embodiments. In some embodiments, memory device 11000 also includes all or a portion of the components of memory device 2500 (FIG. 18). Memory device 11000 includes an array 11010 (e.g., the array shown in FIG. 22; array 2502, FIG. 18) of resistive change memory cells (e.g., resistive change memory cells 200, 220, 230, or 240, FIGS. 2A-2D). Coupled to array 11010 is read/write circuitry 11014. In some embodiments, read/write circuitry 11014 corresponds to read/write circuitry 2504 (FIG. 18) and includes a plurality of read/write circuits 2400 (FIGS. 17A and 17B) (e.g., read/write circuits 302, FIG. 16A-16D, or 352, FIG. 16E), and control circuitry 2510 (e.g., control circuitry 310, FIGS. 16A-16C, 320, FIG. 16D, or 354, FIG. 16E). The read/write circuitry 11014 also includes row fail detection circuitry 11016 (e.g., the ROW-FAIL signal line 1902, transistors 1904 and 1909, and inverter 1906, collectively).

In some implementations, array 11010 includes an array 11012 of reference resistive change memory cells (e.g., resistive change memory cells 1200E-1200H, FIG. 22) that is coupled to a reference current generator 11008 (e.g., configurable reference current generator 1922, FIG. 22). The reference current generator 11008 is configurable to provide any of multiple reference currents (e.g., $I_{REF-READ}$ and one or more $I_{REF-CHAR}$ currents, FIG. 21) to the read/write circuitry 11014 for respective read and characterization operations.

The row fail detection circuitry 11016 produces a result signal (e.g., ROW FAIL, FIG. 22) that is stored in a result register 11002, which provides the result signal to an interface 11004 for transmission to an external device (e.g., a memory controller). Interface 11004 is an example of interface 2506 (FIG. 18). Alternatively, the row fail detection circuitry 11016 provides the result signal directly to interface 11004. In some embodiments, the result signal is stored in the result register 11002 as a single-bit value that indicates the result of a characterization operation performed using a single reference current (e.g., $I_{REF}$ 2120, FIG. 20A). In other embodiments, the result signal is stored in the result register 11002 as a multi-bit value that indicates the result of a characterization operation performed using multiple reference currents (e.g., $I_{REF}$ 2120, 2124, and/or 2126, FIG. 20B).

A mode control circuit 11006 is coupled to read/write circuitry 11014 and reference current generator 11008. Mode control circuit 11006 instructs the read/write circuitry 11014 and reference current generator 11008 to enter a first mode (e.g., a normal operating mode) to perform read (and write) operations and to enter a second mode (e.g., a test mode) to perform characterization operations. In some embodiments, the mode control circuit 11006 specifies the mode in response to a command or instruction received from an external device (e.g., a memory controller) via interface 11004. In some embodiments, mode control circuit 11006 includes one or more state machines for carrying out the sequences of internal operations to perform memory operations corresponding to commands received from an external device, such as a memory controller.

In some implementations, the interface 11004 is not present in the resistive change memory device 11000. In these implementations, the result register 11002 provides the result signal directly to an external device and the mode control circuit 11006 receives a command or instruction from an external device directly.

Figure 23B:
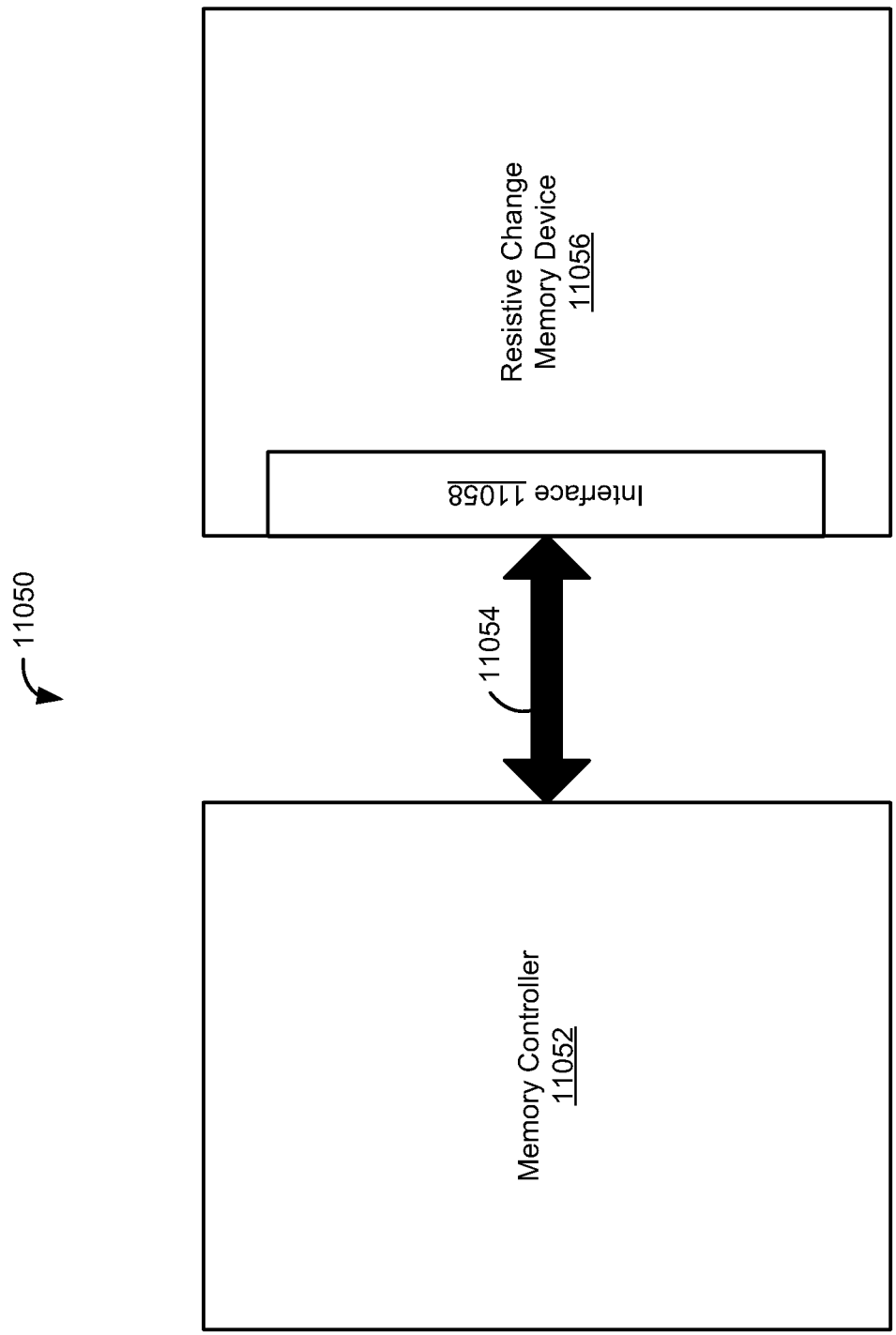
FIG. 23B is a block diagram of a system including a memory controller and a resistive change memory device in accordance with some embodiments.

FIG. 23B is a block diagram of a system 11050 including a memory controller 11052 and a resistive change memory device 11056 in accordance with some embodiments. The device 11056 is an example of resistive change memory device 2500 (FIG. 18) and/or 11000 (FIG. 23A) and includes an interface 11058, which is an example of interface 2506 (FIG. 18) and/or 11004 (FIG. 23A). In some embodiments, the memory controller 11052 and device 11056 are implemented as separate integrated circuits. A plurality of signal lines 11054 (including, for example, one or more busses and one or more individual signal lines) couples the memory controller 11052 to the device 11056. The memory controller 11052 transmits commands/instructions (e.g., commands to perform write, read, and characterization operations) to the device 11056 and receives information (e.g., read data and characterization operation results) in response.

Figure 24A:
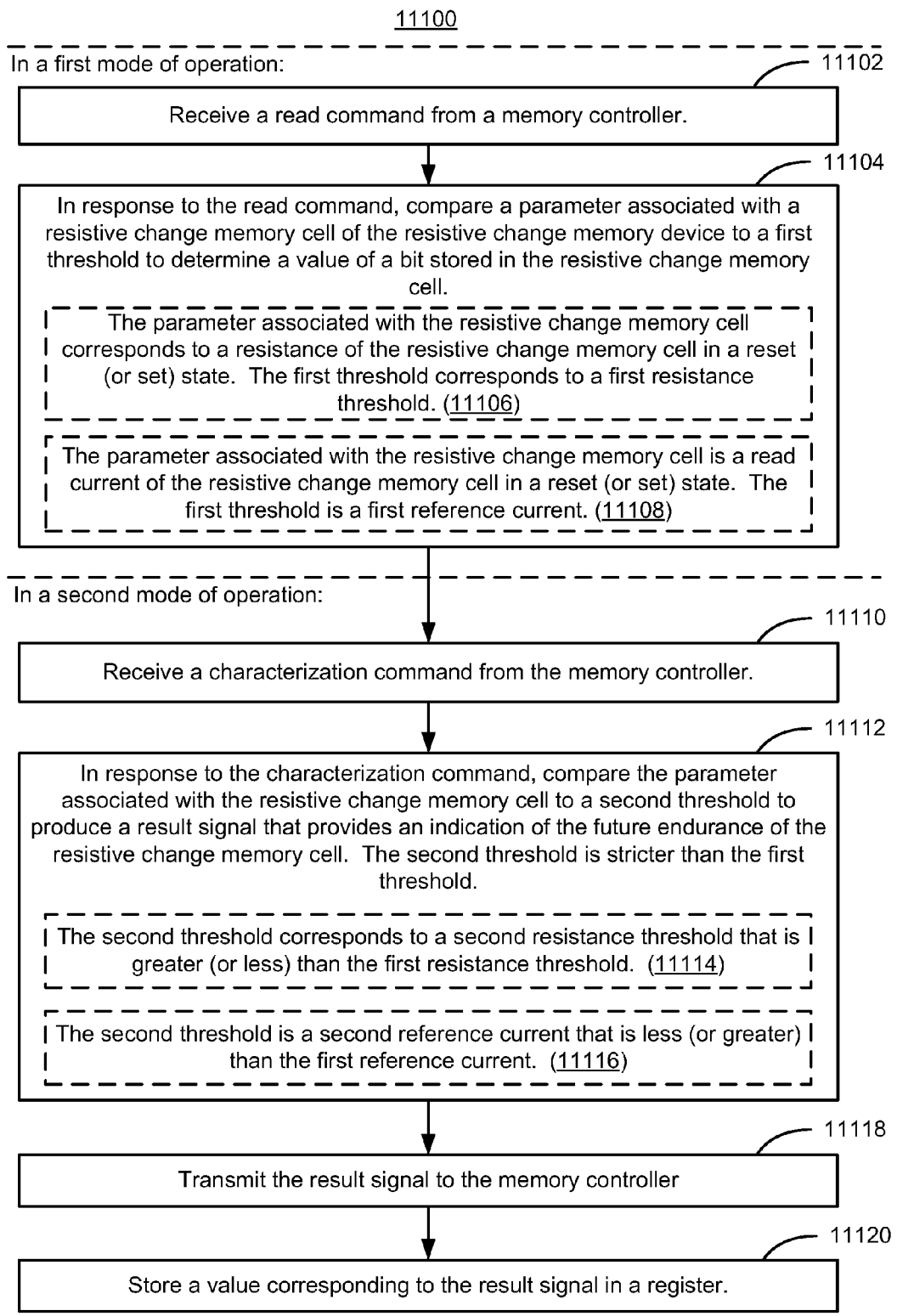
FIG. 24A is a flow diagram illustrating a method of operating a resistive change memory device in different modes in accordance with some embodiments.

Attention is now directed to methods of performing read and characterization commands. FIG. 24A is a flow diagram illustrating a method 11100 of operating a resistive change memory device (e.g., device 11000, FIG. 23A; device 11056, FIG. 23B) in different modes in accordance with some embodiments.

In a first mode of operation (e.g., a normal mode of operation), a read command is received (11102) from a memory controller (e.g., controller 11052, FIG. 23B).

In response to the read command, a parameter (e.g., read current or resistance) associated with a resistive change memory cell (e.g., the resistive change memory cell 200, 220, 230, or 240, FIGS. 2A-2D) of the resistive change memory device is compared (11104) to a first threshold to determine a value of a bit stored in the resistive change memory cell. The parameter is sometimes called a characteristic, of the resistive change memory cell being read. In some implementations, the parameter corresponds (11106) to a resistance of the resistive change memory cell in a reset (or set) state and the first threshold corresponds (11106) to a first resistance threshold. In some implementations, the parameter is (11108) a read current of the resistive change memory cell in a reset (or set) state and the first threshold is (11108) a first reference current (e.g., $I_{REF}$ 2108, FIGS. 20A-20B). For example, as shown in FIG. 21, $I_{CELL}$ for resistive change memory cell 1802 is compared to $I_{REF-READ}$. In another example, as shown in FIG. 22, $I_{BL}$ for resistive change memory cell 1200A or 1200B is compared to $I_{REF-READ}$ (=M×$I_{REF}$), where $I_{REF}$ is generated using reference resistive change memory cell 1200E or 1200F). In some implementations, the reference current generator 1922 is configured to provide the first reference current in the first mode of operation.

In a second mode of operation (e.g., a test mode), a characterization command is received (11110) from the memory controller.

In response to the characterization command, the parameter associated with the resistive change memory cell is compared (11112) to a second threshold to produce a result signal that provides an indication of the future endurance of the resistive change memory cell. In some embodiments, the result signal is a binary signal that indicates whether the future endurance is greater or less than a minimum future endurance. For example, $I_{CELL}$ for resistive change memory cell 1802 is compared to $I_{REF-CHAR}$, as shown in FIG. 21 to produce a result signal that provides an indication of the future endurance of the resistive change memory cell. In another example, $I_{BL}$ for resistive change memory cell 1200A or 1200B is compared to $I_{REF-CHAR}$ (=M×$I_{REF}$), where $I_{REF}$ is generated using reference resistive change memory cell 1200G or 1200H) to produce a result signal that provides an indication of the future endurance of the resistive change memory cell, as shown in FIG. 22.

The second threshold (used for characterization) is stricter than the first threshold (used for read/write operations). Because the second threshold is stricter than the first threshold, the second threshold can be used to detect degradation of a resistive change memory cell from which data still can be read. In some embodiments, the second threshold corresponds (11114) to a second resistance threshold that is greater (or less) than the first resistance threshold. In some embodiments, the second threshold is (11116) a second reference current (e.g., $I_{REF}$ 2120, 2124, or 2126, FIG. 20B) that is less (or greater) than the first reference current (e.g., $I_{REF}$ 2108, FIGS. 20A-20B). For example, in implementations in which the characterization is to detect a decrease in reset resistance, the second resistance threshold is greater than the first resistance threshold, and the second reference current is less than the first reference current. In implementations in which the characterization is to detect an increase in set resistance, the second resistance threshold is less than the first resistance threshold, and the second reference current is greater than the first reference current. In some implementations, the reference current generator 1922 is configured to provide the second reference current in the second mode of operation.

Based on the comparison in operation 11112, the result signal (e.g., a result signal generated by row fail detection circuitry 11016, FIG. 23A) is transmitted (11118) to the memory controller. The result signal provides an indication of the future endurance of the resistive change memory cell.

Alternatively, information based on the result signal is sent to the memory controller. For example, as described with respect to FIG. 22, in some implementations comparison results from multiple resistive change memory cells are combined, and the resulting combined signal(s) (e.g., a ROW FAIL signal) is(are) sent to the memory controller. In some embodiments, a value (e.g., a single-bit value) corresponding to the result signal is stored (11120) in a register (e.g., result register 11002, FIG. 23A).

In some embodiments, multiple thresholds (e.g., reference currents 2120, 2124, and/or 2126, FIG. 20B) distinct from the first threshold (e.g., reference current 2108, FIGS. 20A-20B) are specified and compared to the parameter. These multiple comparisons are performed serially or in parallel. For example, the second reference current (e.g., $I_{REF}$ 2120, FIG. 20B) and a third reference current (e.g., $I_{REF}$ 2124 and/or 2126, FIG. 20B) are both compared to the parameter, either serially or in parallel. The comparisons produce respective result signals (e.g., respective ROW FAIL signals, FIG. 22). In some embodiments, a multi-bit value corresponding to the result signals is stored in the register.

In some embodiments, prior to performing operation 11112, the resistive change memory cell is first read and furthermore the characterization operation is only performed on the resistive memory change cell when the resistive change memory cell is in the reset state. In some implementations, the read operation and the characterization operation are performed serially, where the read operation is performed prior to the characterization operation. For example, the first mode of operation is used during a first memory operation cycle and the second mode of operation is used during a second memory operation cycle. In some implementations, the read operation and the characterization operation are performed in parallel (e.g., during the same memory operation cycle). In these implementations, the characterization operation is performed in the same memory operation cycle as the read operation, but the characterization operation is performed a predetermined time after the read operation is performed, where the predetermined time is selected so that the read operation is completed prior to starting the characterization operation, and where the read operation and the characterization operation are performed in the same memory operation cycle.

Method 11100 thus allows a resistive change memory device to perform both read and characterization operations, depending on the mode of operation. While method 11100 includes a number of operations that appear to occur in a specific order, method 11100 can include more or fewer operations, an order of two or more operations may be changed, and/or two or more operations may be combined into a single operation. For example, the operations 11102 and 11104 may be performed after the operations 11110-11120. In another example, the operation 11120 is performed before the operation 11118 or is omitted.

Figure 24B:
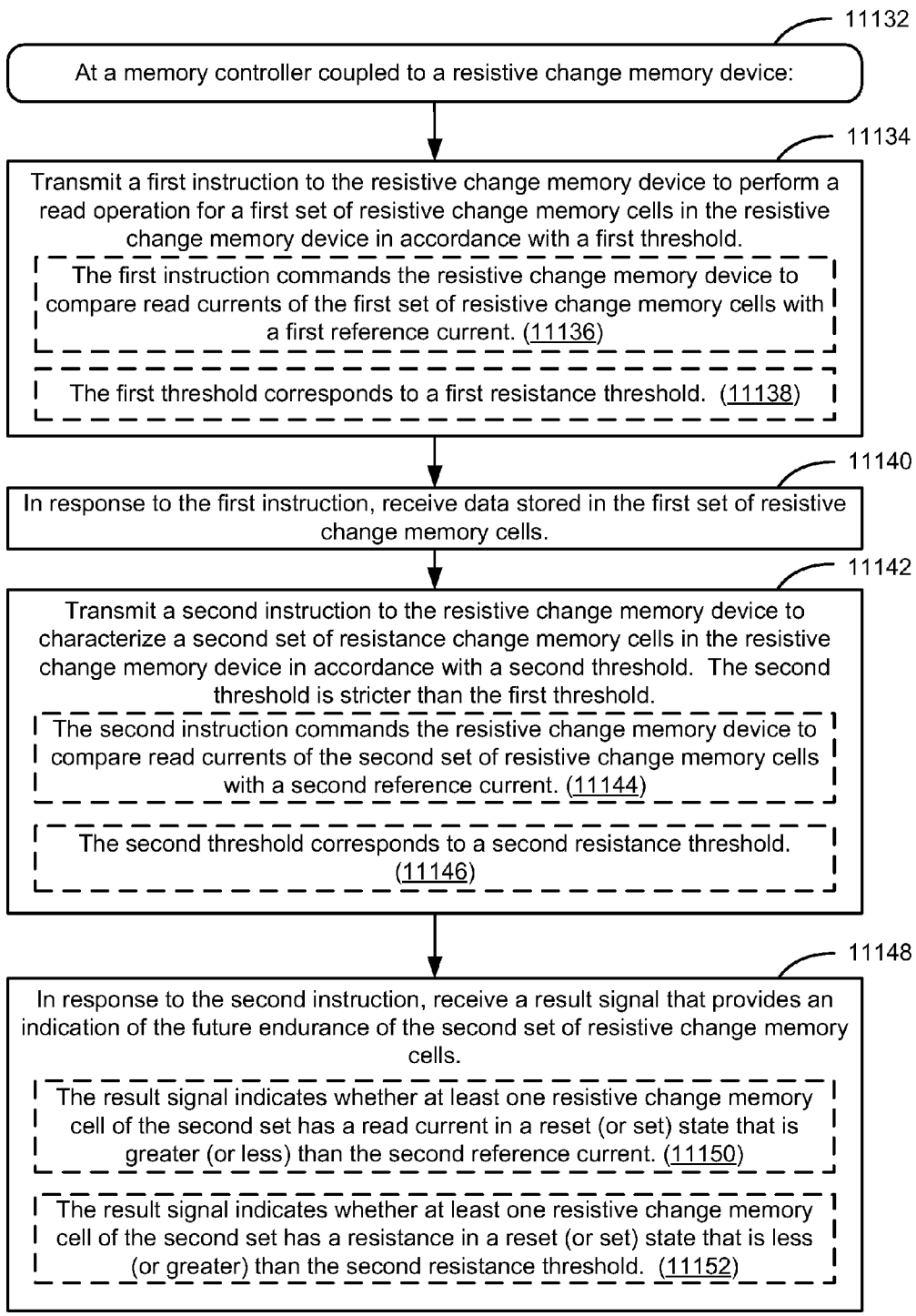
FIG. 24B is a flow diagram illustrating a method of controlling a resistive change memory device in accordance with some embodiments.

FIG. 24B is a flow diagram illustrating a method 11130 of controlling a resistive change memory device in accordance with some embodiments. The method 11130 is performed (11132) at a memory controller (e.g., controller 11052, FIG. 23B) coupled to a resistive change memory device (e.g., device 11000, FIG. 23A; device 11056, FIG. 23B).

In the method 11130, a first instruction is transmitted (11134) to the resistive change memory device to perform a read operation for a first set (e.g., a row) of resistive change memory cells (e.g., resistive change memory cells 200, 220, 230, or 240, FIGS. 2A-2D) in the resistive change memory device in accordance with a first threshold (e.g., the first threshold of operation 11104, FIG. 24A). In some implementations, the first instruction commands (11136) the resistive change memory device to compare read currents of the first set of resistive change memory cells with a first reference current. In some implementations, the reference current generator 1922 is configured to provide the first reference current. In some implementations, the first threshold corresponds (11138) to a first resistance threshold. For example, the first instruction corresponds to the read command in operation 11102 (FIG. 24A) and commands the resistive change memory device to perform operation 11104 (FIG. 24A).

In response to the first instruction, data stored in the first set of resistive change memory cells is received (11140) from the resistive change memory device.

A second instruction is transmitted (11142) to the resistive change memory device to characterize a second set (e.g., a row) of resistive change memory cells in the resistive change memory device in accordance with a second threshold (e.g., the second threshold of operation 11112, FIG. 24A). The second threshold is stricter than the first threshold. In some implementations, the second instruction commands (11144) the resistive change memory device to compare read currents of the second set of resistive change memory cells with a second reference current. In some implementations, the reference current generator 1922 is configured to provide the second reference current. In some implementations, the second threshold corresponds (11146) to a second resistance threshold. For example, the second instructions corresponds to the characterization command in operation 11110 (FIG. 24A) and commands the resistive change memory device to perform operations 11112-11120 (FIG. 24A).

Figure 24C:
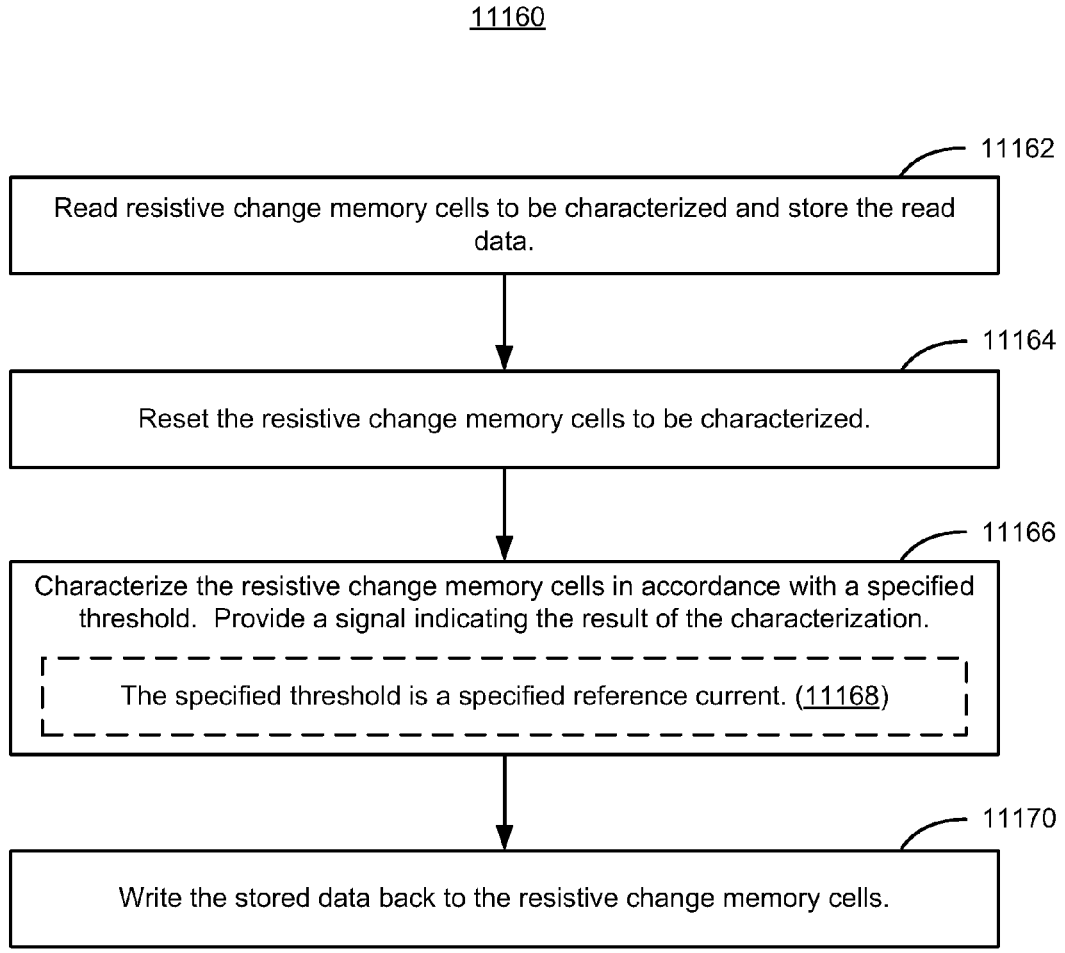
FIG. 24C is a flow diagram illustrating a method of performing a characterization operation in a resistive change memory device in accordance with some embodiments.

In some embodiments, prior to transmitting (11142) the second instruction, the memory controller transmits a third instruction to the resistive change memory device to program the second set of resistive change memory cells to a reset state (or alternatively, to a set state). For example, the third instruction commands the resistive change memory device to perform operation 11164 (FIG. 24C).

In response to the second instruction, a result signal (e.g., a result signal generated by row fail detection circuitry 11016, FIG. 23A) that provides an indication of the future endurance of the second set of resistive change memory cells is received (11148) from the resistive change memory device. In some embodiments, the result signal indicates (11150) whether at least one resistive change memory cell of the second set has a read current in a reset (or set) state that is greater (or less) than the second reference current. In some embodiments, the result signal indicates (11152) whether at least one resistive change memory cell of the second set has a resistance in a reset (or set) state that is less (or greater) than the second resistance threshold.

In some implementations, the controller responds to an indication that the future endurance of the second set of resistive change memory cells has degraded by issuing a command to the resistive change memory device to perform a restore operation for the second set of resistive change memory cells. Alternatively, or in addition, the controller responds to the indication that the future endurance of the second set of resistive change memory cells has degraded by implementing a wear leveling scheme to reduce usage of the second set of resistive change memory cells.

Method 11130 thus allows a memory controller to command a resistive change memory device to perform both read and characterization operations. While method 11130 includes a number of operations that appear to occur in a specific order, method 11130 can include more or fewer operations, an order of two or more operations may be changed, and/or two or more operations may be combined into a single operation. For example, the operations 11134 and 11140 may be performed after the operations 11142 and 11148. Optionally, the second set of resistive change memory cells that are the subject of the characterization operation (in operation 11142) is the same set of resistive change memory cells as the first set of resistive change memory cells that are the subject of the read operation (in operation 11134).

FIG. 24C is a flow diagram illustrating a method 11160 of performing a characterization operation in a resistive change memory device (e.g., device 11000, FIG. 23A; device 11056, FIG. 23B) in accordance with some embodiments. In the method 11160, resistive change memory cells (e.g., a row of resistive change memory cells 200, 220, 230, or 240, FIGS. 2A-2D) that are to be characterized are read (11162) and the read data is stored (e.g., in data latches 2404, FIG. 17, or a buffer 2505, FIG. 18). In some implementations, performing operation 11162 includes performing operation 11104 (FIG. 24A). In some implementations, the resistive change memory cells to be characterized are reset (11164) after they are read (11162).

For example, operation 1604 (FIG. 19A) is performed. (Alternatively, the resistive change memory cells are set.)

The resistive change memory cells are characterized (11166) in accordance with a specified threshold. In some implementations, performing operation 11166 includes performing operation 11112 (FIG. 24A). A result signal (e.g., a result signal generated by row fail detection circuitry 11016, FIG. 23A) indicating the result of the characterization is provided (11166). For example, the result of the characterization is provided to an interface of the memory device (e.g., interface 11004 of memory device 11000, FIG. 23A). In some embodiments, the specified threshold is (11168) a specified reference current (e.g., the second reference current of operation 11116, FIG. 24A, and operation 11144, FIG. 24B).

The stored data is written (11170) back to the resistive change memory cells (e.g., using write drivers 2408, FIG. 17).

Method 11160 allows data to be retained when a characterization operation is performed for resistive change memory cells storing the data, even if the characterization operation involves resetting (or setting) the resistive change memory cells. While method 11160 includes a number of operations that appear to occur in a specific order, method 11160 can include more or fewer operations and/or two or more operations may be combined into a single operation.

Figure 24D:
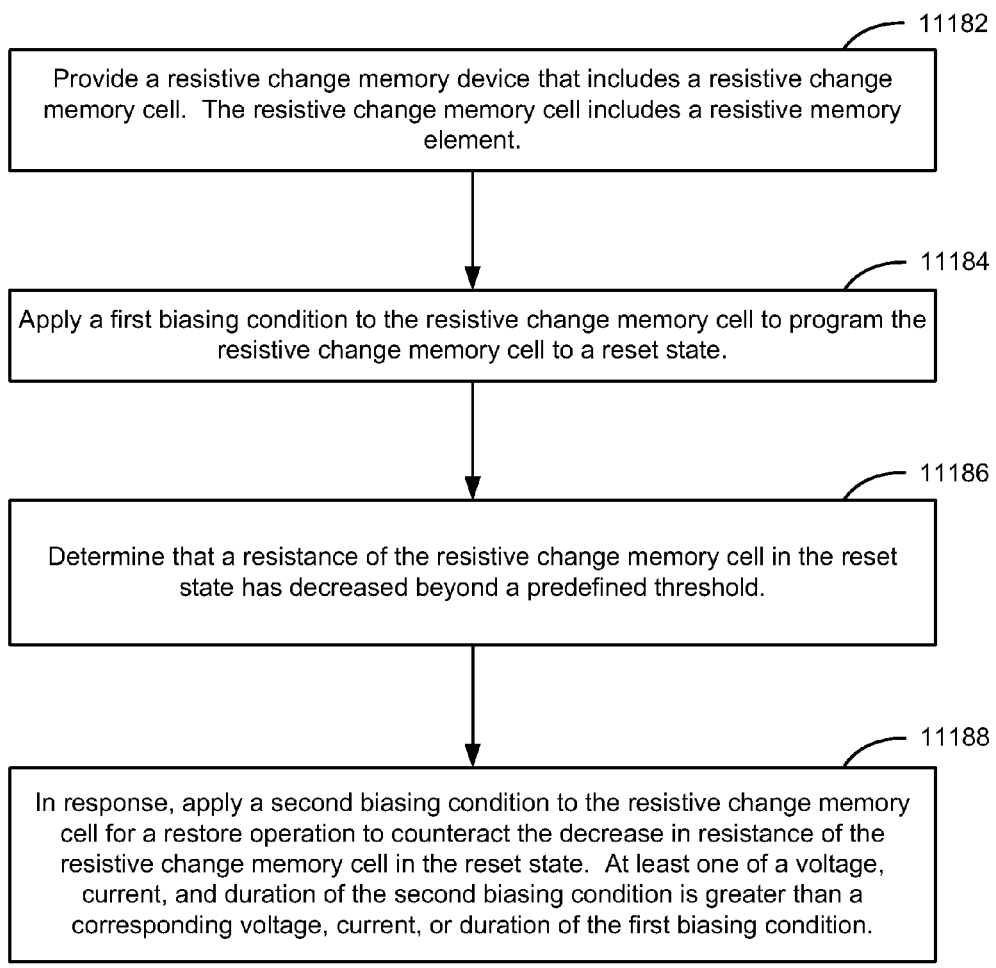
FIG. 24D is a flow diagram illustrating a method of restoring a resistive change memory cell in accordance with some embodiments.

FIG. 24D is a flow diagram illustrating a method 11180 of restoring a resistive change memory cell in accordance with some embodiments. In method 11180, a resistive change memory device (e.g., device 11000, FIG. 23A; device 11056, FIG. 23B) is provided (11182) that includes a resistive change memory cell (e.g., the resistive change memory cell 200, 220, 230, or 240, FIGS. 2A-2D). The resistive change memory cell includes a resistive memory element (e.g., element 210, FIGS. 2A-2D).

A first biasing condition is applied (11184) to the resistive change memory cell to program the resistive change memory cell to a reset state. For example, operation 1604 (FIG. 19A) is performed.

A determination is made (11186) that a resistance of the resistive change memory cell in the reset state has decreased below a predefined threshold. In some embodiments, making the determination of operation 11186 includes performing (or instructing the resistive change memory device to perform) operation 11112 (FIG. 24A). For example, the result signal transmitted by operation 11118 (FIG. 24A) provides the determination.

In response to the determination, a second biasing condition is applied (1188) to the resistive change memory cell for a restore operation to counteract the decrease in resistance of the resistive change memory cell in the reset state. At least one of a voltage, current, and duration of the second biasing condition is greater than a corresponding voltage, current, or duration of the first biasing condition. For example, the operation 1612 (FIG. 19A) is performed.

In some embodiments, instead of or in addition to applying (11188) the second biasing condition for the restore operation, a wear leveling scheme is implemented in response to the determination of operation 11186.

Method 11180 thus allows a resistive change memory cell to be restored in response to a determination (e.g., via a characterization operation) that the resistive change memory cell has degraded. While method 11180 includes a number of operations that appear to occur in a specific order, method 11180 can include more or fewer operations and/or two or more operations may be combined into a single operation.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain the principles of the inventions and their practical applications, to thereby enable others skilled in the art to best utilize the inventions and various embodiments with various modifications as are suited to the particular use contemplated.

We claim:

1. A method comprising:
   selecting a first group of memory cells in a memory;
   while the first group of memory cells are in a predetermined test state, measuring a first metric indicative of a remaining endurance of the first group of memory cells;
   selecting a second group of memory cells in the memory;
   while the second group of memory cells are in the predetermined test state, measuring a second metric indicative of a remaining endurance of the second group of memory cells;
   comparing the first and second metrics; and
   forming a result responsive to the comparing step.

2. The method of claim 1 wherein the test state is a high resistance state.

3. The method of claim 2 wherein the first and second metrics are measured concurrently.

4. The method of claim 2 wherein the first and second metrics are measured sequentially.

5. The method of claim 2 wherein measuring the first and second metrics comprises directly measuring at least one respective current in each of the first and second groups of memory cells.

6. The method of claim 2 wherein measuring at least one respective current comprises measuring bit line currents, word line currents, global bit line currents or source line currents in each of the first and second groups of memory cells.

7. The method of claim 2 wherein the result comprises a binary swap signal, the swap signal having a first state indicating that the first group of memory cells has a relatively better remaining endurance than the second group of memory cells, and a second state indicating that the second group of memory cells has a relatively better remaining endurance than the first group of memory cells.

8. The method of claim 2 and further comprising utilizing the result for identifying one of the groups of memory cells as a target for a write operation.

9. The method of claim 2 and further comprising utilizing the result for selecting one of the groups of memory cells for a subsequent wear leveling action.

10. The method of claim 2 and further comprising utilizing the result for selecting one of the groups of memory cells for re-location of data during a refresh operation.

11. The method of claim 1 and further comprising:
based on the result of the comparison, swapping an order of the first and second groups of memory cells in a listing of the groups; and
repeating the comparing and swapping steps so as to complete a bubble sort of the list of groups into an order based on estimated remaining endurance.

12. The method of claim 1 wherein the resistive memory cells comprise conductive bridge resistive RAM (CB-RRAM) cells.

13. The method of claim 1 wherein the resistive memory cells comprise phase change resistive RAM (PCRAM) cells.

14. The method of claim 1 wherein the resistive memory cells comprise interfacial resistive RAM.

15. The method of claim 1 wherein the resistive memory cells comprise resistive RAM that requires a forming step.

16. The method of claim 1 wherein the comparison circuit is arranged to compare respective currents flowing through the first and second groups of memory cells to generate the comparison result.

17. A memory controller comprising:

a request interface for receiving memory access requests;

a memory interface for interconnecting the memory controller with a memory having at least one array of resistive change memory cells; and an address mapping circuit;

wherein the address mapping circuit implements address mapping responsive at least in part to direct relative measurement of a selected remaining endurance metric among different groups of memory cells in the memory.

18. The memory controller of claim 17 wherein the memory controller is coupled to a current comparator circuit to obtain direct relative measurement of respective currents flowing through first and second groups of cells in the memory.

19. The memory controller of claim 17 including evaluation logic configured to realize the direct relative measurement of remaining endurance among different groups of memory cells in the memory.

20. The memory controller of claim 17 wherein the controller is configured to receive a result of direct relative measurement of respective currents flowing through first and second groups of memory cells resulting from an evaluation operation in the memory.

* * * * *